United States Patent
Nakamura et al.

(10) Patent No.: US 7,561,385 B2
(45) Date of Patent: Jul. 14, 2009

(54) MAGNETO-RESISTIVE ELEMENT IN WHICH A FREE LAYER INCLUDES FERROMAGNETIC LAYERS AND A NON-MAGNETIC LAYER INTERPOSED THEREBETWEEN

(75) Inventors: Shiho Nakamura, Fujisawa (JP); Shigeru Haneda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 29 days.

(21) Appl. No.: 11/087,762

(22) Filed: Mar. 24, 2005

(65) Prior Publication Data
US 2005/0219767 A1 Oct. 6, 2005

(30) Foreign Application Priority Data
Mar. 31, 2004 (JP) ............... 2004-104480

(51) Int. Cl.
*G11B 5/39* (2006.01)
(52) U.S. Cl. ................ 360/324.12
(58) Field of Classification Search .... 360/324.1–324.2
See application file for complete search history.

(56) References Cited

U.S. PATENT DOCUMENTS 6,603,677 B2  8/2003  Redon et al.

2002/0191348 A1 * 12/2002 Hasegawa et al. ........... 360/314
2004/0165425 A1    8/2004 Nakamura et al.

FOREIGN PATENT DOCUMENTS

JP  2001-156357  6/2001
JP  2001-156358  6/2001

OTHER PUBLICATIONS

U.S. Appl. No. 10/954,099, filed Sep. 30, 2004, Shiho Nakamura, et al.
F. J. Albert, et al., "Spin-polarized current switching of a Co thin film nanomagnet", Applied Physics Letters, American Institute of Physics, vol. 77, No. 23, Dec. 4, 2000, pp. 3809-3811.
U.S. Appl. No. 11/117,482, filed Apr. 29, 2005, Nakamura, et al.
U.S. Appl. No. 11/087,762, filed Mar. 24, 2005, Nakamura, et al.

* cited by examiner

*Primary Examiner*—A. J. Heinz
(74) *Attorney, Agent, or Firm*—Oblon, Spivak, McClelland, Maier & Neustadt, P.C.

(57) ABSTRACT

A magneto-resistive element comprising a free layer having two ferromagnetic layers having a nonmagnetic layer interposed therebetween are coupled with each other in an anti-ferromagnetic manner, a difference between an absolute value of a total of magnetizations of at least one ferromagnetic layer in which the magnetization direction is a first direction and an absolute value of a total of magnetizations of at least one ferromagnetic layer in which the magnetization direction is a second direction which is opposite to the first direction is equal to or smaller than $5\times10^{-15}$ emu, and planes parallel to a substrate of the ferromagnetic layers are smaller as the planes are distant from the substrate.

20 Claims, 28 Drawing Sheets

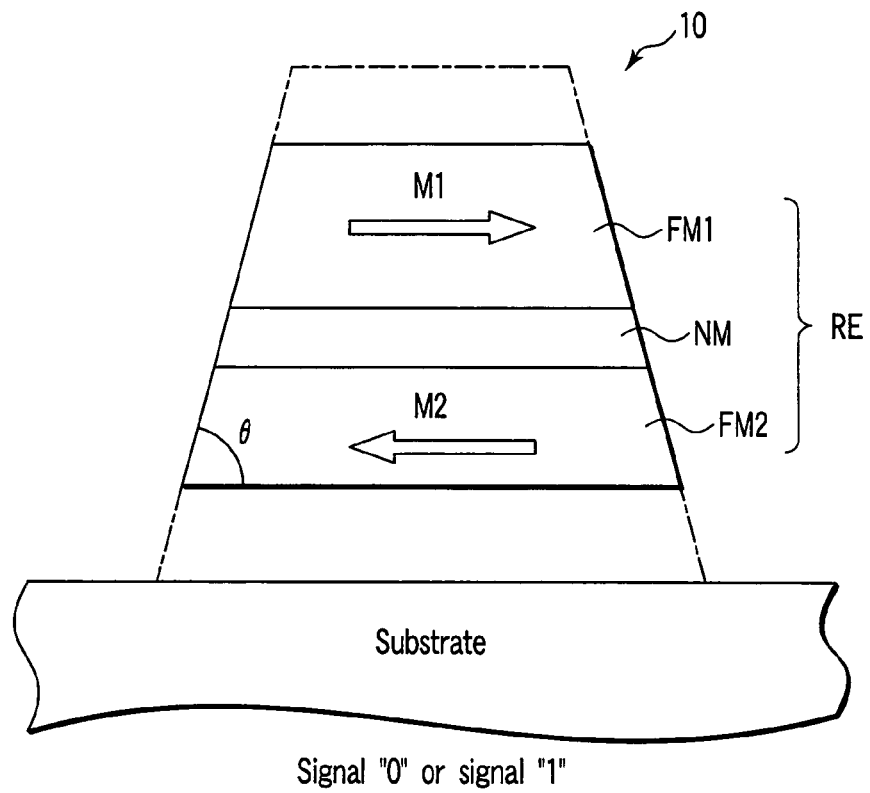
Signal "0" or signal "1"
F I G. 1A
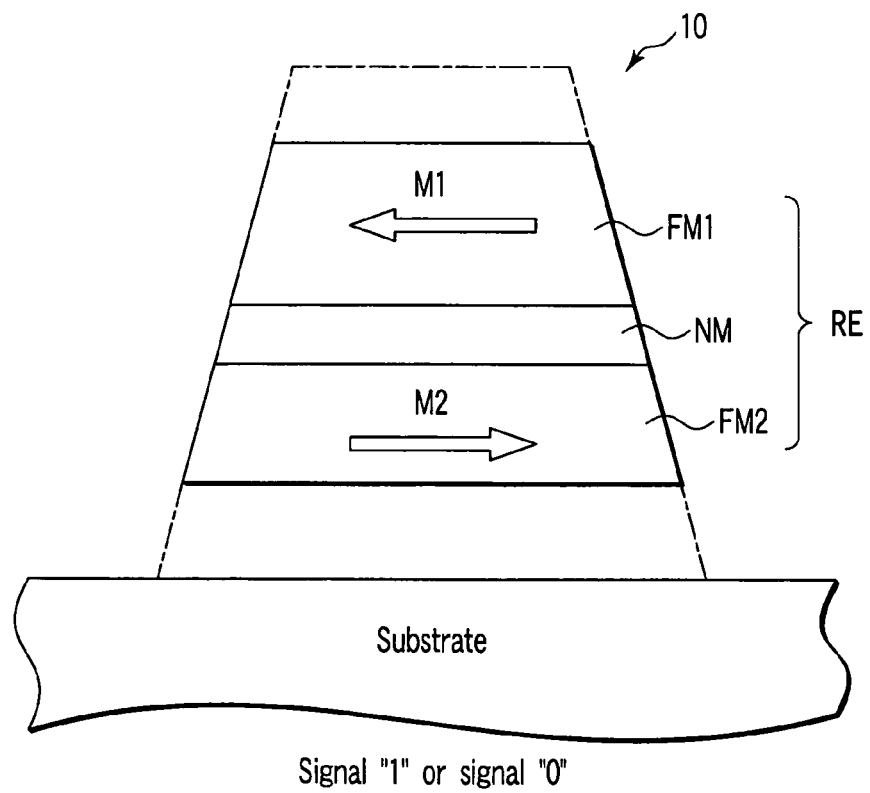
Signal "1" or signal "0"
F I G. 1B

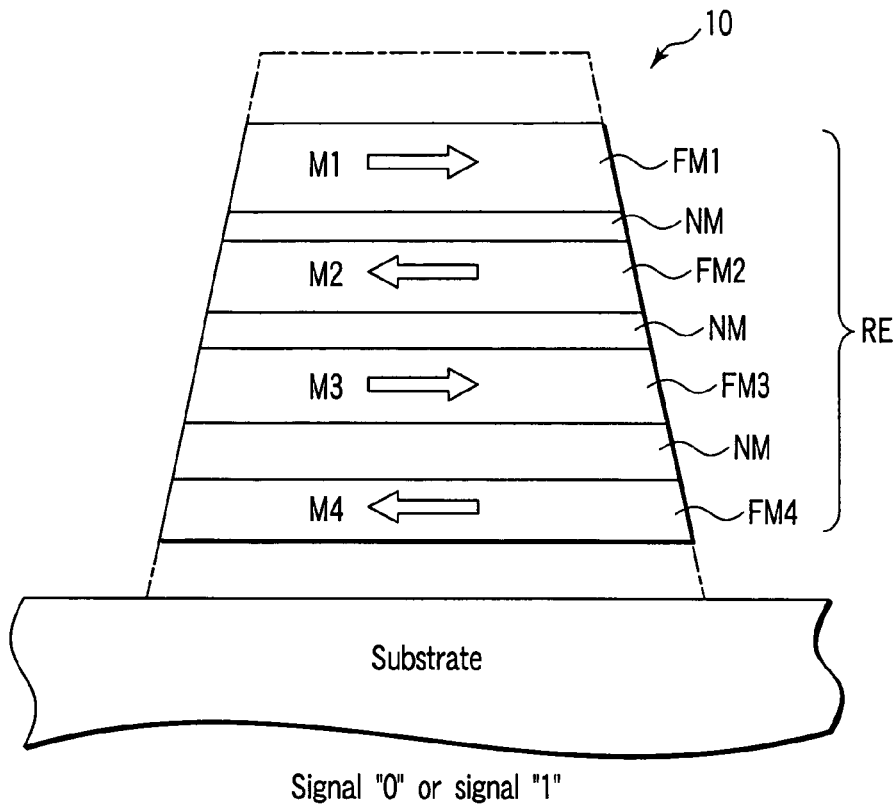
F I G. 2A
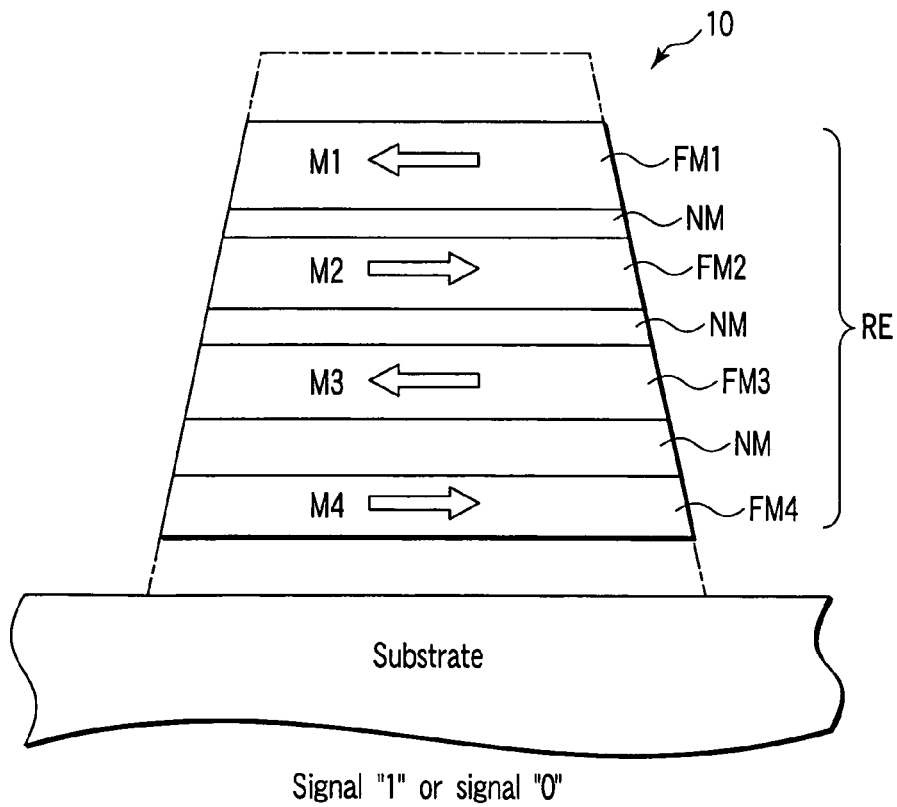
F I G. 2B

Signal "0" or signal "1"

Signal "1" or signal "0"

Electron current "I"

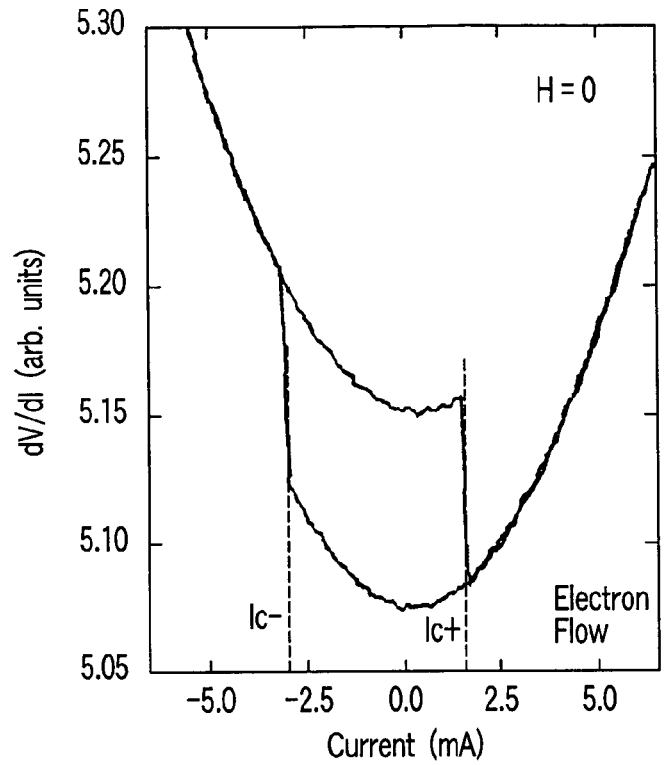
Current is defined as plus when electron flow passes from fixing layer to recording section
F I G. 22
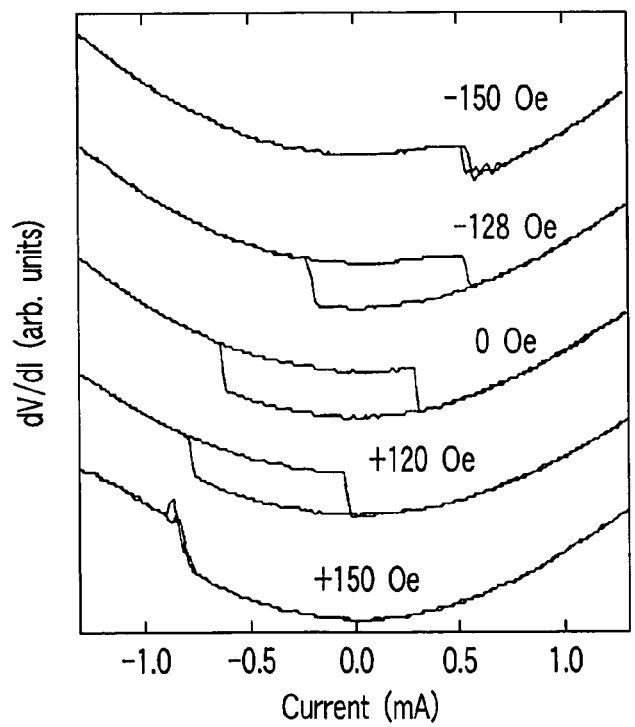
F I G. 23

Critical current required for writing vs magnetic field

During recording
1) Writing of signal 0

During reproduction
1) Reproduction of signal 0

During recording
1) Writing of signal 1

During reproduction
1) Reproduction of signal 1

MAGNETO-RESISTIVE ELEMENT IN WHICH A FREE LAYER INCLUDES FERROMAGNETIC LAYERS AND A NON-MAGNETIC LAYER INTERPOSED THEREBETWEEN

CROSS-REFERENCE TO RELATED APPLICATIONS

This application is based upon and claims the benefit of priority from prior Japanese Patent Application No. 2004-104480, filed Mar. 31, 2004, the entire contents of which are incorporated herein by reference.

BACKGROUND OF THE INVENTION

1. Field of the Invention

The present invention relates to a magneto-resistive element and a magnetic memory, and more particularly, relates to a magneto-resistive element and a magnetic memory which enable writing by supplying spin-polarized electrons.

2. Description of the Related Art

Conventionally, there has been employed a method for applying a magnetic field in order to control a magnetization direction of a magnetic body. For example, in a hard disk drive, a magnetization direction of a medium is reversed by a magnetic field generated from a recording head, thereby carrying out writing. In addition, in a solid magnetic memory, a cell magnetization direction is controlled by applying to a cell a current magnetic field generated due to a current being supplied to a wire provided in the vicinity of a magneto-resistive effect element. The magnetization direct control by the external magnetic field has an old history, and can be said to be a reliable technique.

With recent advancement of nano-technology, on the other hand, remarkable downsizing of magnetic materials has becomes possible, and there has been a need for locally carrying out a magnetization control in a nano-scale. However, a magnetic field is essentially prone to spread in spatial, and thus, localization is difficult. In the case where a specific bit or cell is selected to control its magnetization direction as the bit or cell is downsized, a "cross-talk" problem that the adjacent bit or cell is affected by the magnetic field becomes serious. Further, if a magnetic field generation source is reduced in order to localize the magnetic field, there occurs a problem that a sufficiently generated magnetic field cannot be obtained.

Furthermore, in a recording element in which a magnetic body is provided as a medium, there is a danger that a recording state becomes unstable with respect to a disturbance referred to as a magnetic field. There has been a fatal problem that erasure of recording or incorrect information writing occurs due to a combination of the strength of an external magnetic field and a magneto-resistive element or a medial magnetic characteristic. A problem with a magnetic field having invaded as a disturbance may occur during writing. In this case, incorrect information is recorded.

In recent years, a "current direct drive type magnetization inversion" in which a current is supplied to a magnetic body, thereby causing magnetization inversion has been found out (refer to, for example, F. J. Albert, et al., Appl. Phy. Lett. 77, 3809 (2000)).

In this inversion, a current is spin-polarized by passing it through a magnetic layer, and the spin-polarized current is supplied, thereby inverting magnetization of a target magnetic layer. An angular motion quantity which the spin-polarized electron has is transmitted to and acts on an angular motion quantity of a magnetic body targeted to be magnetically inverted, thereby causing inversion of magnetization of that magnetic body. By using this phenomenon, it is possible to act on a nano-scaled magnetic body more intuitively, and also to carry out recording into a smaller magnetic body.

However, also in the case of utilizing the "current direct drive type magnetization inversion", a change in recording state can occur due to a magnetic field having invaded as a disturbance. Further, in current driven writing, there is a problem that a current required for writing is changed due to the strength of an external magnetic field having invaded as a disturbance. Namely, there is a problem that incorrect information is recorded due to the magnetic field having invaded as a disturbance during writing. Furthermore, there is a problem associated with reliability because an element is destroyed due to a thermal effect caused by the current required for inversion.

BRIEF SUMMARY OF THE INVENTION

According to an aspect of the present invention, there is provided a magneto-resistive element comprising: a free layer in which the magnetization direction is changed by spin-polarized electrons, the free layer having ferromagnetic layers separated by a non-magnetic layer, wherein, from among the ferromagnetic layers, the two adjacent ferromagnetic layers having the nonmagnetic layer interposed therebetween are coupled with each other in an anti-ferromagnetic manner; from among the ferromagnetic layers, a difference between an absolute value of a total of magnetizations of at least one ferromagnetic layer in which the magnetization direction is a first direction and an absolute value of a total of magnetizations of at least one ferromagnetic layer in which the magnetization direction is a second direction which is opposite to the first direction is equal to or smaller than $5 \times 10^{-15}$ emu; and planes parallel to a substrate of the ferromagnetic layers are smaller as the planes are distant from the substrate.

BRIEF DESCRIPTION OF THE SEVERAL VIEWS OF THE DRAWING

FIGS. 1A and 1B are schematic views illustrating a basic sectional structure of a magneto-resistive element according to a first embodiment of the present invention;

FIGS. 2A and 2B are schematic sectional views showing a second specific example of the magneto-resistive element according to the embodiment of the invention;

FIG. 22 is a graph depicting a write characteristic when an external magnetic field relevant to sample 2 is zero;

FIG. 23 is a graph depicting a write characteristic when an external magnetic field is applied for sample 2;

DETAILED DESCRIPTION OF THE INVENTION

Figure 3A:
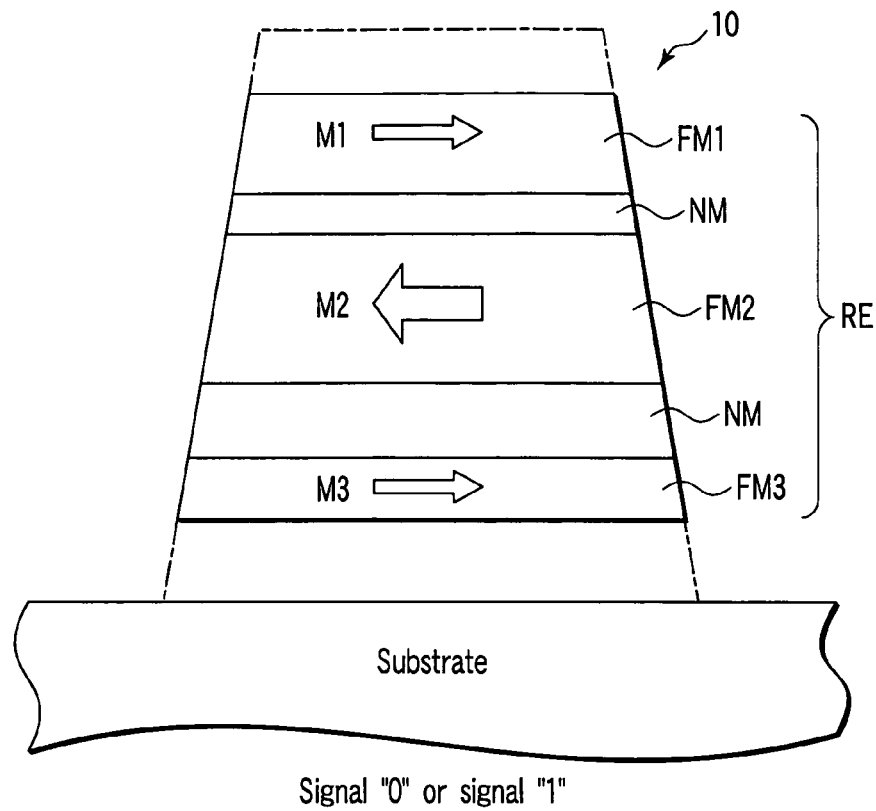
FIGS. 3A and 3B are schematic sectional views showing a third specific example of the magneto-resistive element according to the embodiment of the invention.

A magneto-resistive element of an aspect of the present invention will be described below in detail with reference to the accompanying drawing.

FIGS. 1A and 1B are schematic views illustrating a sectional structure of a magneto-resistive element according to a first specific example of a first embodiment of the invention.

The magneto-resistive element 10 has a recording section RE in which a ferromagnetic layer FM1, a non-magnetic layer NM, and a ferromagnetic layer FM2 are directly or indirectly laminated in order on a substrate. As described later in detail, an electrode or a magnetic fixed layer etc. (not shown) can be added as required in order to record (write) information in the recording section RE.

In this specific example, information is recorded such that the magnetizations M1 and M2 of the ferromagnetic layers FM1 and FM2 are anti-parallel to each other. For example, as shown in FIG. 1A, a case where the magnetization M1 of the ferromagnetic layer FM1 is oriented to the right toward you, and the magnetization M2 of the ferromagnetic layer FM2 is oriented to the left toward you, is defined as "0" (or "1"). As shown in FIG. 1B, a state in which the magnetizations M1 and M2 are inverted, respectively, can be assigned as "1" (or "0"). In this manner, two-valued information can be recorded.

Furthermore, in this specific example, the absolute values of the magnetization M1 of the ferromagnetic layer FM1 and the magnetization M2 of the ferromagnetic layer FM2 are substantially equal to each other. Here, when a magnetization per a unit volume of the ferromagnetic layer FM1 is defined as Ma, and a volume of the layer is defined as Va, the magnetization M1 is expressed by the following formula.

$$M1 = Ma \times Va \tag{1}$$

Similarly, the magnetization M2 of the ferromagnetic layer FM2 is expressed by the following formula:

$$M2 = Mb \times Vb \tag{2}$$

wherein a magnetization per a unit volume is defined as Mb, and a volume of the layer is defined as Vb.

When the magnetizations M1 and M2 of the ferromagnetic layers FM1 and FM2 are anti-parallel to each other in direction, and their absolute values are equal to each other, no net magnetization occurs at the recording section RE. Thus, the magnetization direction of the recording section RE cannot be changed by an external magnetic field, and a magneto-resistive element which is hardly affected by an external magnetic field having invaded as a disturbance can be obtained. As a result, it is possible to solve a problem that information is unnecessarily rewritten due to the external magnetic field or incorrect information is written during writing.

In the case of applying the present invention to a magnetic memory or a storage, in consideration of a magnetic strength serving as an atmospheric disturbance, it is desirable that a difference between an absolute value of the magnetization M1 of the ferromagnetic layer FM1 and an absolute value of the magnetization M2 of the ferromagnetic layer FM2 is equal to or smaller than $5 \times 10^{-15}$ emu. That is, if the difference in absolute values of magnetizations becomes greater than $5 \times 10^{-15}$ emu, there occurs a problem that incorrect information is written under the influence of a disturbance magnetic field during writing. When the difference in absolute values of the magnetizations M1 and M2 is equal to or smaller than $5 \times 10^{-15}$ emu, in the case where a magnetic memory or the like is formed, malfunction or a write error due to a magnetic field having invaded as a disturbance can be prevented.

As illustrated in FIGS. 1A and 1B, the ferromagnetic layers FM1 and FM2 may be coupled with each other in an anti-ferromagnetic manner in order to make the magnetization directions of the ferromagnetic layers FM1 and FM2 anti-parallel to each other. A material for the nonmagnetic layer NM for this purpose will be described later in detail.

Recently, as a hard disk drive (HDD) medium, there has been developed a recording medium composed of laminate films coupled with each other in an anti-ferromagnetic manner, referred to as an "anti-ferromagnetic coupling (AFC) medium". In this medium, a ferromagnetic layer, a nonmagnetic layer, and a ferromagnetic layer are laminated, and these ferromagnetic layers are coupled to in anti-parallel to each other so that a net magnetization occurs while the magnetizations of the two ferromagnetic layers are differentiated from each other. By doing this, writing is enabled in a magnetic field from a magnetic head. However, in other words, the fact that writing is enabled in the magnetic field from the magnetic head denotes the fact that writing is enabled in a strong external disturbance magnetic field. Thus, with this structure, the disturbance in the magnetic field cannot be prevented. When a net magnetization is set to zero, on the other hand, writing by the external magnetic field is disabled.

Further, as a magneto-resistive element for a magnetic random access memory (MRAM), there is proposed a magneto-resistive element composed of laminate layers coupled with each other in an anti-ferromagnetic manner, similarly. In this case also, a ferromagnetic layer, a nonmagnetic layer, and a ferromagnetic layer are laminated, and these ferromagnetic layers are generated after they have been coupled to be anti-parallel to each other. However, as is the case with the ADC medium, a net magnetization is generated by differentiating the magnetizations of the two ferromagnetic layers from each other. By doing this, it becomes possible to carry out writing by a magnetic field produced by a current passing through a wire. However, as is the case with the AFC medium, this denotes that a signal can be changed by an external magnetic field, and the disturbance by the magnetic field cannot be prevented. If a net magnetization is set to zero, on the other hand, writing by the external magnetic field is disabled.

In contrast, the present invention provides a recording section RE having magnetizations which are anti-parallel to each other, as illustrated in FIGS. 1A and 1B, in which a net magnetization is substantially zero. A spin-polarized current is supplied to the recording section, thereby making it possible to record predetermined information. This recording method will be described later in detail.

Furthermore, in this specific example, the film thickness of the ferromagnetic layer FM1 is larger than that of the ferromagnetic layer FM2. The Inventor has found out that the growth on the nonmagnetic layer NM is excellent in film flatness as compared with the growth on lower layers of the recording section RE (many of which are intermediate layers described later) when investigating the growth of the magnetic layers. In addition, there is a need for reducing elements in size and supplying a comparatively large amount of current. Thus, there is a problem that a heat is easily generated when a current is supplied, and an element property is changed by the accumulated heat.

The Inventor has found out that, in the thermal stability, when the sectional shape of the recording section RE is formed in a trapezoidal shape which becomes wider toward the substrate side, as illustrated, a thermal "relief" is large and stable. In addition, as described later, there are many cases in which the periphery of the recording section RE is embedded with an insulator when an element is fabricated. However, in the case where the recording section RE has a trapezoidal sectional shape which becomes wider toward the substrate side, sufficient embedding can be carried out. In contrast, in the case where the recording section has a trapezoidal sectional shape such that a side face is vertical or the substrate side is narrower, which is an opposite case to what is illustrated, there has been a problem that the embedding in an edge section is not sufficient, and a thermal "relief" is worsened.

The magneto-resistive element 10 is also formed in a so-called "sequential mesa-shape". That is, in FIGS. 1A and 1B, the width of cells in the transverse direction is gradually narrowly formed upwardly. As described later by way of example, when a magneto-resistive element is actually formed, layers of the magneto-resistive element are laminated on the substrate (not shown), the laminate layers are processed to be patterned, and its periphery is embedded by an insulating film or the like. At this time, when the magneto-resistive element 10 is thus formed in a sequential mesa-shape, there can be attained an advantageous effect that an insulating film can be easily embedded at its periphery.

When an angle formed between a sectional trapezoidal side face and a face horizontal to the substrate is defined as $\theta$ (when $\theta$ is $90°$, the side face is perpendicular), it is preferable that $\theta$ be within the range of $30°$ or more and $85°$ or less. If $\theta$ is smaller than $30°$, writing becomes difficult in the case where a current is supplied. On the other hand, if $\theta$ is greater than $85°$, a thermal problem is likely to occur. From these requirements, it is preferable that the film thickness of the ferromagnetic layer FM1 is greater than that of the ferromagnetic layer FM2. In addition, the present invention is advantageous in that a magnetic layer which will grow with good flatness can be thickly formed.

Further, in the invention, the remoter from the substrate the ferromagnetic layer, the smaller the area of the ferromagnetic layer. In addition, the film thicknesses of the ferromagnetic layers are set so that their total magnetization will be zero. Accordingly, the area of the cell can be made small because of the ferromagnetic layers can be formed thick, and generation of heat is prevented.

Therefore, an element deviation is reduced because the layers with good flatness can be obtained, and because of a good thermal "relief", a magneto-resistive element having excellent thermal stability and high reliability can be obtained. Further, the embedding by an insulating film is facilitated.

FIGS. 2A and 2B are schematic sectional views illustrating a second specific example of the magneto-resistive element according to the present embodiment.

In this specific example, the recording section RE has four ferromagnetic layers FM1 to FM4 provided in order on a substrate. Nonmagnetic layers NM are inserted among these ferromagnetic layers. The four ferromagnetic layers FM1 to FM4 have magnetizations which are alternately anti-parallel and which are substantially equal to each other in absolute values. Namely, the four ferromagnetic layers FM1 to FM4 are alternately anti-parallel to each other, and their absolute values are substantially equal to each other. By doing this, there can be obtained a magneto-resistive element which becomes zero in net magnetization of the recording section RE and which is hardly affected by a magnetic field having invaded as a disturbance.

A condition that the net magnetization of the recording section RE becomes zero is generally expressed as follows. That is, when magnetization per a unit laminate of an n-th ferromagnetic layer whose magnetization is oriented in a first direction is defined as "ma(n)", and a volume of that ferromagnetic layer is defined as Va(n), a total Ma of magnetizations oriented in the first direction is expressed by the following formula.

$$Ma = \Sigma(ma(n) \times Va(n))$$

On the other hand, when magnetization per a unit laminate of an m-th ferromagnetic layer oriented in a second direction which is anti-parallel to the first direction is defined as mb(m), and a volume of that ferromagnetic layer is defined as Vb(m), a total Mb of magnetizations oriented in the second direction is expressed by the following formula.

$$Mb = \Sigma(mb(m) \times Vb(m))$$

The absolute value of the total "Ma" of the magnetizations may be substantially equal to that of Mb, i.e., may be substantially identical. When the directions of magnetizations Ma and Mb are anti-parallel to each other, and their absolute values are equal to each other, no net magnetization occurs with the recording section RE. Thus, there can be obtained a magneto-resistive element in which the magnetization direction of the recording section RE cannot be changed even by an external magnetic field, the magneto-resistive element being hardly affected by the external magnetic field having invaded as a disturbance. As a result, it is possible to solve a problem that information is unnecessarily rewritten by the external magnetic field or incorrect information is written during writing. It is desirable that a difference between the absolute value of the magnetization Ma and the absolute value of the magnetization Mb is equal to or smaller than $5 \times 10^{-15}$ emu. That is, if the difference in absolute values of the magnetizations exceeds $5 \times 10^{-15}$ emu, a problem that incorrect information is written under the influence of a disturbance magnetic field during writing is likely to occur. When the difference in absolute values of the magnetizations Ma and Mb is equal to or smaller than $5 \times 10^{-15}$ emu, in the case where a magnetic memory is formed, a malfunction or a write error due to the magnetic field having invaded as a disturbance can be prevented.

Furthermore, in this specific example, the film thickness of the ferromagnetic layer FM1 which is the most distant from the substrate is larger than that of the ferromagnetic layer FM4 which is the most proximal to the substrate. The reason is similar to that in the case of the first specific example.

By doing this, element dispersion is reduced because the layers with good flatness can be obtained. In addition, because of a good thermal "relief", a magneto-resistive element having excellent thermal stability and high reliability can be obtained.

Further, in the invention, the remoter from the substrate the ferromagnetic layer, the smaller the area of the ferromagnetic layer. In addition, the film thicknesses of the ferromagnetic layers are set so that their total magnetization will be zero. Accordingly, the area of the cell can be made small because of the ferromagnetic layers can be formed thick, and generation of heat is prevented.

Figure 3B:
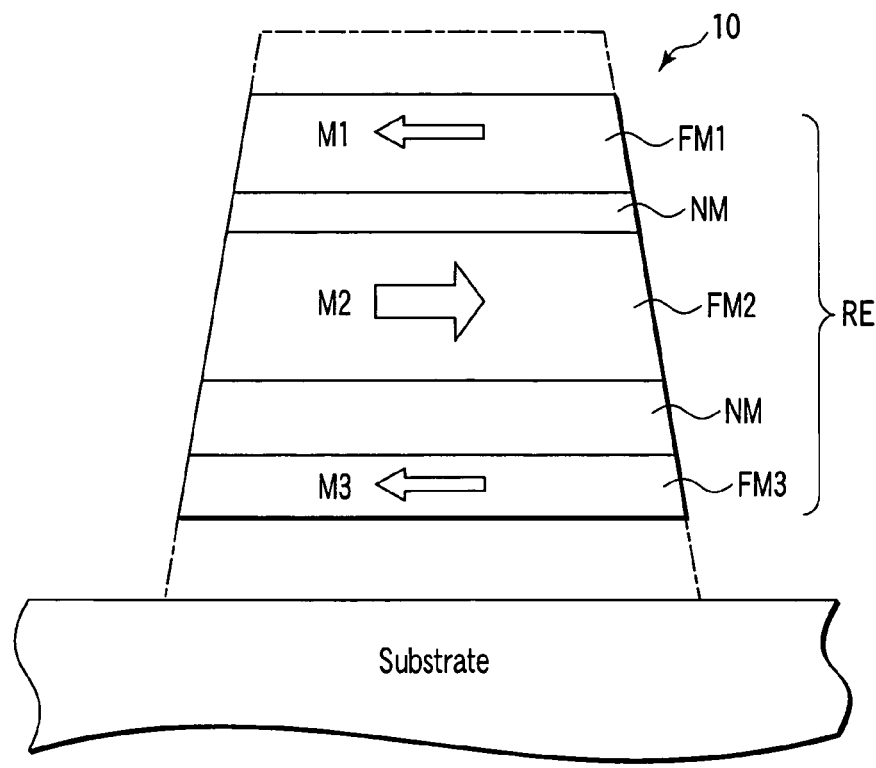

FIGS. 3A and 3B are schematic sectional views showing a fourth specific example of the magneto-resistive element according to the present embodiment. In this specific example, the recording section RE has three ferromagnetic layers FM1 to FM3 provided in order on a substrate. Non-magnetic layers NM are inserted among these ferromagnetic layers. The three ferromagnetic layers FM1 to FM3 have magnetizations M1 to M3 which are alternately anti-parallel to each other. Also, the absolute value of a total of the magnetizations M1 and M3 is substantially equal to that of the magnetization M2. It is desirable that a difference between the absolute value of a total of the magnetizations M1 and M3 and the absolute value of the magnetization M2 is equal to or smaller than $5 \times 10^{-15}$ emu.

In this manner, there can be obtained a magneto-resistive element which becomes zero in net magnetization of the recording section RE and which is hardly affected by a magnetic field having invaded as a disturbance.

Furthermore, in this specific example, the film thickness of the ferromagnetic layer FM1 which is the most distant from the substrate is larger than that of the ferromagnetic layer FM3 which is the most proximal to the substrate. The reason is similar to that in the case of the first specific example.

By doing this, element dispersion is reduced because the layers with good flatness can be obtained. In addition, because of a good thermal "relief", a magneto-resistive element having excellent thermal stability and high reliability can be obtained.

Further, in the invention, the remoter from the substrate the ferromagnetic layer, the smaller the area of the ferromagnetic layer. In addition, the film thicknesses of the ferromagnetic layers are set so that their total magnetization will be zero. Accordingly, the area of the cell can be made small because of the ferromagnetic layers can be formed thick, and generation of heat is prevented.

In the present invention, the number of ferromagnetic layers provided at the recording section RE is not limited to two to four. That is, an arbitrary number of ferromagnetic layers, for example, five or more ferromagnetic layers can be provided as long as magnetizations are alternately inverted, and net magnetization is substantially zero. Further, in the invention, even in the case where one magnetic layer is further composed of a plurality of sub-magnetic layers, these sub-magnetic layers can be handled as one magnetic layer as long as they have the same magnetization direction. That is, a laminate layer such as Co/NiFe/Co can be handled as one magnetic layer. Moreover, a magnetic laminate layer having several atomic layers and a very thin Cu layer or Ru layer at its center, the laminate layer having the same magnetic direction, can also be handled as one magnetic layer.

Now, a mechanism of "writing" in the magneto-resistive element according to the invention will be described here.

Figure 4A:
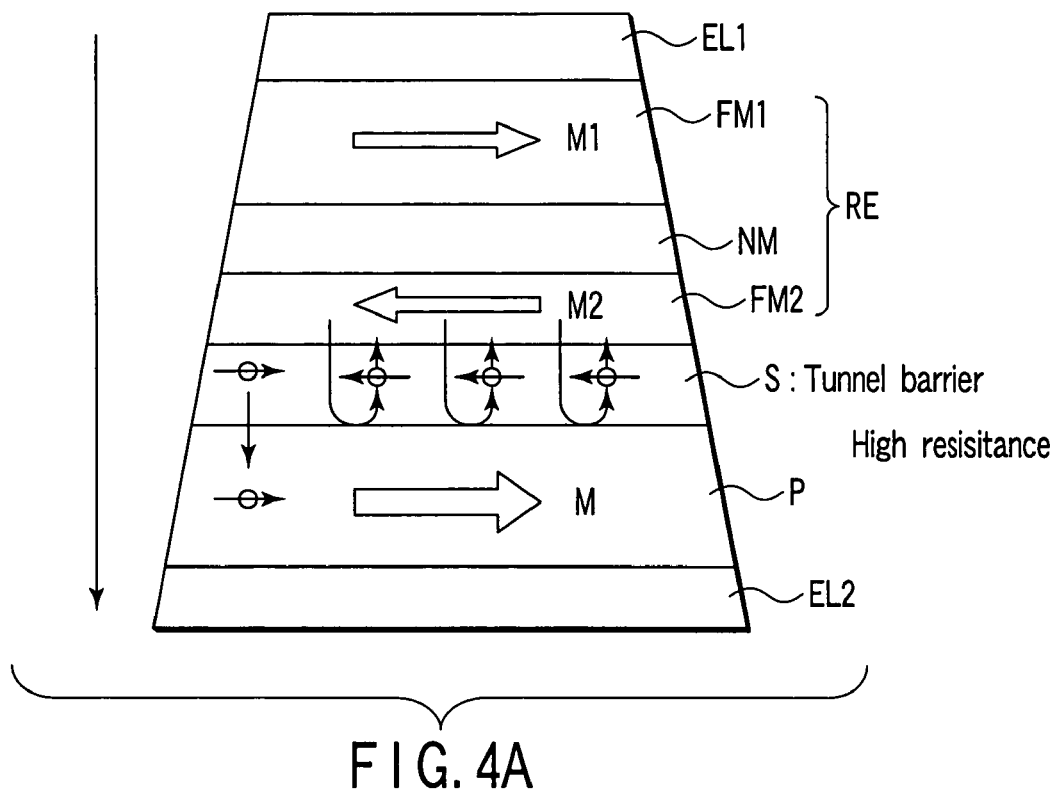
FIGS. 4A and 4B are schematic sectional views illustrating a mechanism of "writing" into a recording section RE shown in FIGS. 1A and 1B.
Figure 4B:
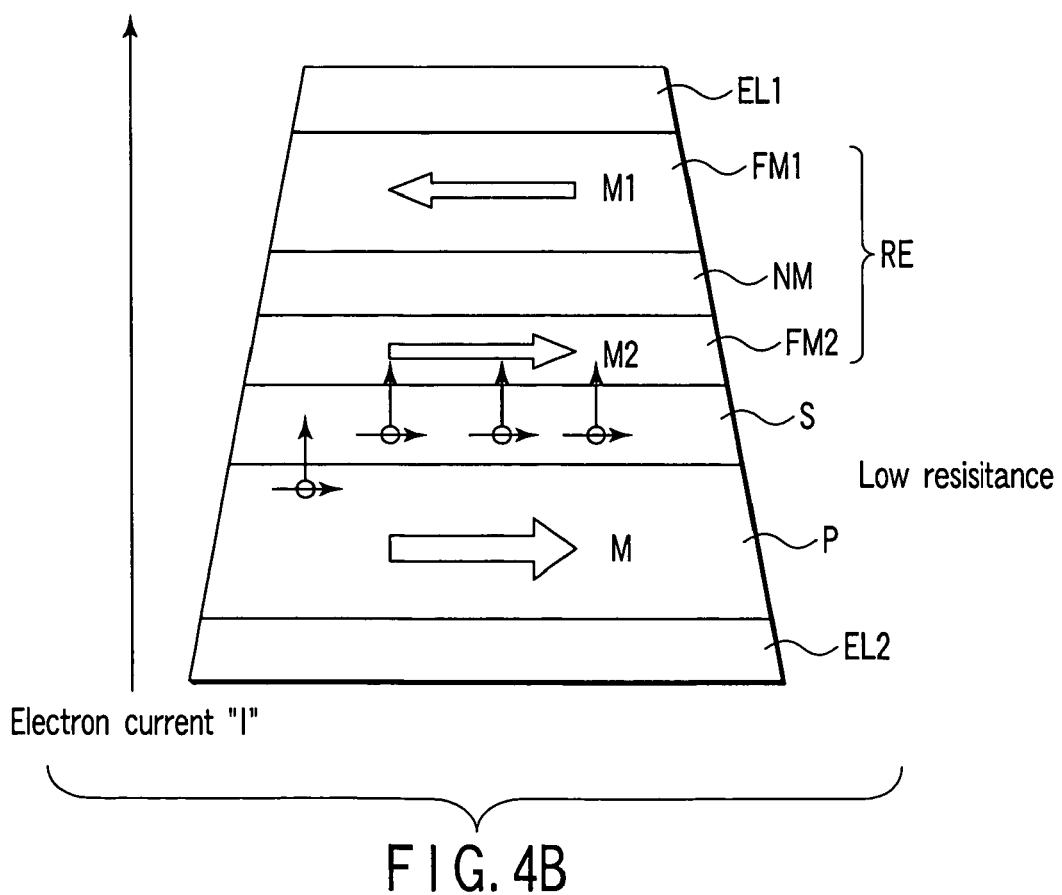

FIGS. 4A and 4B are schematic sectional views illustrating a mechanism of "writing" into the recording section RE shown in FIGS. 1A and 1B. That is, magnetic fixed layers (pined layers) P are laminated via an intermediate layer S, and a write electron current I is supplied so as to cross the critical interface via top and bottom electrodes EL1 and EL2. The magnetic fixed layer P used here denotes a magnetic layer whose magnetization M is fixed in a predetermined direction. FIGS. 4A and 4B show a trapezoidal shape which becomes wider toward the bottom face side and which is narrower toward the upper face side with a substrate being on the bottom. This mechanism of "writing" is identical in principle even if the substrate is on the top. In this construction, a mechanism of writing into the recording section RE will be described below.

First, a description will be given with respect to a case in which a magneto-resistive effect via the intermediate layer S is of "normal type". The magneto-resistive effect of "normal type" used here denotes a case in which an electrical resistance becomes higher during anti-parallelism than during parallelism in magnetization of the magnetic layers at both sides of the intermediate layer S. Namely, in the case of such "normal type", an electrical resistance between the magnetic fixed layer P and the ferromagnetic layer FM2 via the intermediate layer S becomes lower during parallelism than during anti-parallelism in magnetization of the magnetic fixed layer P and the ferromagnetic layer FM2.

As shown in FIG. 4A, a description will be given with respect to a case in which a write electron current I (a general current passes in reverse) has been passed. In this case, electrons configuring the electron current I pass through the recording section RE, and the electron having a spin opposite to the magnetization M (left-oriented in the figure) is reflected in a critical interface entering the magnetic fixed layer P. The left-oriented spin of the reflected electron acts on the ferromagnetic layer FM2. When the scale of the write current I is made greater than a predetermined write critical value Ic, the magnetization M2 of the ferromagnetic layer FM2 is inverted to the direction of this spin (left direction). At this time, the intermediate layer S acts so as not to prevent a motion of the magnetization inversion at the recording section RE. That is, the intermediate layer S serves to interrupt magnetic coupling between the magnetic fixed layer P and the ferromagnetic layer FM2. If the magnetization M2 of the ferromagnetic layer FM2 is inverted to the left direction, the magnetization M1 of the ferromagnetic layer FM1 coupled with the layer FM2 in an anti-ferromagnetic manner is inverted to an opposite direction, i.e., to the right direction.

On the other hand, as shown in FIG. 4B, in the case where the write electron current I is supplied from the electrode EL2 as shown in FIG. 4B, the electron having passed through the magnetic fixed layer P which has the magnetization M has a spin in the direction of the magnetization M (i.e., in the right direction). When this electron passes through the inside of the ferromagnetic layer FM2, an angular motion quantity which this spin has, is transmitted to the ferromagnetic layer FM2, and the transmitted motion quantity acts on the magnetization M2. Consequently, the magnetization M2 is inverted to the right direction.

Then, the magnetization M1 of the ferromagnetic layer FM1 coupled with the ferromagnetic layer FM2 in an anti-ferromagnetic manner is inverted to an opposite direction of the magnetization M2 (i.e., to the left direction).

Although in FIGS. 4A and 4B, the magnetic fixed layer P is located below the recording section RE, the same advantage can be acquired even if the layer P is located above the recording section RE.

The above description has been now completed with respect to the case in which the magneto-resistive effect between the magnetic fixed layer P and the ferromagnetic layer FM2 via the intermediate layer S is of "normal type".

In the case where the above layers are of "reverse type", on the other hand, writing is enabled by a counteraction. The "reverse type" used here denotes a case in which an electrical resistance between the magnetic fixed layer P and the ferromagnetic layer FM2 via the intermediate layer S becomes higher during anti-parallelism than during parallelism in magnetizations M and M2 of the magnetic fixed layer P and the ferromagnetic layer FM2.

In the element of "reverse type", the material of the ferromagnetic layer or the combination of the materials of the ferromagnetic layer and non-magnetic layer differs from that in the element of "normal type". Therefore, the type of electrons that contributes to the magnetization reversal differs between the elements. This means that the elements have opposite electrical characteristics.

Figure 5A:
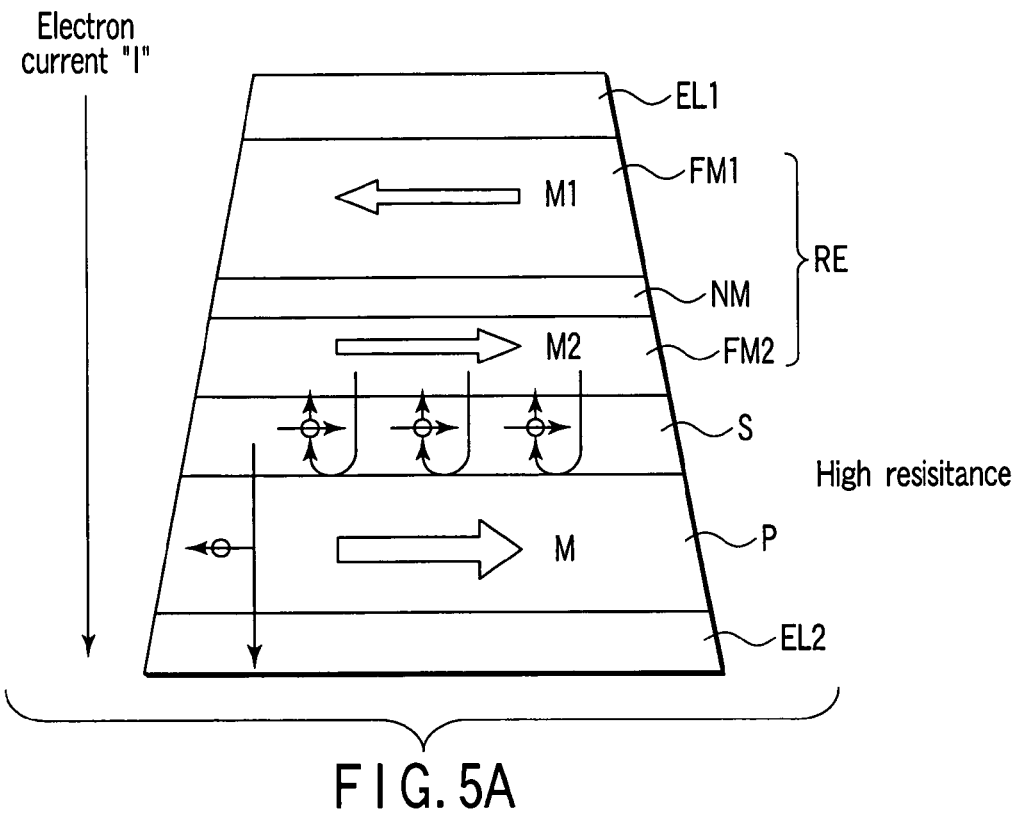
FIGS. 5A and 5B are schematic sectional views showing a mechanism of writing in the case of "reverse type"
Figure 5B:
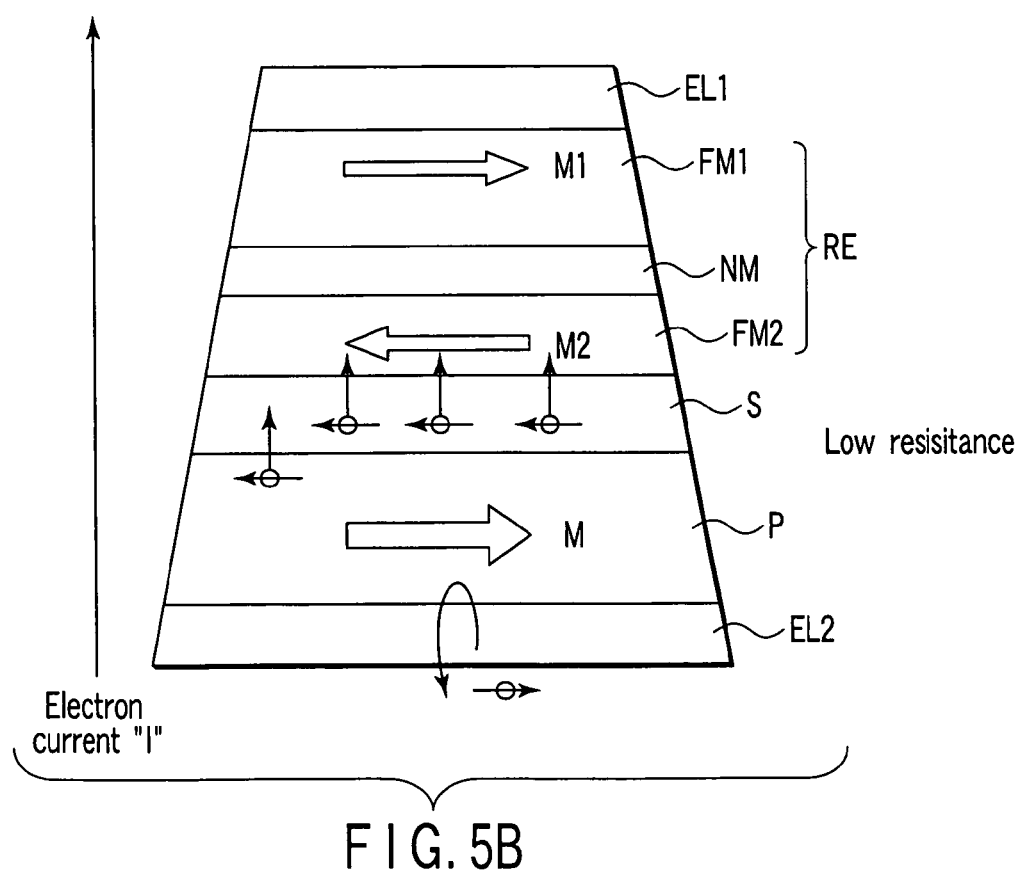

FIGS. 5A and 5B are schematic sectional views showing a mechanism of "writing" in the case of "reverse type". FIGS. 5A and 5B show trapezoidal shapes which becomes wider toward the bottom face side and which is narrower toward the upper face side with a substrate being on the bottom. Even if the substrate is on the top, the mechanism of "writing" is identical in principle.

That is, in the case where the magneto-resistive effect via the intermediate layer S is of "reverse type", the direction of the spin electron acting on the ferromagnetic layer FM2 from the ferromagnetic fixed layer P is opposite to that in the case described previously with respect to FIGS. 4A and 4B. Namely, as shown in FIG. 5A, in the case where the electron current I is supplied from the electrode EL1 to the electrode EL2, the direction of the magnetization M2 of the ferromagnetic layer FM2 is identical to the direction of the magnetization M of the magnetic fixed layer P.

On the other hand, as shown in FIG. 5B, in the case where the electron current is supplied from the electrode EL2 to the electrode EL1, the direction of the magnetization M2 of the ferromagnetic layer FM2 is opposite to the direction of the magnetization M of the magnetic fixed layer P.

As has been described above, in both of the cases where the magneto-resistive effect via the intermediate layer S is of "normal type" and of "reverse type", the directions of the magnetizations M1 and M2 of the recording section RE can be inverted in a predetermined direction in accordance with the flow direction of the write electron current I.

The write mechanism described above can be applied similarly for the recording section RE described previously with respect to FIGS. 2A, 2B, 3A and 3B.

Furthermore, as shown in FIGS. 6A, 6B, 7A and 7B in the case where a nonmagnetic metal layer AC is laminated at the side of the magnetic fixed layer P1 opposite to the recording section; a magnetic fixed layer P2 is further laminated at the side of the nonmagnetic metal layer AC opposite to the recording section; and the magnetic fixed layer P1 and the magnetic fixed layer P2 are coupled with each other via the nonmagnetic metal layer AC in an anti-ferromagnetic manner, the magnetizations M1 and M2 can be inverted in a predetermined direction in accordance with the flow direction of the write electron current I. FIGS. 6A, 6B, 7A and 7B each show a mechanism of writing in the case of "normal type" described previously.

Furthermore, the magnetic fixed layer P1 and the magnetic fixed layer P2 which are adjacent to each other via the anti-ferromagnetic coupling nonmagnetic metal layer AC are substantially equal to each other in magnetization scale. In addition, the thickness of a layer which is the most distant from the substrate is made larger than that of a layer which is the most proximal to the substrate from among the magnetic fixed layer P1 and the magnetic fixed layer P2. In this manner, the stability relevant to an external magnetic field can be also obtained with respect to the magnetic fixed layers, so that a characteristic deviation of each element can be reduced and thermal stability can be obtained. It is desirable that a difference in absolute values of the respective magnetizations PM1 and PM2 of the magnetic fixed layer P1 and the magnetic fixed layer P2 is equal to or smaller than $5 \times 10^{-15}$ emu. If the difference in absolute values of the magnetizations exceeds $5 \times 10^{-15}$ emu, there is a high possibility that incorrect information is written during writing under the influence of a disturbance magnetic field.

Also, the magnetic fixed layers are provided on the top and bottom of the recording section RE, writing efficiency can be improved.

Figure 8A:
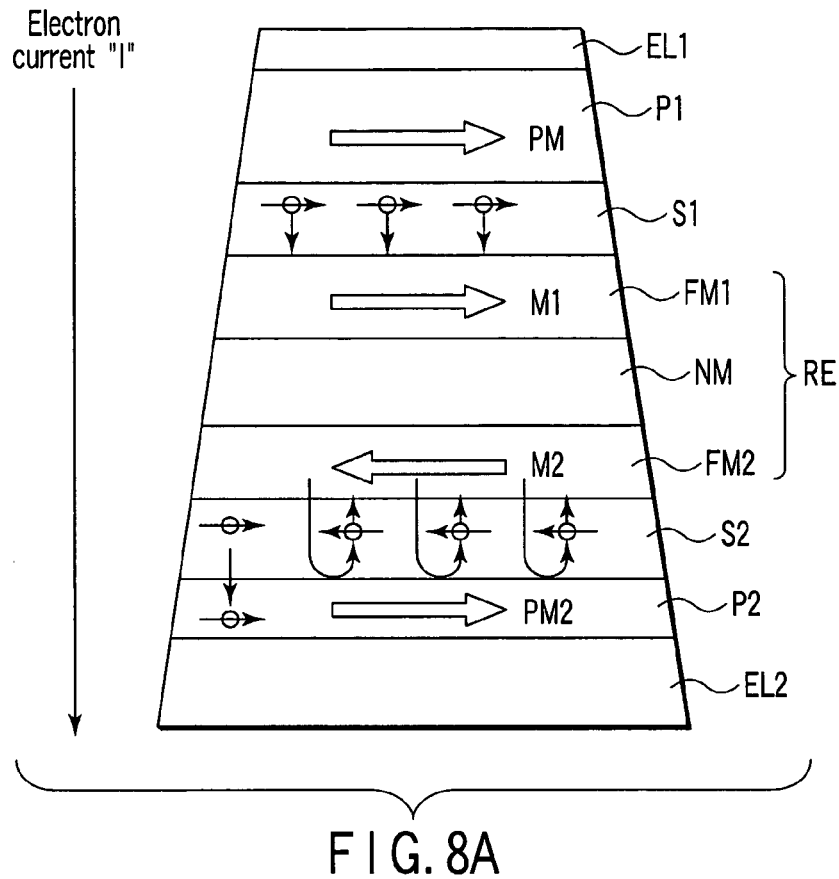
FIGS. 8A and 8B are schematic sectional views illustrating a magneto-resistive element of "normal type" when magnetic fixed layers are provided on the top and bottom of the recording section RE.
Figure 8B:
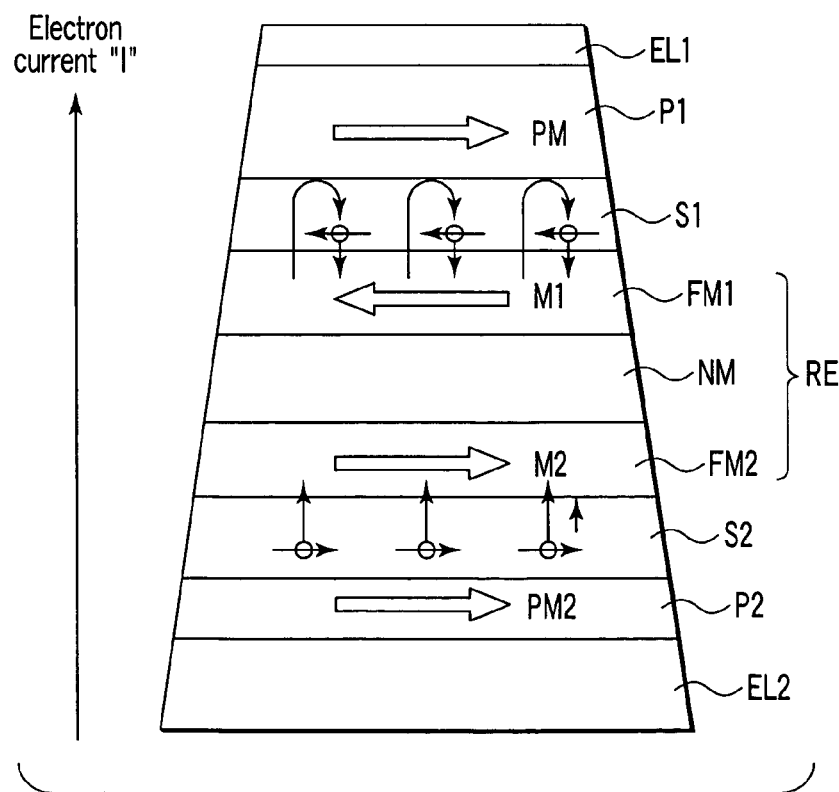

FIGS. 8A and 8B are schematic sectional views illustrating a magneto-resistive element of "normal type" wherein the magnetic fixed layers are provided on the top and bottom of a recording section RE. That is, on the top and bottom of the recording section RE, magnetic fixed layers P1 and P2 are laminated via intermediate layers S1 and S2, respectively. The magnetic fixed layers P1 and P2 are provided as magnetic layers whose magnetizations M1 and M2 are fixed in a predetermined direction. In this specific example, the magnetizations PM1 and PM2 of the top and bottom magnetic fixed layers P1 and P2 are identical to each other in direction.

The intermediate layers S1 and S2 also serve not to interfere magnetization inversion at the recording section RE, and serve to interrupt magnetic coupling between the magnetic fixed layer P1, P2 and the ferromagnetic layer PM1, PM2.

As shown in FIG. 8A, when the electron current I is supplied from the electrode EL1 to the electrode EL2, the electron having passed through the magnetic fixed layer P1 which has the magnetization PM1 has a spin in a direction of the magnetization PM1 (i.e., in the right direction). When this electron passes through the inside of the ferromagnetic layer FM1, an angular motion quantity which this spin has, is transmitted to the ferromagnetic layer FM1, and the transmitted motion quantity acts on the magnetization M1. Consequently, the magnetization M1 is inverted to the right direction. In addition, the electron having a spin opposite to the magnetization PM2 in direction (left direction in the figure) is reflected on a critical interface entering the magnetic fixed layer P2 from the intermediate layer S2. The left-oriented spin which the reflected electron has, acts on the ferromagnetic layer FM2 and inverts the magneti-zation M2. Since the ferromagnetic layer FM1 and the ferromagnetic layer FM2 are coupled with each other in an anti-ferromagnetic manner, a spin transfer torque works on the top and bottom of the free layer RE, and the inversion efficiency of the free layer RE is improved.

On the other hand, as shown in FIG. 8B, when the electron current I is supplied from the electrode EL2 to the electrode EL1, the electron having passed through the magnetic fixed layer P2 which has the magnetization PM2 has a spin in a direction of the magnetization PM2 (i.e., in the right direction). This electron acts on the ferromagnetic layer FM2, and the magnetization PM2 is inverted to the right direction. In addition, the electrode having a spin opposite to the magnetization PM1 in direction (left direction in the figure) is reflected on a critical interface entering the magnetic fixed layer P1 from the intermediate layer S1. The left direction spin which the reflected spin has, acts on the ferromagnetic layer FM1 and inverts the magnetization M1.

As has been described above, when the magnetic fixed layers P1 and P2 are provided, respectively, on the top and bottom of the recording section RE, a spin transfer torque relevant to the ferromagnetic layers FM1 and FM2 can be increased in multiple, and thus, write efficiency can be improved.

In addition, in this specific example, the magnetizations of the magnetic fixed layers P1 and P2 provided on the top and bottom of the recording section RE are identical to each other, and thus, an advantageous effect of facilitating manufacturing can be attained. That is, only one process for so-called "annealing in a magnetic field", for fixing the magnetizations of the magnetic fixed layers P1 and P2, can suffice.

In the case of "reverse type", the magnetizations M1 and M2 of the ferromagnetic layers FM1 and FM2 each are inverted in a direction opposite to those shown in FIGS. 8A and 8B.

Figure 9A:
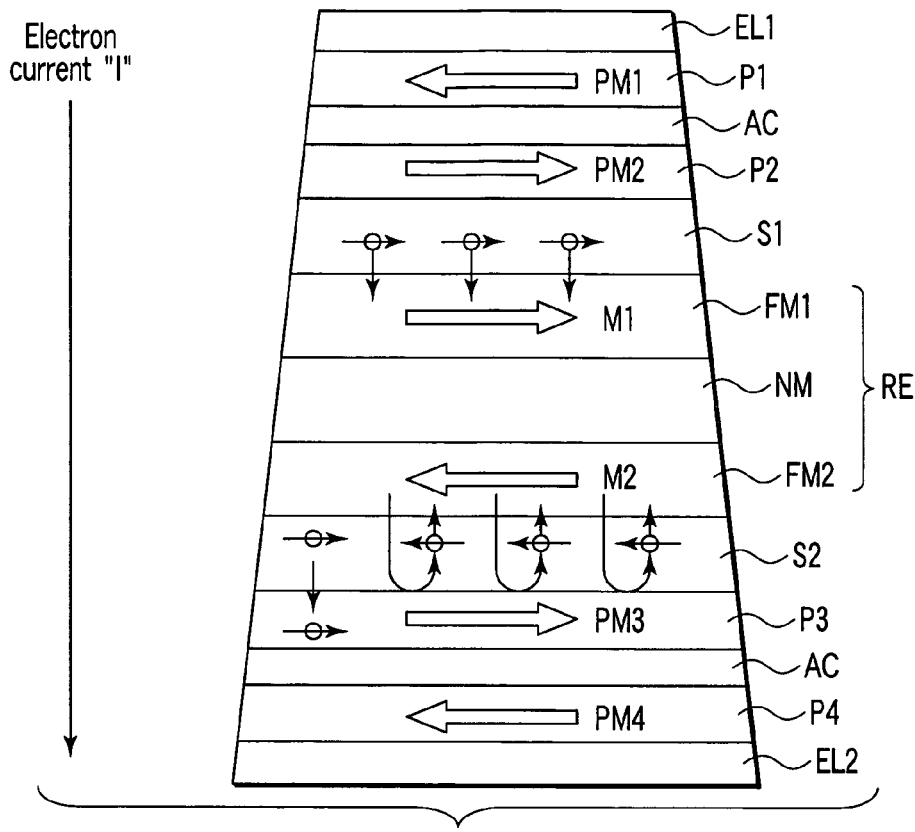
FIGS. 9A and 9B are schematic sectional views illustrating a magneto-resistive element of "normal type" using a laminate structure in which magnetic fixed layers are coupled with each other in an anti-ferromagnetic manner.
Figure 9B:
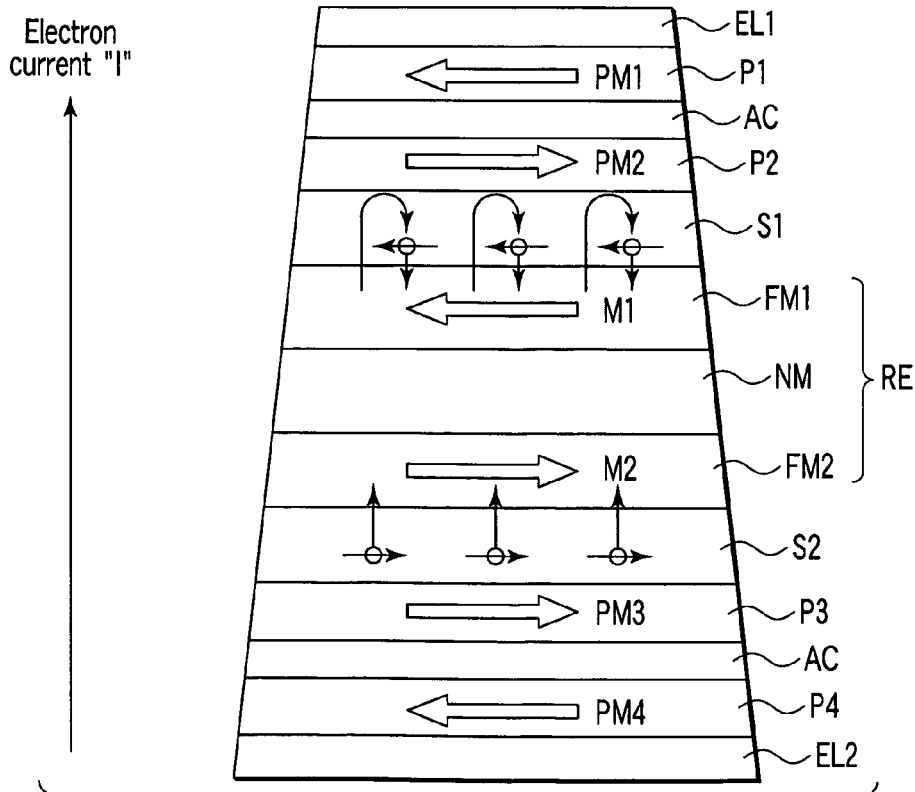

FIGS. 9A and 9B are schematic sectional views illustrating a magneto-resistive element of "normal type" using a laminate structure in which magnetic fixed layers are coupled with each other in an anti-ferromagnetic manner.

That is, in the magneto-resistive element shown in FIGS. 9A and 9B, a laminate body composed of a magnetic fixed layer P1, a nonmagnetic metal intermediate layer (anti-ferromagnetic coupling layer) AC for an anti-ferromagnetic coupling, and a magnetic fixed layer P2 is provided on a recording section RE via an intermediate layer S1. Similarly, under the recording section RE, a laminate body composed of a magnetic fixed layer P3, an anti-ferromagnetic coupling layer AC, and a magnetic fixed layer P4 is provided via an intermediate layer S2.

The magnetic fixed layers P1 and P2 and the magnetic fixed layers P3 and P4 are coupled with each other in an anti-ferromagnetic manner via the anti-ferromagnetic coupling layer AC. When the write current I is supplied to the magneto-resistive element, writing is executed in accordance with the magnetizations of the magnetic fixed layers P2 and P3 which are proximal to the recording section RE.

That is, when the electron current I is supplied as shown in FIG. 9A, a spin electron corresponding to the magnetization PM2 of the magnetic fixed layer P2 acts on the ferromagnetic layer FM1, and inverts the magnetization M1 in the same direction as the magnetization PM1. In addition, a spin electron in a direction opposite to the magnetization PM3 of the magnetic fixed layer PM3 acts on the ferromagnetic layer PM2, and inverts the magnetization M2 in a direction opposite to the magnetization PM3.

On the other hand, when the electron current I is supplied as shown in FIG. 9B, a spin electron corresponding to the magnetization PM3 of the magnetic fixed layer P3 acts on the ferromagnetic layer FM2, and inverts the magnetization M2 in the same direction as the magnetization PM3. In addition, a spin electron in a direction opposite to the magnetization PM3 of the magnetic fixed layer PM3, and inverts the magnetization M1 in a direction opposite to the magnetization PM2.

In this manner, the magnetization of the recording section RE can be rewritten in accordance with the direction of the electron current I. In the case of "reverse type", writing is executed in a direction opposite to that shown in FIGS. 9A and 9B.

Furthermore, the adjacent magnetic fixed layers P1 and P2 via the ferromagnetic coupling layer AC is equal to the adjacent magnetic fixed layers P3 and P4 via the anti-ferromagnetic coupling layer AC in magnetization scale. From among the magnetic fixed layer P1 and the magnetic layer P2, the thickness of a layer which is the most distant from a substrate is made larger than that of a layer which is the most proximal to the substrate. Therefore, the stability relevant to an external magnetic field can be also obtained with respect to a magnetic fixed layer, so that a characteristic deviation for each element can be reduced, and thermal stability can be obtained.

It is desirable that a difference in absolute values of the respective magnetizations PM1 and PM2 of the magnetic fixed layers P1 and P2 and a difference in absolute values of the respective magnetizations PM3 and PM4 of the magnetic fixed layers P3 and P4 are equal to or smaller than $5 \times 10^{-15}$ emu. That is, if the difference in absolute values of the magnetizations exceeds $5 \times 10^{-15}$ emu, there is a high possibility that incorrect information is written during writing under the influence of a disturbance magnetic field.

As described previously with respect to FIGS. 5A to 9A and FIGS. 5B to 9B, in the case where signal writing is directly carried out by the write current I, there has been a problem that a critical current Ic required for writing has strong magnetic field dependency. This implies that a write characteristic fluctuates due to an external magnetic field which externally invades as a disturbance, and becomes an obstacle against practical use. In addition, as the degree of integrity of recording and reproducing elements is increased, a write characteristic fluctuates due to the influence of a current magnetic field generated by a current passing through a wire.

In contrast, according to the invention, a multilayer film whose net magnetization is zero is used as the recording section RE, thereby making it possible to avoid this problem and reduce the influence of a disturbance (magnetic field) during writing to the minimum.

Now, a "readout" method in the magneto-resistive element according to the present embodiment will be described here. In the magneto-resistive element according to this embodiment, the magnetization direction of the ferromagnetic layer FM1 or FM2 of the recording section RE can be detected by utilizing a "magneto-resistive effect".

Figure 10A:
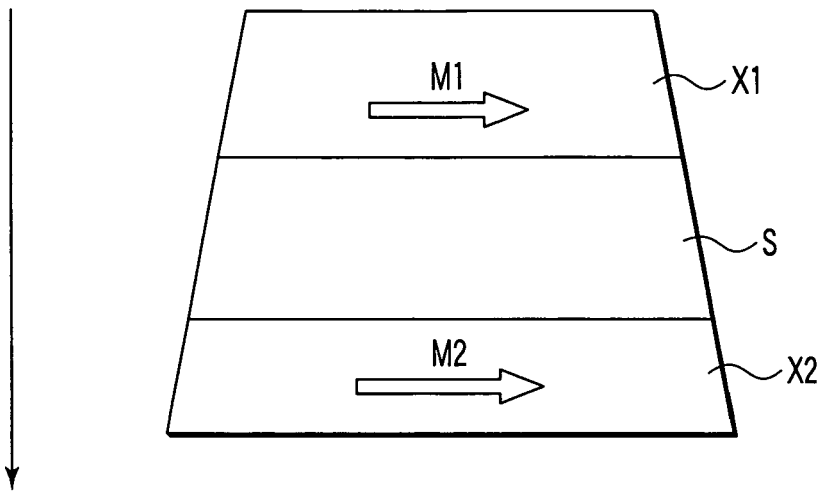
FIGS. 10A and 10B are conceptual views illustrating a magneto-resistive effect.
Figure 10B:
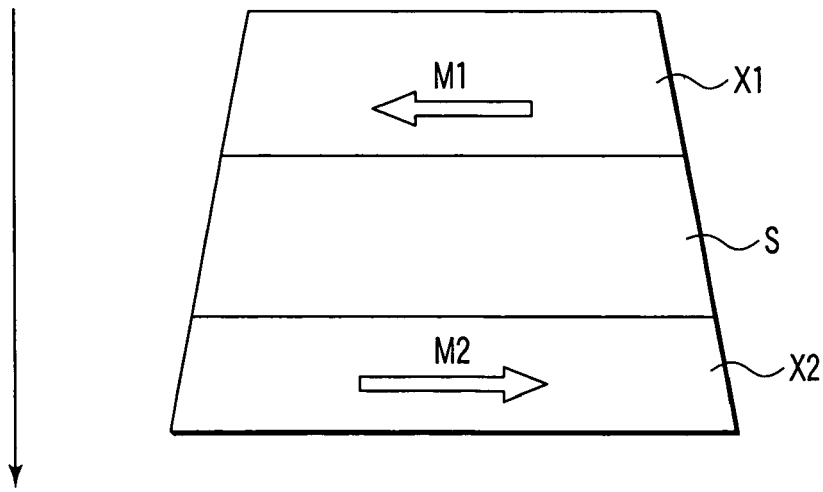

FIGS. 10A and 10B are conceptual views illustrating a magneto-resistive effect. That is, in the case of utilizing the magneto-resistive effect, a sense current I is supplied between magnetic layers X1 and X2 provide by interposing an intermediate layer S therebetween, whereby a magneto-resistive may be measured.

FIG. 10A shows a case in which a magnetization M1 of the magnetic layer X1 and a magnetization M2 of the magnetic layer X2 are in the same direction. In this case, the magneto-resistive detected by supplying the sense current I to these layers is obtained as a relatively small value in magneto-resistive effect of normal type. This magneto-resistive is obtained as a relatively large value in magneto-resistive effect of reverse type.

On the other hand, FIG. 10B shows a case in which the magnetization M1 of the magnetic layer X1 and the magnetization M2 of the magnetic layer X2 are anti-parallel to each other. In this case, the magneto-resistive detected by supplying the sense current I to these layers is obtained as a relatively small value in magneto-resistive effect of normal type. This magneto-resistive is obtained as a relatively small value in magneto-resistive effect of reverse type.

"0" and "1" are associated with a state in which these resistances are different from each other, respectively, thereby making it possible to read out two-valued data.

In the "readout" operation in FIGS. 4A to 9A and FIGS. 4B to 9B which are specific examples of the present invention, the recording section RE corresponds to the magnetic layer X1 shown in FIGS. 10A and 10B, and the magnetization of the adjacent magnetic layers via the intermediate layer corresponds to the magnetization M1 in FIGS. 10A and 10B. In addition, the intermediate layers shown in FIGS. 4A to 7A and FIGS. 4B to 7B are provided, and one of the intermediate layers shown in FIGS. 8A, 8B, 9A and 9B corresponds to the intermediate layer S shown in FIGS. 10A and 10B. Further, the fixed layer corresponds to the magnetic layer X2 shown in FIGS. 10A and 10B.

An electrode EL1 and an electrode EL2 are provided on the top and bottom of each of the elements shown in FIGS. 4A, 4B, 9A and 9B, and a sense current which is smaller than a critical current for writing is supplied between the electrodes EL1 and EL2, thereby enabling reproduction. In this case, the current may be supplied from the electrode EL1 to the electrode EL2 and vice versa.

In order to obtain a reproduced output having a large amount of memory space, with respect to the intermediate layers shown in FIGS. 4A to 7A and FIGS. 4B to 7B or one of the intermediate layers shown in FIGS. 8A, 8B, 9A and 9B, a tunnel magneto-resistive effect may be measured by using a tunnel barrier material formed from an insulator or a semiconductor such as an alumina ($Al_2O_{3-x}$) or magnesium oxide (MgO), $SiO_2$, Si—O—N, or GaAlAs. Alternatively, a vertical electrically conducting MR effect having a limited current path may be used by using $SiO_2$ or alumina in which a hole is formed and a magnetic body or an electrically conductive metal (Cu, Ag, Au) is embedded in the hole.

By way of example of the element structure shown in FIGS. 4A and 4B, reproduction will be described in more detail with reference to FIGS. 11A to 13A and FIGS. 11B to 13B.

Figure 11A:
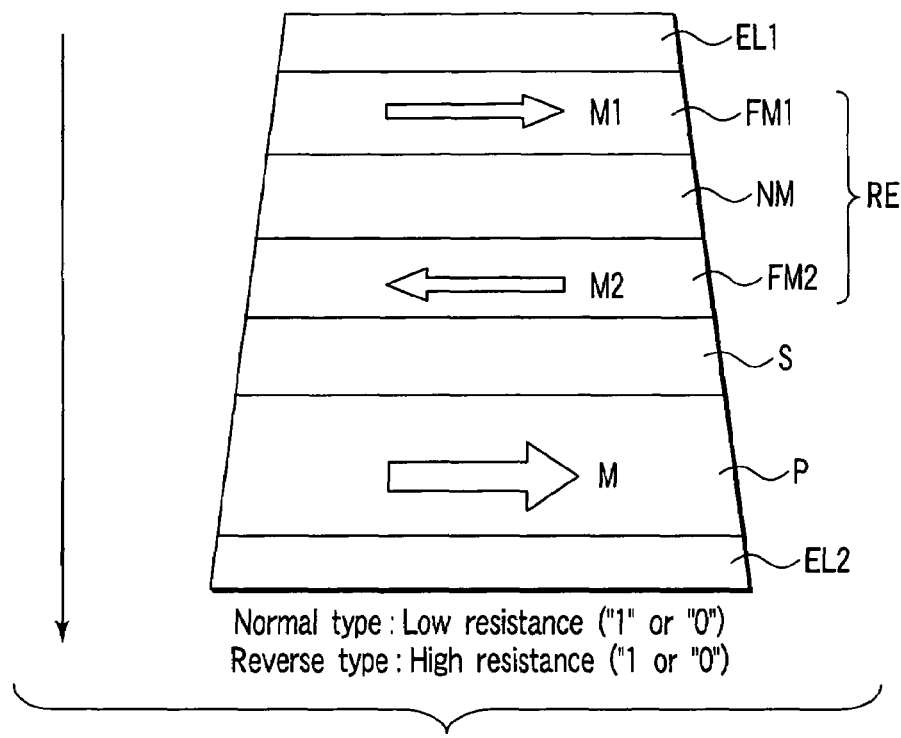
FIGS. 11A and 11B are schematic views showing a magneto-resistive element capable of detecting a magneto-resistive effect.
Figure 11B:
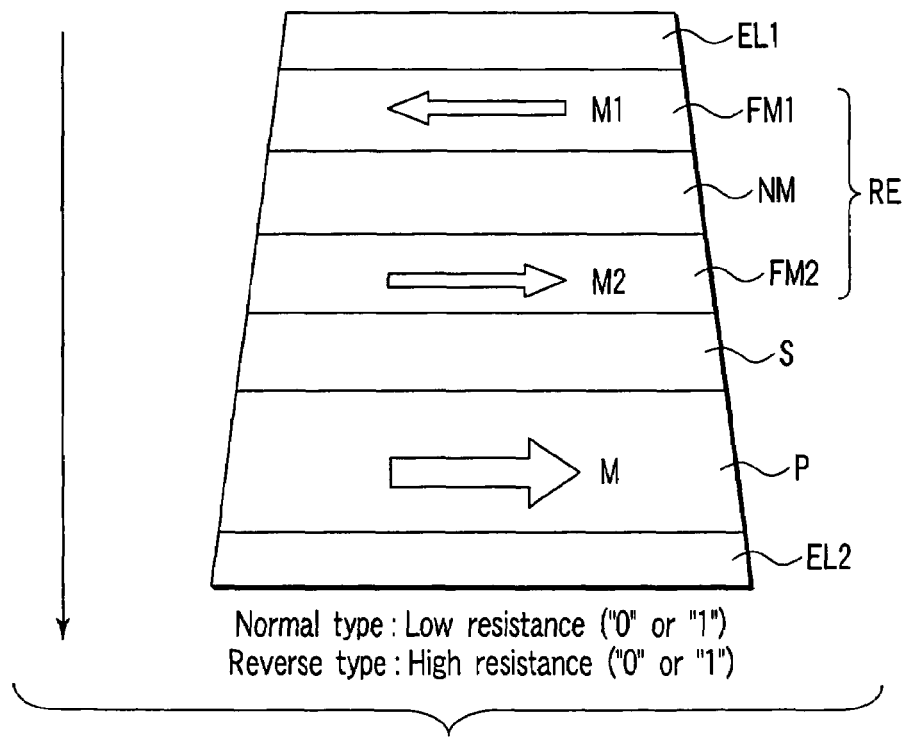

FIGS. 11A and 11B are schematic views showing a specific example of supplying a sense current which is smaller than a write current to the element shown in FIGS. 4A and 4B and detecting a magneto-resistive effect.

It is preferable that a tunnel barrier material formed from an insulator or a semiconductor such as an alumina ($Al_2O_{3-x}$) or magnesium oxide (MgO), $SiO_2$, Si—O—N, or GaAlAs be used for the intermediate layer S because a great magneto-resistive effect can be attained.

FIGS. 11A and 11B show a case in which the magnetization M2 of the ferromagnetic layer FM2 and the magnetization M of the magnetic fixed layer P are anti-parallel to each other. In this case, the magneto-resistive detected by supplying the sense current I is obtained as a relatively large value in magneto-resistive effect of normal type. This magneto-resistive is obtained as a relatively small value in magneto-resistive of reverse type.

On the other hand, FIG. 11B a case in which the magnetization M2 of the ferromagnetic layer FM2 and the magnetization M of the magnetic fixed layer P are parallel to each other. In this case, the magneto-resistive detected by supplying the sense current I is obtained as a relatively small value in magneto-resistive effect of normal type. This magneto-resistive is obtained as a relatively large value in magneto-resistive of reverse type.

In this manner, the magnetization of the recording section RE is detected, thereby making it possible to read out data.

Figure 12A:
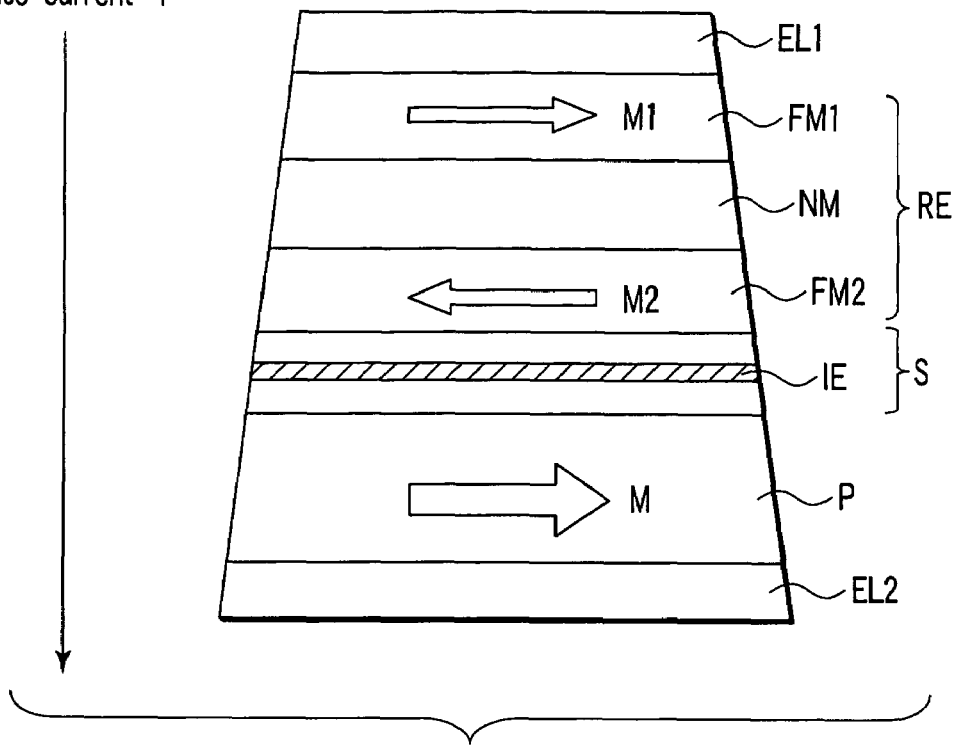
FIGS. 12A and 12B are schematic sectional views showing a specific example of a magneto-resistive element which increases a magneto-resistive effect.
Figure 12B:
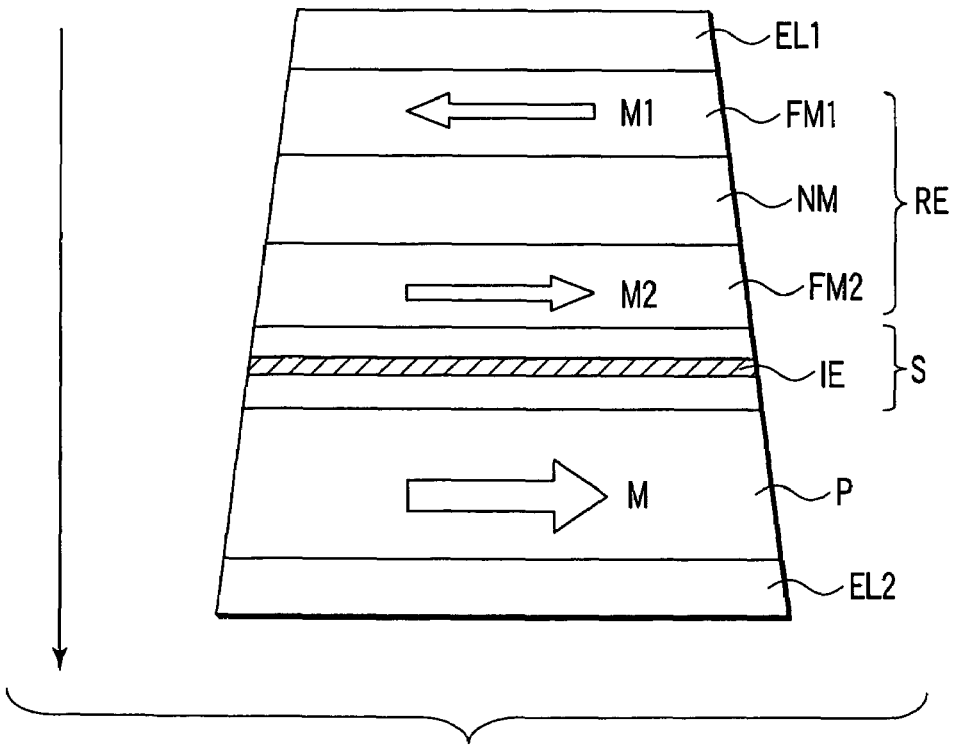

FIGS. 12A and 12B are schematic sectional views showing a specific example of a magneto-resistive element in which a great magneto-resistive effect can be attained.

That is, in the case of this specific example, an intermediate substance layer IE is inserted into the intermediate layer S. This intermediate substance layer IE is provided to cause an increase of the magneto-resistive effect. The intermediate substance layer IE can include a discontinuous insulating thin film. That is, an insulating thin film having a pin hole is inserted into an intermediate layer, thereby making it possible to increase the magneto-resistive effect. The thus structured MR is referred to as CCP (Current-Confied-Pass)-CPP (Current-Perpendicular-to-Plane)-MR (MagnetoResistance effect) element.

Such a discontinuous insulating thin film can include: for example, a nickel (Ni) and copper (Cu) alloy oxide or nitride; a nickel (Ni) and gold (Au) alloy oxide or nitride; and an aluminum (Al) and copper (Cu) alloy oxide or nitride.

Compounds such as these alloy oxides or nitrides are phase-separated by making them close to an equilibrium state by means of heating or the like, and are hardly produced as a compound (oxide or nitride) made of Au or Cu, etc. Therefore, these compounds each are separated into a phase having a low electrical resistance and a compound phase in which oxidization of Ni or Au, etc. is easily provided, the compound phase having an electrical resistance. Thus, a discontinuous insulating thin film in which a pin hole exists can be formed by controlling a composition and a temperature or an applied energy. When a pin hole filled with a nonmagnetic body is thus formed, a path through which a current passes can be narrowed, and a spin dependency scattering effect can be detected with a high resistance. Therefore, a great magneto-resistive effect can be attained.

Such an intermediate substance layer IE is inserted into the intermediate layer S, whereby the magneto-resistive effect between the ferromagnetic layer and the magnetic fixed layer at both sides of the intermediate layer is increased, and detection can be made easy.

Figure 13A:
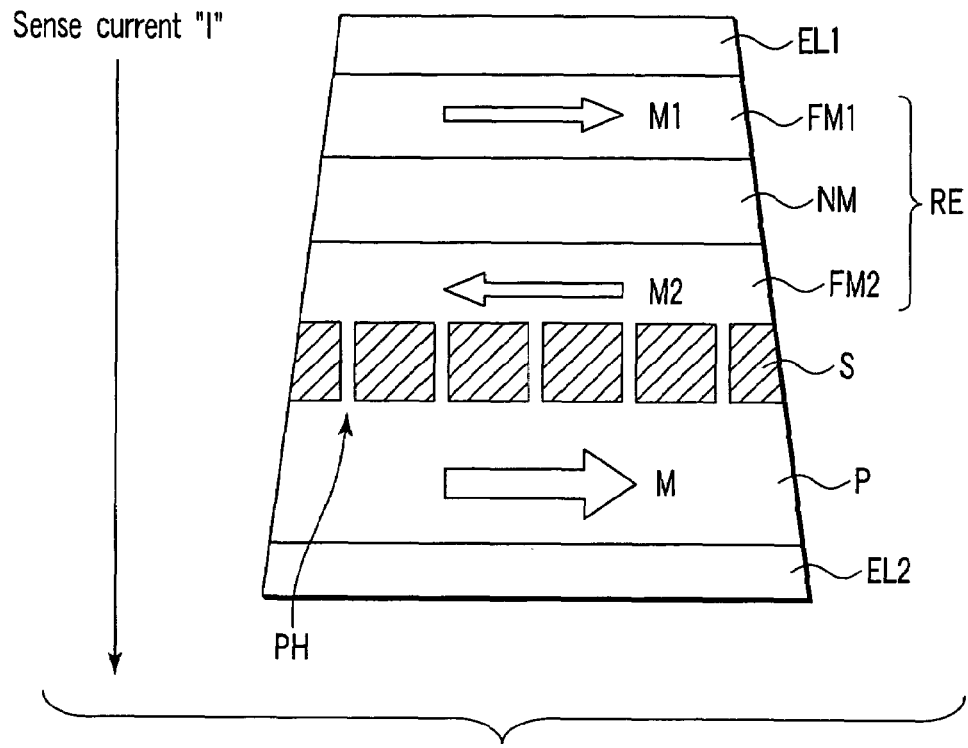
FIGS. 13A and 13B are schematic sectional views showing another specific example of the magneto-resistive element which increases a magneto-resistive effect.
Figure 13B:
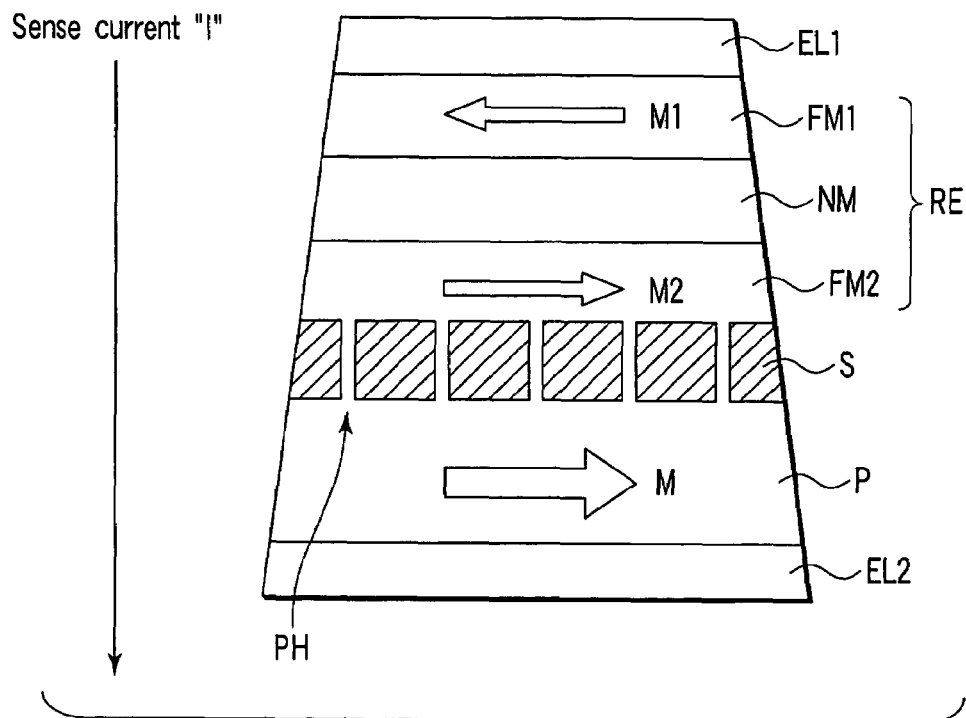

FIGS. 13A and 13B are schematic sectional views showing another specific example of the magneto-resistive element which increases a magneto-resistive effect.

That is, in the case of this specific example, the intermediate layer S is provided as an insulating layer having a pin hole PH. The pin hole PH is embedded with at least any of the materials for the ferromagnetic layer FM2 and magnetic fixed layer P at both sides of the intermediate layer.

When the ferromagnetic layer FM2 and the magnetic fixed layer P are thus connected to each other via the pin hole PH, a so-called "magnetic point contact" is formed, and a very great magneto-resistive effect can be attained. Therefore, the direction of the magnetization M2 of the ferromagnetic layer FM2 can be determined with high sensitivity by detecting the magneto-resistive effect between the magnetic layers at both sides of the intermediate layer via the pin hole PH. The thus structured MR is referred to as a "nano-contact MR".

Here, it is desirable that an aperture diameter of the pin hole PH is equal to or smaller than approximately 20 nm. The pin hole PH can be formed in various shapes such as a conical shape, a columnar shape, a spherical shape, a pyramidal shape, and a prism shape. Also, the number of pin holes PH may be singular or plural. Of course, a smaller number of holes is desirable.

On the other hand, in the case of the magneto-resistive element described previously with respect to FIGS. 8A, 8B, 9A and 9B, two serial type magneto-resistive sections occur. That is, there are formed: a first magneto-resistive section at which the magnetic fixed layer P1 (P2 in the case of FIGS. 9A and 9B) and the ferromagnetic layer FM1 are laminated by interposing the intermediate layer S1 therebetween; and a second magneto-resistive section in which the magnetic fixed layer P2 (P3 in the case of FIGS. 9A and 9B) and the ferromagnetic layer FM2 are laminated by interposing the intermediate layer S2 therebetween.

In these magneto-resistive elements, in the case where a sense current is supplied between the electrodes EL1 and EL2 in series, the first and second magneto-resistive sections are canceled out in magneto-resistive effect if the resistances of the intermediate layers S1 and S2 are equal to each other and the resistance change rates between these layers are equal to each other. Thus, the magnetization state of the recording section RE cannot be detected.

As shown in FIGS. 8A, 8B, 9A and 9B, two intermediate layers S1 and S2 are provided, a nonmagnetic metal intermediate layer is used for either one of the intermediate layers S1 and S2. At the other one of these layers, there is provided: the insulating layer or semiconductor layer described previously with respect to FIGS. 11A and 11B; the intermediate layer described previously with respect to FIGS. 12A and 12B; or the insulating layer having the pin hole PH described previously with respect to FIGS. 13A and 13B. In this manner, the magnetization state of the recording section RE can be detected with high sensitivity and writing can be efficiently carried out.

As has been described above, according to the present embodiment, there can be provided a magneto-resistive element which is small in deviation of element characteristics; which is very small in effect of an external magnetic field; which can maintain a recording state with high reliability; and which has a writing characteristic and a reproduction characteristic. By using this magneto-resistive element, as described later by way of example, there can be provided a magnetic recording and reproducing apparatus such as a solid magnetic memory or a probe storage which has excellent recording and reproducing characteristics and which enables significant integration.

Now, a description will be given with respect to a method for making the directions of magnetizations M1 and M2 of two magnetic layers FM1 and FM2 anti-parallel to each other in the magneto-resistive element according to the invention.

First, a first method can include a method for making the magnetization M1 and M2 anti-parallel to each other by coupling fixed layers C1 and C2 with each other in a static magnetic field.

Figure 14:
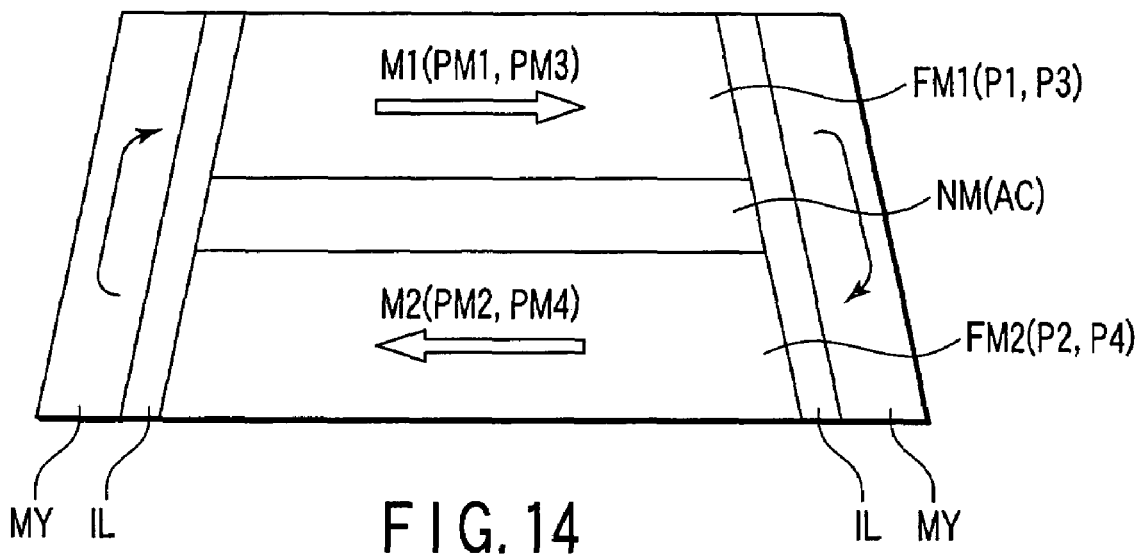
FIG. 14 is a schematic sectional view showing static magnetic coupling of ferromagnetic layers FM1 and FM2.

FIG. 14 is a schematic sectional view illustrating static magnetic coupling of the ferromagnetic layers FM1 and FM2. That is, in the case of this specific example, a magnetic yoke MY is provided on both sides of the recording section RE via an insulating layer IL. A magnetic field as indicated by the arrow inside of the magnetic yoke MY is formed, and a flowback magnetic field via the yoke MY and the ferromagnetic layers FM1 and FM2 is formed. When the ferromagnetic layers FM1 and FM2 are thus coupled with each other in a static magnetic field via the magnetic yoke MY, the magnetizations M1 and M2 can be placed in anti-parallel to each other by the flowback magnetic field.

A similar measure can be taken with respect to the magnetic fixed layers P1 to P4. Namely, as shown in FIG. 14, magnetizations can be placed in anti-parallel to each other by coupling the magnetic fixed layers P1 and P2 and the magnetic fixed layers P3 and P4 respectively, in a static magnetic field.

Furthermore, an anti-ferromagnetic layer is formed in contact with the outside of one of the magnetic fixed layers, and unidirectional anisotropy is imparted, thereby making it possible to control the magnetization direction of the fixed layers.

Figure 15:
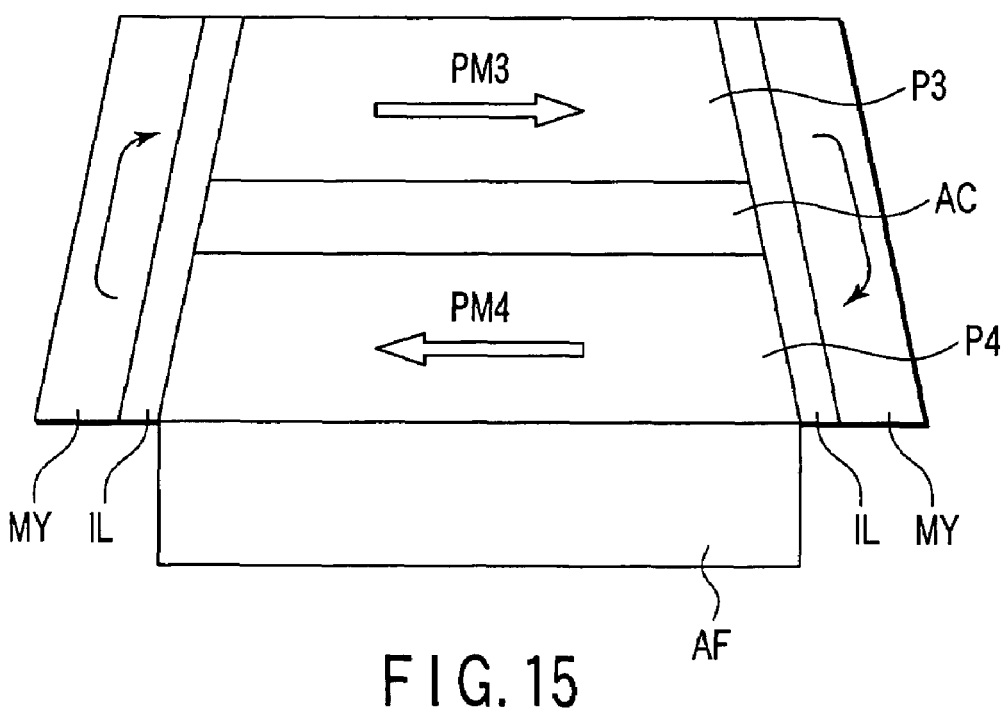
FIG. 15 is a schematic sectional view showing a magneto-resistive element having a magnetic fixed layer provided thereon.

FIG. 15 is a schematic sectional view illustrating a magneto-resistive element having an anti-ferromagnetic layer provided thereon. That is, an anti-ferromagnetic layer AF is provide under the magnetic fixed layer P4, and the anti-ferromagnetic layer is magnetically coupled with the magnetic fixed layer P4, whereby the direction of the magnetization PM4 is fixed. The magnetization PM3 of the magnetic fixed layer P3 coupled with the magnetic fixed layer P4 in a static magnetic field via the magnetic yoke MY is opposite to the magnetization PM4 in direction. This can apply for the magnetic fixed layers P1 and P2 as well.

On the other hand, in the present invention, a method for making the directions of the magnetizations M1 and M2 of the ferromagnetic layers FM1 and FM2 of the recording section RE opposite to each other includes a method for regulation the film thickness of the nonmagnetic layer NM provided between these ferromagnetic layers.

Figure 19:
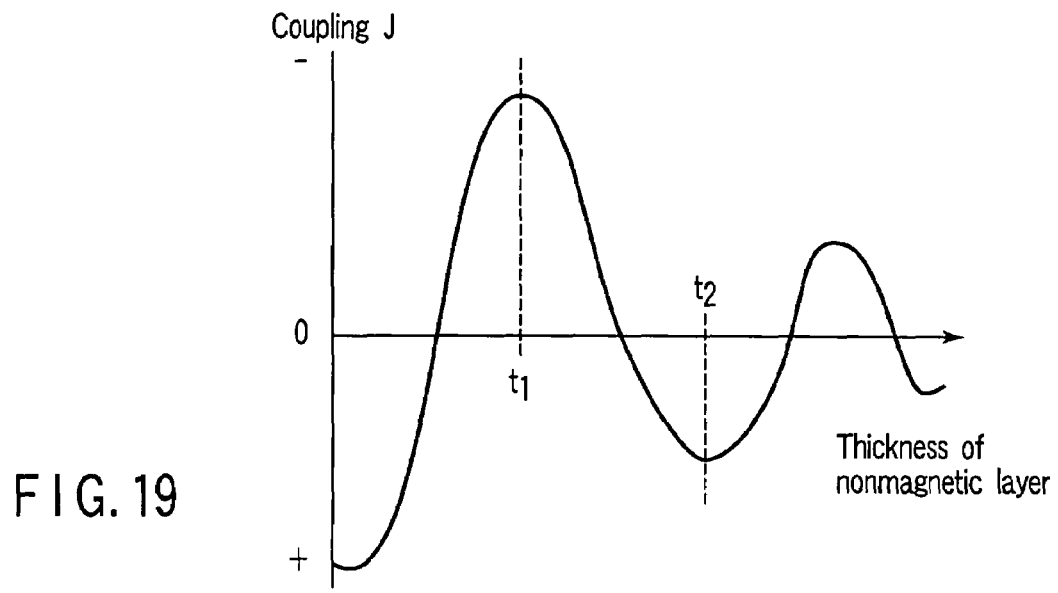
FIG. 19 is a graph depicting an interlayer exchange interaction via a nonmagnetic layer NM.

That is, in general, an inter-layered exchange interaction via the nonmagnetic layer NM vibrates positively or negatively with respect to the film thickness of the nonmagnetic layer NM as schematically illustrated in FIG. 19. Therefore, the film thickness of the nonmagnetic layer NM may be set so as to be associated with a peak position (for example, t1) at which a negative exchange interaction can be obtained in FIG. 19.

With such a structure, the magnetization directions of the ferromagnetic layers FM1 and FM2 can be coupled with each other in an anti-parallel manner.

Now, a description will be given with respect to a method for fixing the magnetic fixed layer P or P1 to P4 in the magneto-resistive element according to the present invention.

Figure 16A:
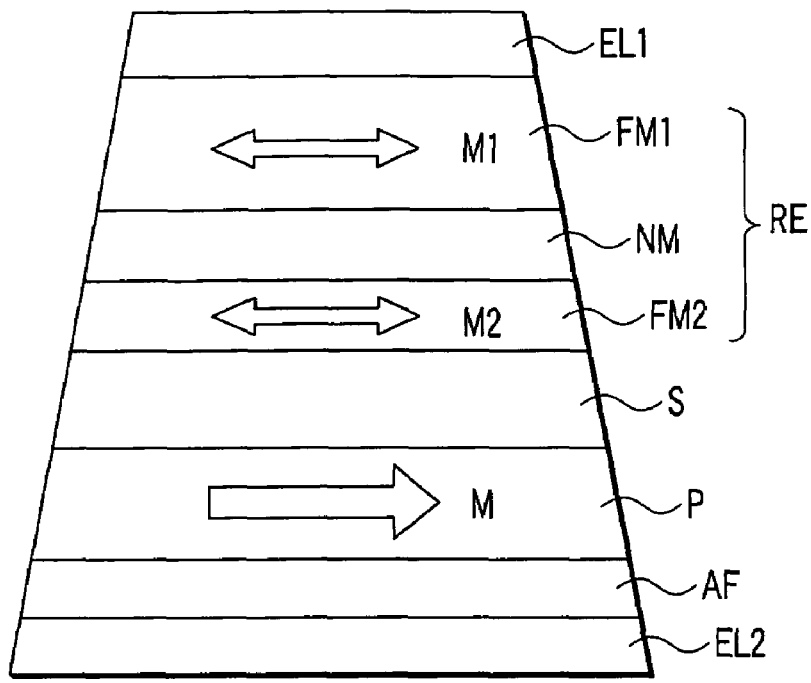
FIGS. 16A and 16B are schematic sectional views showing a magneto-resistive element in which an anti-ferromagnetic layer is provided in order to magnetize and fix a magnetic fixed layer.

In order to fix the magnetic fixed layer P or P1 to P4, the anti-ferromagnetic layer AF is provided in contact with the magnetic layer. That is, in the magneto-resistive element illustrated in FIGS. 4A, 4B, 5A and 5B, the anti-ferromagnetic layer AF is provided between the magnetic fixed layer P and the electrode EL2 as illustrated in FIG. 16A.

Figure 6A:
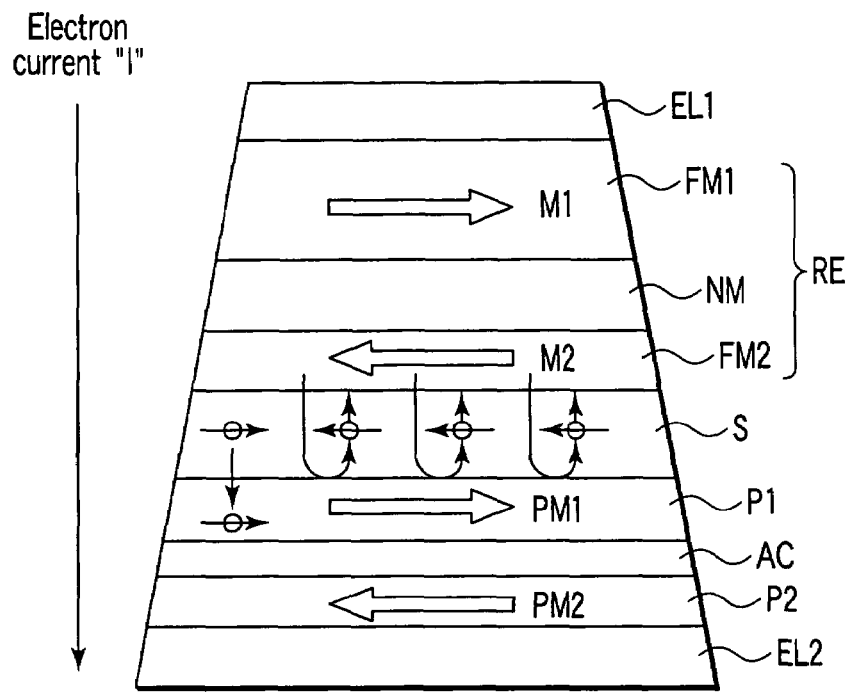
FIGS. 6A and 6B are schematic sectional views showing a mechanism of writing of a magneto-resistive element of "normal type" according to the embodiment of the invention when layers coupled with each other in an anti-ferromagnetic manner are defined as fixed layers.
Figure 6B:
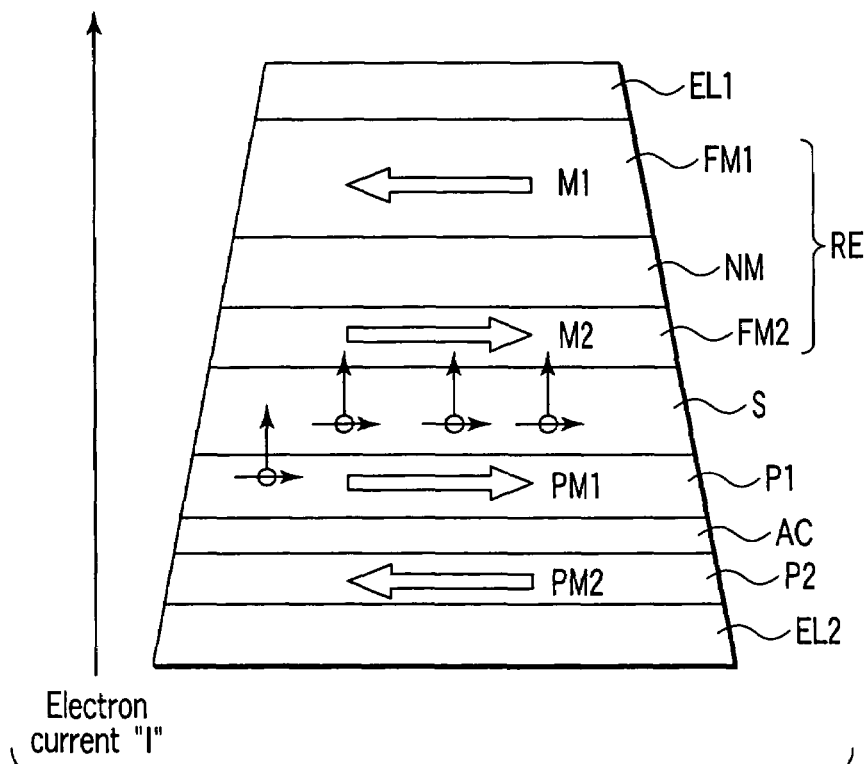
Figure 16B:
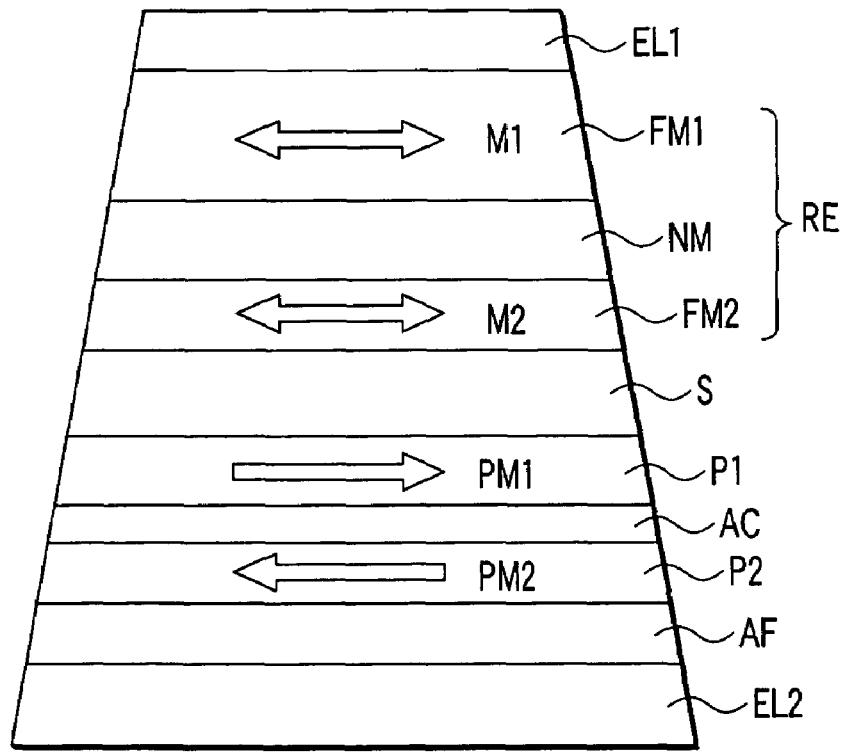

In the case of the magneto-resistive element shown in FIGS. 6A and 6B, in order to fix the magnetic fixed layers P1 and P2 coupled with each other in an anti-ferromagnetic manner as shown in FIG. 16B, the anti-ferromagnetic layer AF is provided between the magnetic fixed layer P2 and the electrode EL2.

Figure 7A:
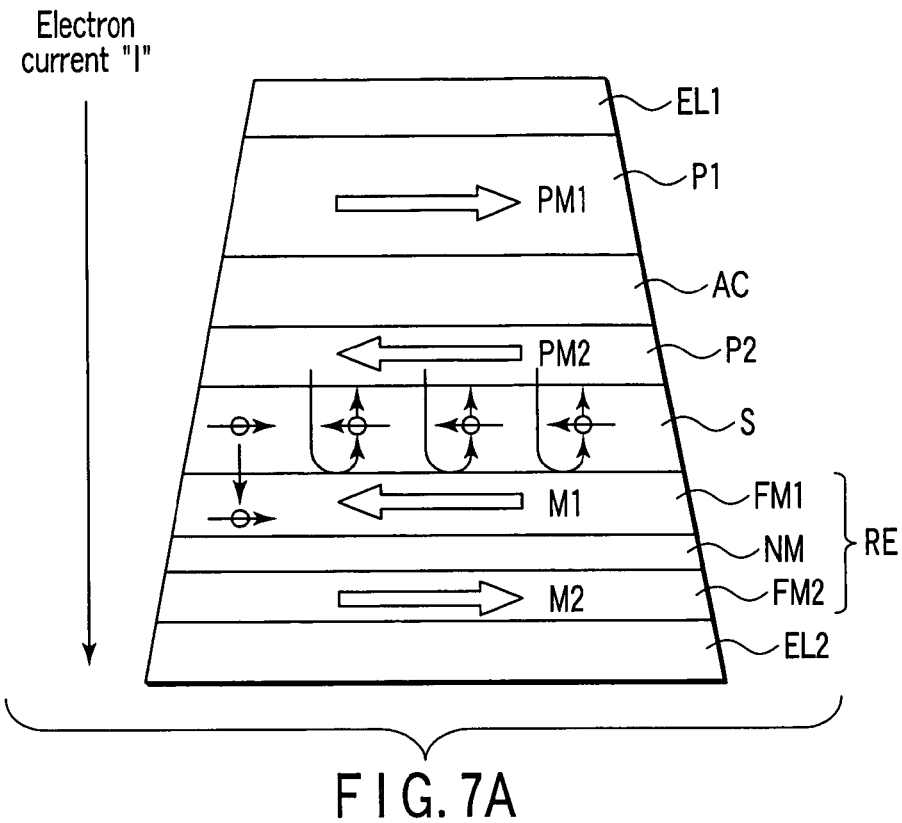
FIGS. 7A and 7B are schematic sectional views showing a mechanism of writing of a magneto-resistive element of "normal type" according to the embodiment of the invention when layers coupled with each other in an anti-ferromagnetic manner are defined as fixed layers.
Figure 7B:
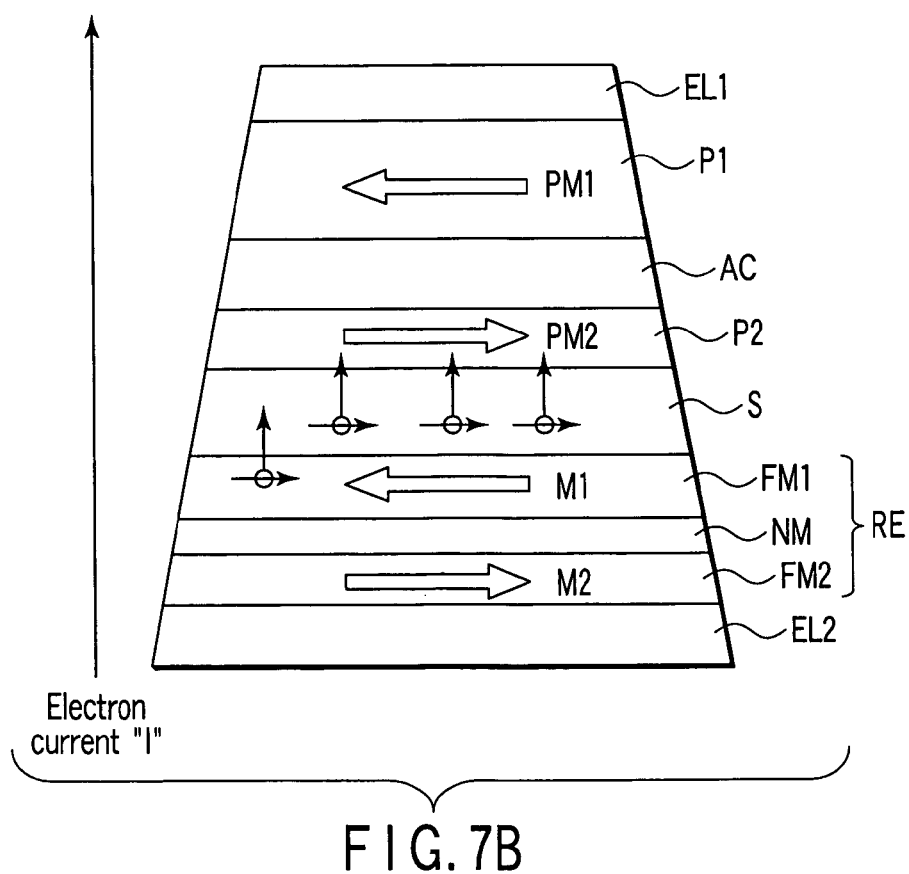
Figure 17A:
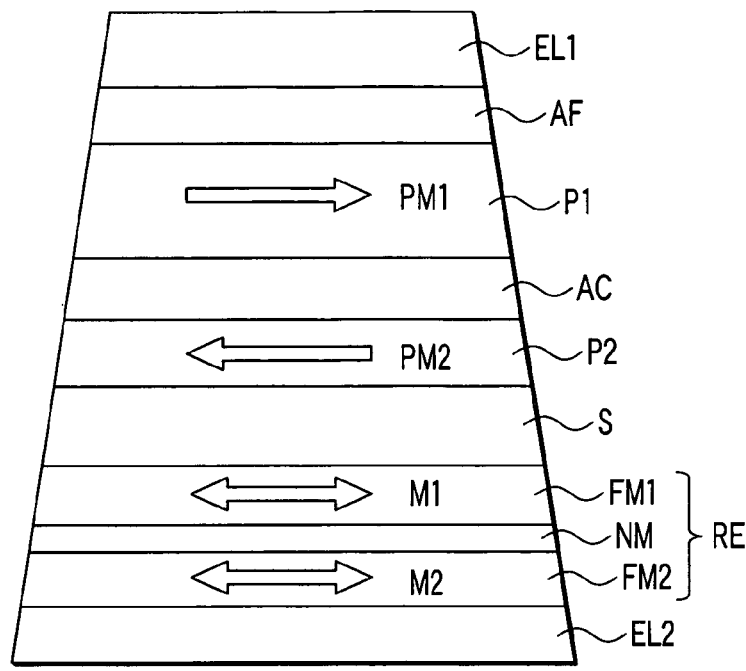
FIGS. 17A and 17B are schematic sectional views showing a magneto-resistive element in which an anti-ferromagnetic layer is provided in order to magnetize and fix a magnetic fixed layer.

In the case of the magneto-resistive element shown in FIGS. 7A and 7B, in order to fix the magnetic fixed layers P1 and P2 coupled with each other in an anti-ferromagnetic manner as shown in FIG. 17A, the anti-ferromagnetic layer AF is provided between the magnetic fixed layer P1 and the electrode EL1.

Figure 17B:
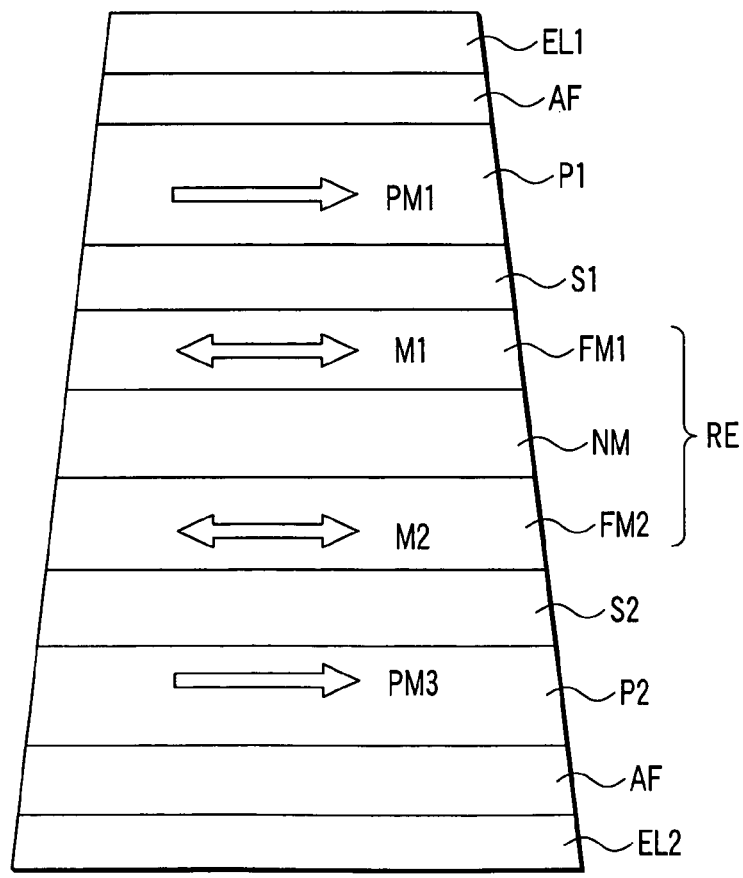

In the case of the magneto-resistive element shown in FIGS. 8A and 8B, in order to fix the magnetic fixed layers P1 and P2 as shown in FIG. 17B, the anti-ferromagnetic layer AF is provided between the electrode EL1 and the electrode EL2.

Figure 18:
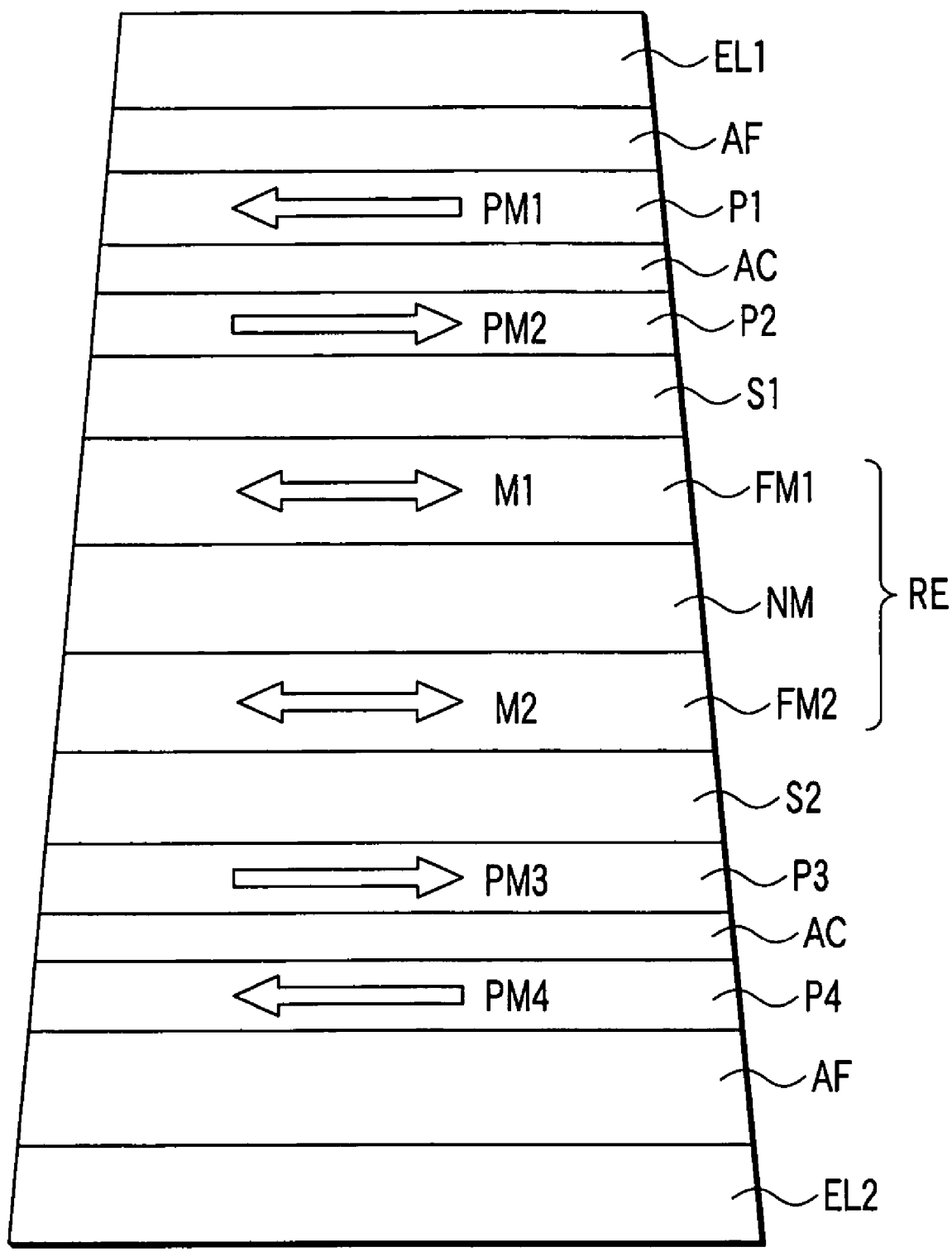
FIG. 18 is a schematic sectional view showing a magneto-resistive element in which an anti-ferromagnetic layer is provided in order to magnetize and fix a magnetic fixed layer.

In the case of the magneto-resistive element shown in FIGS. 9A and 9B, in order to fix the magnetic fixed layers P1 and P2 coupled with each other in an anti-ferromagnetic manner, and further, fix the magnetic fixed layers P3 and P4 coupled with each other in an anti-ferromagnetic manner as shown in FIG. 18, the anti-ferromagnetic layers AF are provided between the magnetic fixed layers P1 and the electrodes EL1 and between the magnetic fixed layer P4 and the electrode EL2.

With the above-described structure, it becomes possible to magnetically fix the magnetic fixed layer.

Now, constituent elements configuring the magneto-resistive element according to the invention will be described in detail.

The materials for the ferromagnetic layers FM1 to FM4 and the magnetic fixed layer P1 to P4 can include any of an alloy including at least any one of the elements selected from the group consisting of iron (Fe), cobalt (Co), and nickel (Ni) or consisting of iron (Fe), cobalt (Co), nickel (Ni), manganese (Mn), and chrome (Cr); a NiFe based alloy referred to as a "permalloy"; or alternatively, a soft magnetic material such as a CoNbZr based alloy, a FeTaC based alloy, a CoTaZr based alloy, a FeAlSi based alloy, a FeB based alloy, or a CpFeB based alloy; a Heusler alloy; a magnetic semiconductor; and a half metal magnetic oxide (or half metal magnetic nitride) such as $CrO_2$, $FeBFe_2O_4$, $La_{1-x}Sr_xMnO_3$.

In the present invention, the materials for the ferromagnetic layers FM1 to FM4 and the magnetic fixed layers P1 to P4 may be properly selected as those having a magnetic characteristic according to usage.

The materials for these magnetic layers may be a continuous magnetic body. Alternatively, there can be used a composite structure in which microscopic particles consisting of a magnetic body are precipitated or formed in a nonmagnetic matrix. Such a composite structure can include, for example, a so-called "granular magnetic body".

On the other hand, as the materials for the ferromagnetic layers FM1 to FM4, there can be used a laminate body structured in two layers, the laminate body including a Co or CoFe alloy and a permalloy or Ni, the permalloy being made of NiFe or NiFeCo, or alternatively, Ni; or alternatively, a laminate body structured in three layers, the laminate body including a Co or CoFe alloy, a permalloy or Ne, the permalloy being made of NiFe or NiFeCo, and a Co or CoFe alloy. In the case of a magnetic layer having these multi-layered structures, it is preferable that the thickness of the outside Co or CoFe alloy be in the range of 0.2 nm to 1 nm. With this structure, magnetization inversion can be obtained with a smaller amount of current.

It is desirable that a nonmagnetic metal layer and an anti-ferromagnetic body such as ruthenium (Ru), iridium (Ir), or chrome (Cr) be used as: the material for the nonmagnetic layer NM for coupling a plurality of ferromagnetic layers of the recording section RE with each other in an anti-ferromagnetic manner; and the material for the ferromagnetic coupling layer AC required for using a laminate structure in which magnetic fixed layers are coupled with each other in an anti-ferromagnetic manner. It is desirable that the thickness of each of these elements be in the range of 0.2 nm to 0.3 nm in order to obtain anti-ferromagnetic coupling.

The magnetic fixed layers P1 to P4 are formed of any of the above-described materials, and are provided in contact with the anti-ferromagnetic layer (refer to FIGS. 15, 16A, 16B, 17A, 17B and 18), whereby these fixed layers can be magnetized and fixed by means of an exchange bias. As a ferromagnetic material for that purpose, it is desirable that iron manganese (FeMn), platinum manganese (PtMn), palladium manganese (PdMn), palladium platinum manganese (PdPtMn) and the like are used. A laminate body composed of a ferromagnetic layer, a nonmagnetic layer, and a ferromagnetic layer coupled with each other in an anti-ferromagnetic manner is used as a magnetic fixed layer, and the anti-ferromagnetic layer is provided in contact with this laminate body, thereby making it possible to fix magnetization. When such a magnetic fixed layer is used, the leakage magnetic field from the magnetic fixture layer itself is reduced, and the characteristics of the magneto-resistive element are further stabilized.

The intermediate layer S (or S1, S2) provided for a recording and reproducing operation can be made of either of two materials, i.e., a low resistance material and a high resistance material.

Examples of the low resistance material include copy (Cu), gold (Au), silver (Ag), aluminum (Al), or an alloy including one or more kinds of these elements. An advantageous effect of magnetization inversion can be attained when the thickness of the intermediate layer made of these low resistance non-magnetic metal materials is in the range of 1 nanometer to 60 nanometers.

Examples of the high resistance material include: oxide or nitride including at least any element selected from the group consisting of aluminum (Al), titanium (Ti), tantalum (Ta), cobalt (Co), nickel (Ni), silicon (Si), magnesium (Mg), and iron (Fe), such as alumina ($Al_2O_{3-x}$) or magnesium oxide (MgO), $SiO_2$, Si—O—N, Ta—O, and Al—Zr—O; an insulator made of fluoride; and a semiconductor having a large gap, such as GaAlAs. In addition, a large reproduced output can be obtained by using: a nano-contact MR material having a pin hole formed on the insulating layer and having a magnetic layer invaded therein; or alternatively, Cu-invaded CCP (Current-Confined-Pass)-CPP (Current-Perpendicular-to-Plane)-MR (MagnetoResistance effect) material. In the case of the insulator for the former tunnel magneto-resistive effect, it is desirable that the thickness of the insulator is in the range of 0.2 nanometer to 2 nanometers in view of signal reproduction.

In the case of the nano-contact MR and CCP-CPP-MR, it is desirable that the thickness of the intermediate layer S is in the range of 0.4 nanometer to 40 nanometers.

Examples of the material for the intermediate layers S1 and S2 for obtaining the magneto-resistive effect of "normal type", as described above, include: a holed insulator having filled therein copper (Cu), silver (Ag), gold (Au) and a compound thereof, alumina ($Al_2O_{3-x}$), magnesium oxide (MgO), aluminum nitride (Al—N), silicon oxide nitride (Si—O—N), and copper (Cu); and a holed insulator having a magnetic material filled therein.

These materials are used for the intermediate layers S1 and S2; and an alloy including any of Mn and Cr such as Co, Fe, Ni or CoFe and NiFe, or alternatively, a so-called metallic ferromagnetic body such as CoFeB or Heusler alloy is combined as the materials' of the ferromagnetic layers FM1 and FM and the magnetic fixed layer P1 and P2, whereby a magneto-resistive effect of normal type can be obtained between the ferromagnetic layer FM1 and the magnetic fixed layer P1 and between the ferromagnetic layer FM2 and the magnetic fixed layer P2.

In the case where an oxide based magnetic body such as $CrO_2$, $Fe_3O_4$, $La_{1-x}Sr_xMnO_3$ is used for these magnetic layers as well, the magneto-resistive effect of normal type can be obtained.

On the other hand, examples of the material for the intermediate layers S1 and S2 for obtaining the magneto-resistive effect of reverse type include tantalum (Ta—O). Namely, in the case where the so-called metallic ferromagnetic body described previously is used as the material for the ferromagnetic layers FM1 and FM2 and the magnetic fixed layers P1 and P2, the magneto-resistive effect of reverse type can be obtained by combining the intermediate layers S1 and S2 made of tantalum oxide.

Further, examples of the combination of a magnetic layer, an intermediate layer, and a magnetic layer in which the magneto-resistive effect of reverse type is obtained include a combination of a metallic magnetic layer, an oxide insulator intermediate layer, and an oxide based magnetic layer. For example, $Co/SrTiO_3/La_{0.7}Sr_{0.3}MnO_3$, $Co_9Fe/SrTiO_3/La_{0.7}Sr_{0.3}MnO_3$ and the like can be used.

The combination of a magnetic layer, an intermediate layer, and a magnetic layer in which the magneto-resistive effect of reverse type can also include a system composed of a magnetite, an insulator intermediate later, and a perovskite based oxide magnetic body such as $Fe_3O_4/CoCr_2O_4/La_{0.7}Sr_{0.3}MO_3$.

Furthermore, the combination of a magnetic layer, an intermediate layer, and a magnetic layer in which the magneto-resistive effect of reverse type is obtained can include a combination of $CrO_2$, Cr oxide insulator, and Co.

On the other hand, it is desirable that, as a planer shape of the magnetic recording and reproducing element according to the invention, the planer shape of the ferromagnetic layers FM1 to FM4 is a rectangle which is in the range of 1:1 to 1:5 in aspect ratio; a hexagon in portrait (landscape), an ellipse, a rhombus, and a parallelogram. In the dimensions of that ferromagnetic layer, it is desirable that one edge in a longitudinal direction is in the range of 5 nanometers to 500 nanometers. In FIGS. 1A to 18, the size in a transverse direction of the ferromagnetic layer, nonmagnetic later, intermediate layer, and magnetic fixed layer between two electrodes changes continuously while a trapezoidal shape is formed on a sectional plane. Even if the size in the transverse direction changes discontinuously in the middle of the layer, advantageous effect is attained as long as the requirements of the present invention are met.

In the case where the magnetic fixed layer exists on the substrate side, the size in the transverse direction of the layer is determined to be relatively larger than the size predicted from the trapezoidal sectional shape. In this manner, there can be attained an advantageous effect that the influence of the leakage magnetic field from the magnetic pole of the magnetic fixed layer to the ferromagnetic layer can be reduced, and that inversion behavior of the ferromagnetic layer is not prevented.

In addition, in FIGS. 1A to 18, although a side face of a sectional plane which is formed in a trapezoidal shape is composed of oblique straight lines, even if these straight lines are broken lines, there is no characteristic program as long as the requirements of the present invention are met.

Further, even if the electrode EL2 proximal to the subject is sufficiently larger than the size in the transverse direction predicted from the trapezoidal sectional shape, the element characteristics of the invention are not affected and have no problem.

Furthermore, in FIGS. 1A to 18, although the sectional plane of the upper electrode EL1 is also formed in a trapezoidal shape, even if the size in the transverse direction of the electrode EL1 is sufficiently larger than the above predicted size, the element characteristics are not affected and have no problem.

Now, embodiments of the present invention will be described in more detail with reference to Examples.

EXAMPLE 1

In accordance with Example 1, a description will be given with respect to a write characteristic caused by a current charge of the magneto-resistive element according to the invention while comparing it with a write characteristic caused by a current charge of a magneto-resistive element having a free layer composed of a single magnetic layer.

Figure 20B:
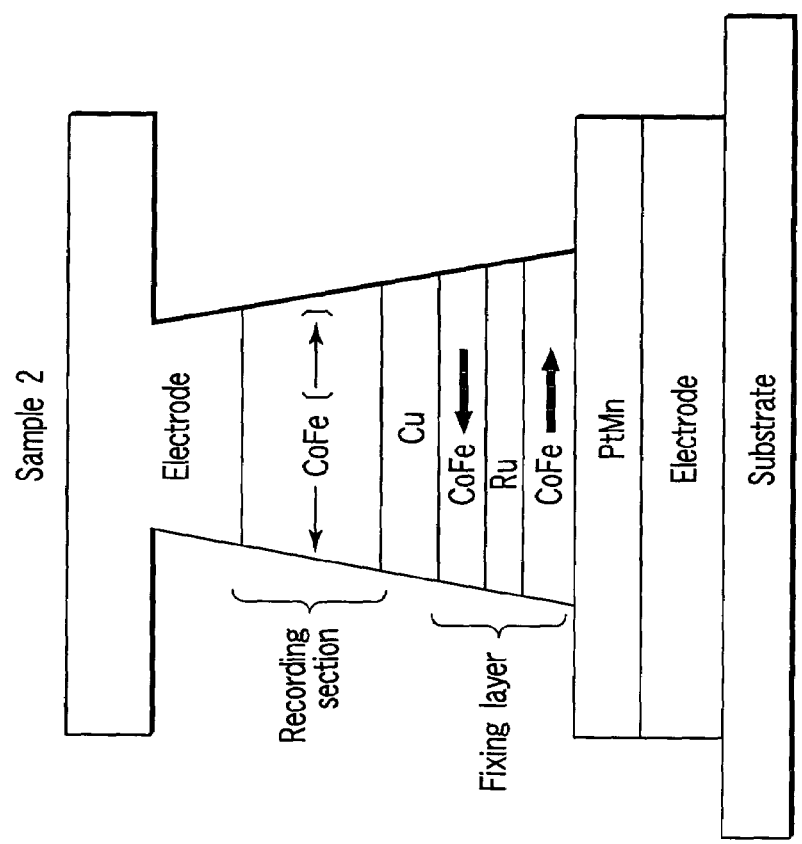
FIGS. 20A and 20B are schematic views showing a sectional structure of a magneto-resistive element prototyped by the Inventor.
Figure 20A:
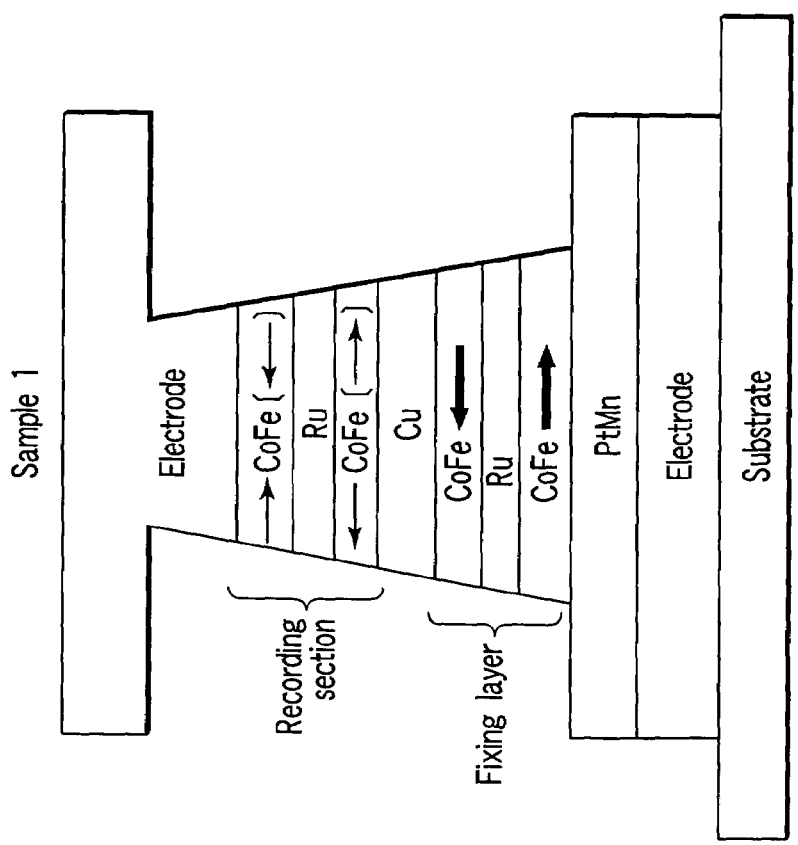

FIGS. 20A and 20B are schematic views showing a sectional structure of a magneto-resistive element which the Inventor has produced as a prototype. The structure of the thus produced magneto-resistive element is as follows.

(Sample 1)
Lower electrode/[PtMn 15 nm/CoFe 4 nm/Ru 1 nm/CoFe 4 nm]/Cu 6 nm/[CoFe 1.2 nm/Ru 1 nm/CoFe 1.3 nm]

(Sample 2)
Lower electrode/[PtMn 15 nm/CoFe 4 nm/Ru 1 nm/CoFe 4 nm]/Cu 6 nm/CoFe 2.5 nm Sample 1 is provided as a magneto-resistive element in Examples of the present invention, and corresponds to the element illustrated in FIG. 16B. On the other hand, sample 2 is provided as a magneto-resistive element having a single film free layer according to Comparative Example. Each of these samples has: a magnetic fixed layer P2 magnetized and fixed by an anti-ferromagnetic layer AF made of platinum manganese; an anti-ferromagnetic coupling layer AC; and a magnetic fixed layer P1. Also, in each of these samples, copper (Cu) having thickness of 6 nanometers is used as an intermediate layer S.

In sample 1, cobalt iron (CeFe) having thickness of 1.2 and 1.3 nanometers are used as the ferromagnetic layers FM1 and FM2 configuring the recording section, respectively, and ruthenium (Ru) having thickness of 1 nanometer is used as the nonmagnetic fixed layer NM. In contrast, in sample 2, cobalt iron having thickness of 2.5 nanometers is used as the ferromagnetic layer for magnetization recording. The film thickness is set so that magnetizations of the magnetic recording sections in sample 1 and sample 2 become equal to each other in total. For these samples 1 and 2, writing was carried out by a current charge via a Cu layer serving as the intermediate layer S, and reproduction was carried out by magneto-resistive measurement of perpendicular electric conduction via the same Cu layer.

Procedures for fabricating these samples will be given as follows.

First, by using a ultra-high vacuum sputtering apparatus, a lower electrode film made of a tantalum (Ta) layer and a cupper (Cu) layer was formed on a wafer, and a film having the above-described laminate structure was formed on the lower electrode film. Then, on this laminate structure, a cupper (Cu) layer and a tantalum (Ta) layer was formed as an upper electrode.

Next, this wafer was annealed in a magnetic field at 270° C. for 10 hours by a vacuum furnace in the magnetic field, and unidirectional anisotropy was imparted. An electron beam (EB) resist was applied to the laminate film, EB exposure was carried out, and then, a mask in a predetermined shape (70 nm×100 nm and parallel to unidirectional anisotropy axis in longitudinal direction in this example) was formed.

Next, a mask-free region was etched to the PtMn layer by an ion milling apparatus. The quantity of the etching used here can be precisely grasped by introducing the sputtered particles into a tetrode analyzer using differential emission and mass-analyzing them.

After etching, the mask was released, and further, $SiO_2$ was filmed. Then, the surface was smoothened by ion milling, and initial setting of the tantalum (Ta) layer was carried out. On the tantalum (Ta) layer, top wiring was formed. It was verified that the shape of the element was formed in a trapezoidal shape by sectional TEM observation.

Now, a measurement result of a magneto-resistive effect will be described here.

Figure 21A:
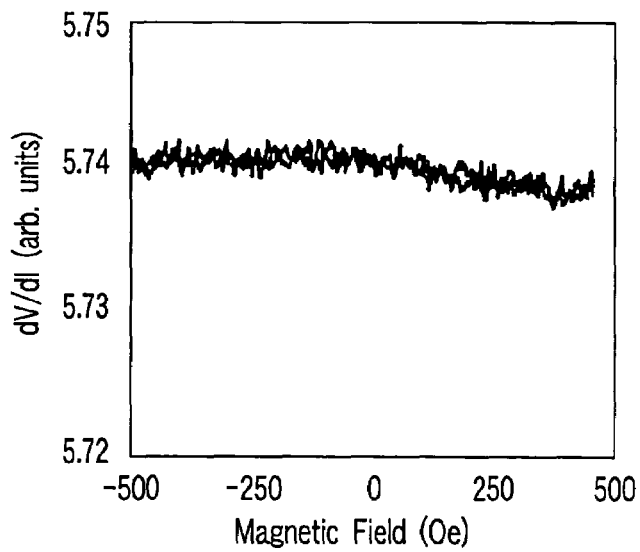
FIG. 21A is a graph depicting a magneto-resistive effect of sample 1 according to Example of the invention.
Figure 21B:
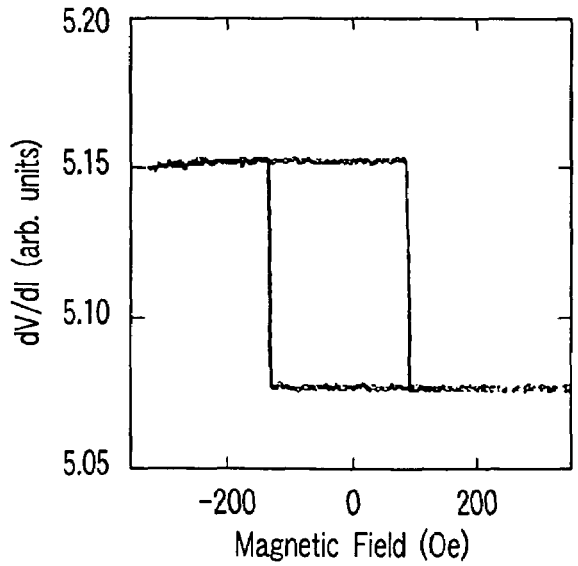
FIG. 21B is a graph depicting a magneto-resistive effect of sample 2 according to Comparative example of the invention.

FIG. 21A depicts a magneto-resistive effect of sample 1 according to Example of the present invention, and FIG. 21B is a view which graphically depicts a magneto-resistive effect of sample 2 according to Comparative Example, respectively.

The vertical axis of each of these graphs depicts a differential resistance. In this measurement, a current does not change, so that the measurement data can be reread as a resistance.

Now, a result of sample 2 shown in FIG. 21B will be described here. In the figure, it is found that a resistance changes in the vicinity of plus 95Oe (Oerested) and in the vicinity of minus 130Oe in an applied magnetic field, wherein the direction of magnetization of the free layer changes. That is, in sample 2, it is found that, if an external magnetic field of plus 95Oe or more or minus 130Oe or less is applied, a recording state of the free layer changes.

In contrast, in the case of sample 1 shown in FIG. 21A, it is found that, at the resistance of the magneto-resistive element, an applied magnetic field is substantially constant in the range of minus 500Oe to plus 500Oe. Namely, it is found that sample 1 has the direction of magnetization of the recording section which does not change in this magnetic field range, and is a magneto-resistive element which is very stable with respect to the external magnetic field as compared with sample 2.

Now, a current writing characteristic of sample 2 will be described here.

FIG. 22 is a graph depicting a write characteristic when the external magnetic field relevant to sample 2 is zero. In this figure, with respect to the current polarity, a current is defined as a plus when an electron flow passes from the magnetic fixed layer to the free layer.

From FIG. 22, it is found that a low resistance state and a high resistance state exist and that magnetization of the free layer is parallel to or is anti-parallel to the magnetic fixed layer, respectively. That is, a resistance is reduced when electrons pass from the magnetic fixed layer to the free layer. The magnetization of the free layer is parallel to the magnetic fixed layer. Conversely, when the electrons pass from the free layer to the magnetic fixed layer, the magnetizations are anti-parallel to each other. When a current required for inverting magnetization is defined as a critical current Ic, it is found that recording can be carried out by passing a current of Ic or more.

FIG. 23 is a graph depicting a write characteristic when the external magnetic field is applied for sample 2. That is, the figure shows a result obtained by applying a magnetic field from plus 150Oe to plus 150Oe as the external magnetic field.

From FIG. 23, it is found that a hysteresis is shifted by the external magnetic field, and a critical current Ic changes. That is, when the external magnetic field is applied to the magneto-resistive element, there occurs a case in which the critical current Ic is shifted, and recording cannot be carried out at a write current Iw which can be essentially written. Conversely, there occurs a case in which a magnetization state of the free layer changes at a reproduction current Ir which is smaller than the critical current Ic, and a signal is unnecessarily written.

Figure 24:
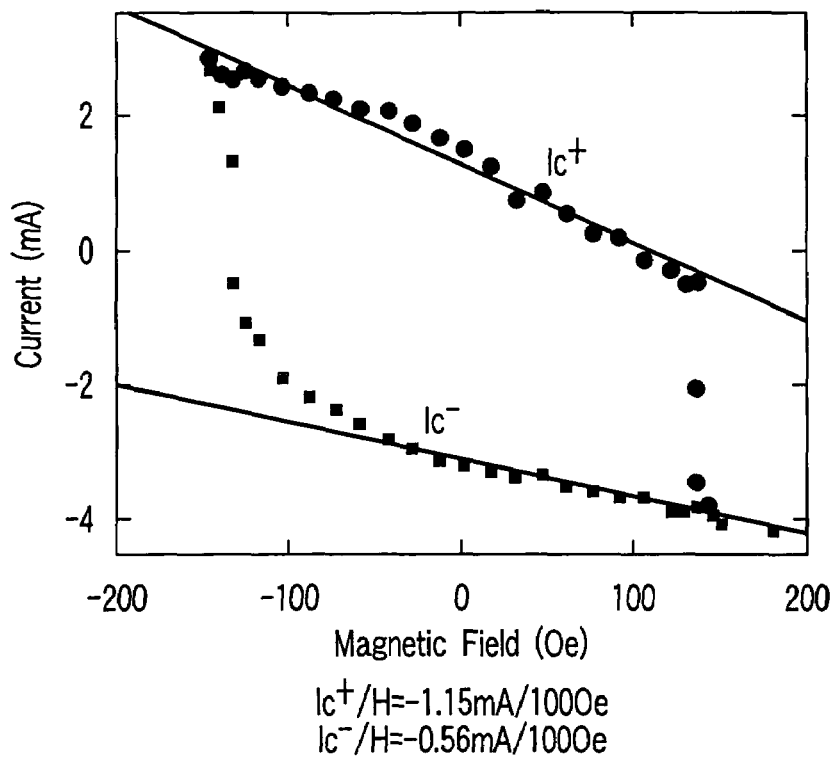
FIG. 24 is a graph depicting a change relevant to a magnetic field of a critical current.

Here, when the critical current is defined as Ic+ and Ic−, respectively, in the case where the magnetizations of the magnetic fixed layer P1 and the ferromagnetic layer (free layer) FM are allocated in parallel to each other and in the case where the magnetizations are allocated in anti-parallel to each other, a change relevant to these magnetic field occurs as shown in FIG. 24. It was found that, while a change relevant to the magnetic field of the critical current increased by the external magnetic field 100Oe, a change of minus 1.2 mA occurred in the vicinity of a zero magnetic field with respect to Ic+, and a change of about minus 0.6 mA occurred in the vicinity of a zero magnetic field with respect to Ic−.

Now, a current write characteristic of sample 1 will be described here.

Figure 25:
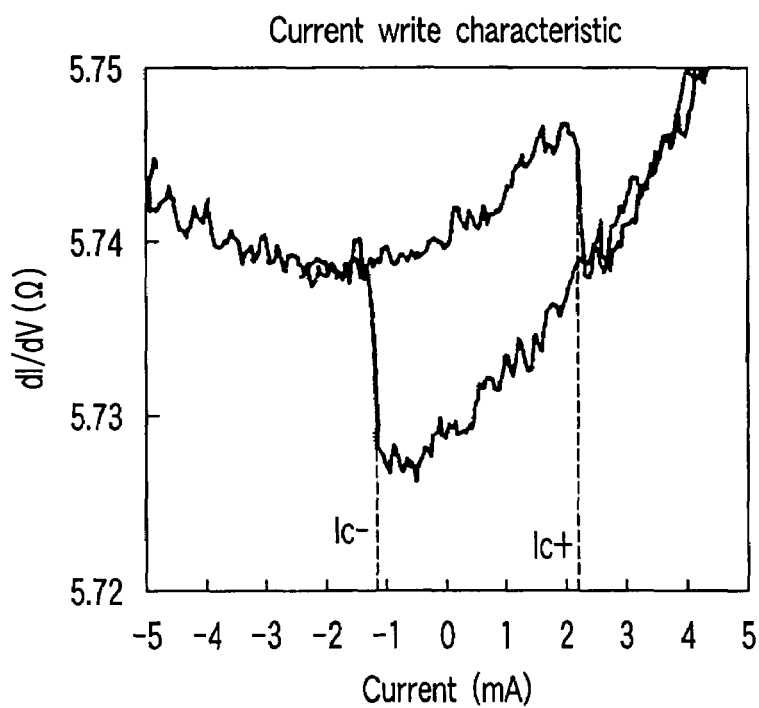
FIG. 25 is a graph depicting a write characteristic when an external magnetic field is zero relevant to sample 1.

FIG. 25 is a graph depicting a write characteristic when the external magnetic field is zero relevant to sample 1.

From the figure, it is found that a signal has been successfully written according to the current polarity as in sample 2. In addition, it is found that a resistance changes depending on whether a relative angle between the magnetization direction of the ferromagnetic layer FM2 at the magnetic fixed layer side of the recording section RE and the magnetization direction of the magnetic fixed layer P1 at the side of the recording section RE of the magnetic fixed layer is parallel or anti-parallel, and the state of the recording section RE can be detected by detecting the relative angle.

Figure 26:
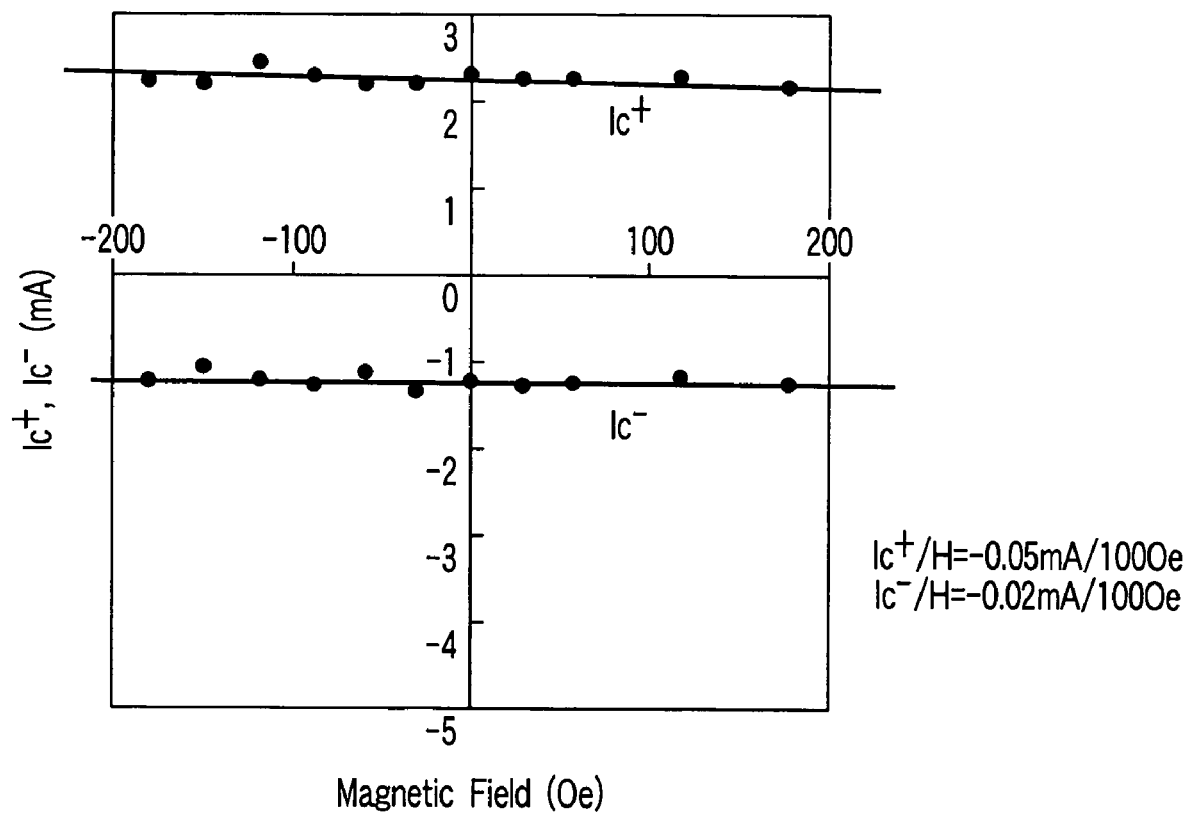
FIG. 26 is a graph depicting dependency of a critical write current on a magnetic field relevant to sample 1.

FIG. 26 is a graph depicting dependency of a critical write current on a magnetic field relevant to sample 1. That is, in the figure, the horizontal axis denotes an external magnetic field and the vertical axis denotes a critical current, respectively.

From FIG. 26, it is found that, in sample 1, a small change occurs with respect to the external magnetic field as compared with sample 2. A specific change rate is regulated to a change of minus 0.05 mA with respect to Ic+ and a change of minus 0.02 mA with respect to Ic− in comparison with an increase of the external magnetic field of 100 Oe. Namely, it is found that sample 1 is very stable with respect to the external magnetic field.

EXAMPLE 2

Now, in accordance with Example 2 of the present invention, a description will be given with respect to a result obtained by prototyping samples when magnetic fixed layers are provided on the top and bottom of the recording section.

Figure 27A:
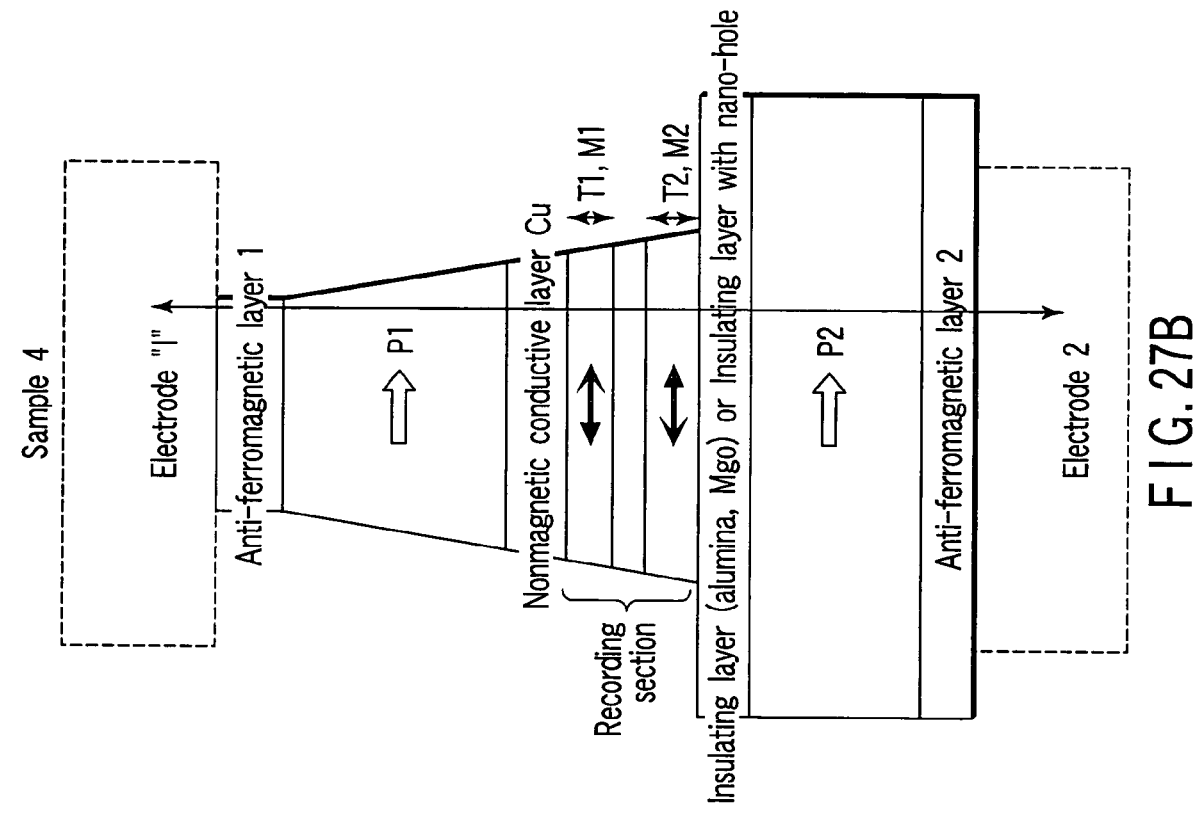
FIGS. 27A and 27B are schematic views showing a sectional structure of a magneto-resistive element prototyped by the Inventor.
Figure 27B:
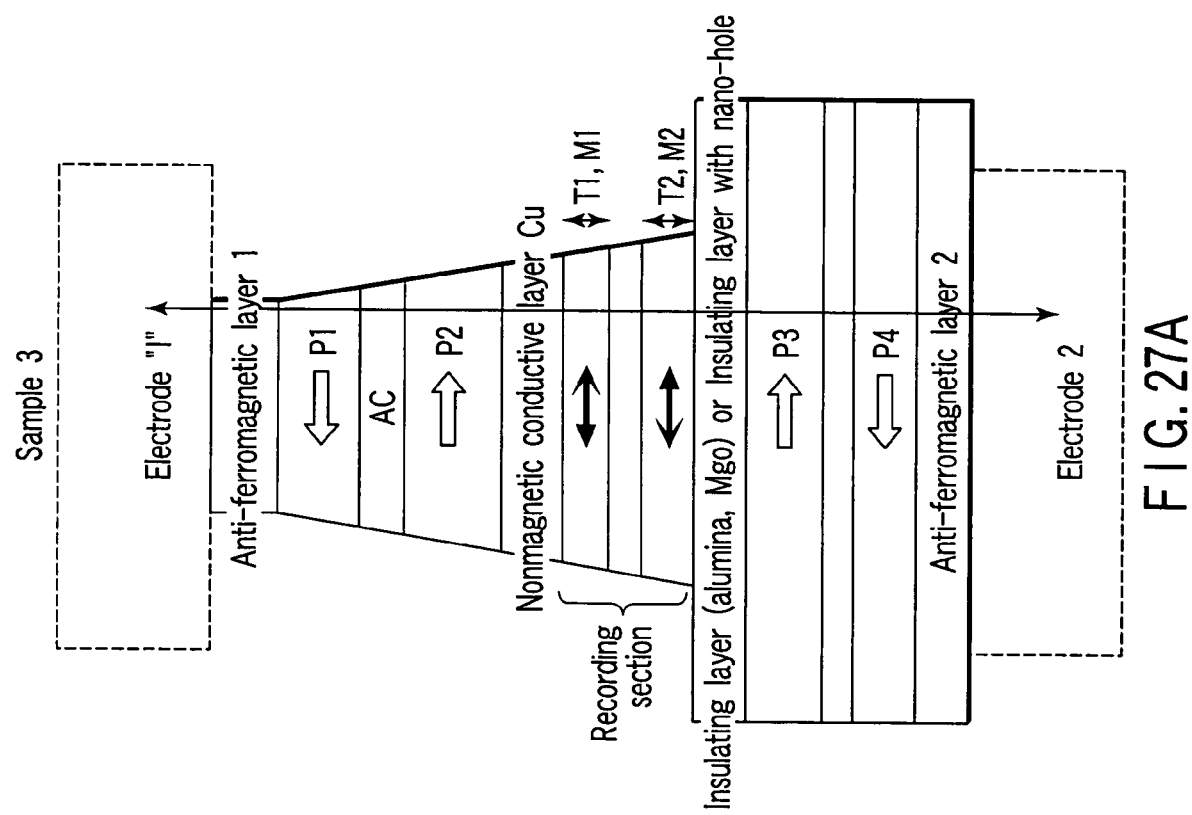

FIGS. 27A and 27B are schematic views showing a sectional structure of a magneto-resistive element prototyped by the Inventor. A structure of the produced magneto-resistive element is as follows.

(Sample 3)

Lower electrode/[PtMn 15 nm/CoFe 4 nm/Ru 1 nm/CoFe 4 nm]/$Al_2O_{3-x}$ 1 nm/[CoFe 1.2 nm/Ru 1 nm/CoFe 1.3 nm/Cu 6 nm/[CoFe 4 nm/Ru 1 nm/CoFe 5 nm/PtMn 15 nm]

(Sample 4) Lower electrode/[PtMn 20 nm/CoFe 20 nm]/$Al_2O_{3-x}$ 1 nm/[CoFe 1.2 nm/Ru 1 nm/CoFe 1.3 nm]/Cu 6 nm/[CoFe 6 nm/PtMn 15 nm]

Samples 3 and 4 correspond to elements illustrated in FIGS. 17B and 18. That is, in sample 3 and sample 4 of this Example, magnetic fixed layers are provided on the top and bottom of the recording section RE, whereby an inversion current is reduced. When the magneti-zation directions of these upper and lower magnetic fixed layers are parallel to each other, spin-polarized electrons can be acted on the two top and bottom faces of the recording section RE. In these samples 3 and 4, when an electron current is passed from the electrode EL1 to the electrode EL2, the magnetization of the upper ferromagnetic layer FM1 of the recording section RE is oriented to the right (the magnetization of the lower ferromagnetic layer FM2 is oriented to the left). By the electron current is passed in an opposite direction, the magnetizations of these ferromagnetic layers FM1 and FM2 can be inverted. As shown in FIGS. 27A and 27B, in samples 3 and 4, the maximum milling depth during element processing is defined as a surface of an alumina layer.

In sample 3 and sample 4, alumina is used as an intermediate layer S2, so that a large reproduced output can be obtained due to tunneling magneto-resistance effect (TMRR). On the other hand, a magneto-resistive effect due to magnetization allocation of the upper and lower magnetic layers via the intermediate layer S1 (the magnetic fixed layer P2 and ferromagnetic layer FM1 in sample 3 and the magnetic fixed layer P1 and ferromagnetic layer FM1 in sample 4) functions in a TMR canceling direction. However, the magneto-resistive value is small as compared with TMR, and the resistance is small by several digits, so that this effect is almost negligible. Namely, the readout due to the TMR effect via the intermediate layer S2 can be carried out.

The average values of magnetization inversion current during writing of signal 0 and signal 1 were 0.34 mA and 0.42 mA in sample 3 and sample 4, respectively. On the other hand, in a comparative structure in the case where the intermediate layer S1 and the upper magnetic fixed layer are absent, the above average values were 1.50 mA and 1.72 mA, respectively, in Comparative Example of sample 3 and in Comparative Example of sample 4. Therefore, the inversion current was obtained as a value indicating 1/n by providing fixed layers at both sides of the recording section. However, in sample 4, asymmetry of the inversion current is large because a leakage magnetic field from the top fixed layer is present.

On the other hand, the magnetic field dependencies of the respective inversion currents were measured with respect to sample 3 and sample 4. As a result, with respect to sample 3, an average shift quantity of the inversion current relevant to the magnetic field change of 100 Oe was 0.01 mA. With respect to sample 4, an average shift quantity of the inversion current relevant to the magnetic field change of 100 Oe was 0.02 mA.

From these results, it was successfully verified that the structure illustrated in FIGS. 17B and 18 was less affected by the external magnetic field, and operates stably.

Instead of $Al_2O_{3-x}$ of samples 3 and 4, in the case where MgO, $SiO_2$, Si—O—N, and a hole were formed, $SiO_2$ or $Al_2O_3$ having an electrically conducting metal (Cu, Ag, Au) embedded in its hole was used as well, it was found that the tendency similar to the above was obtained.

EXAMPLE 3

The thickness of each of the upper and lower magnetic layers configuring the recording section will be discussed in accordance with Example 3 of the present invention. An element having the structure of the invention shown in FIG. 17A in which an angle θ formed by a trapezoidal shape is 45 degrees was fabricated as sample 5. The element structure is as follows.

(Sample 5)

Lower electrode/[PtMn 15 nm/CoFe 4 nm/Ru 1 nm/CoFe 4 nm]/$Al_2O_{3-x}$ 0.7 nm/[CoFe 1.4 nm/Ru 1 nm/CoFe 1.6 nm]/upper electrode In addition, sample 4 having the following structure was fabricated as Comparative Example.

(Sample 6)

Lower electrode/[PtMn 15 nm/CoFe 4 nm/Ru 1 nm/CoFe 4 nm]/$Al_2O_{3-x}$ 0.7 nm/[CoFe 1.7 nm/Ru 1 nm/CoFe 1.3 nm]/upper electrode Sample 5 was fabricated as follows. After a lower electrode had been formed on a wafer, the wafer was introduced into a ultra-high vacuum sputtering apparatus, and a multilayer film composed of PtMn (20 nm)/CoFe 4 nm/Ru 1 nm/CoFe 4 nm/Al was laminated. Next, oxygen was introduced into the sputtering apparatus, Al was oxidized, and $Al_2O_{3-x}$ was formed. On this $Al_2O_{3-x}$, a CoFe 1.4 nm/Ru 1 nm/CoFe 1.6 nm multilayer film was laminated and taken out from the apparatus. Next, a resist was coated, electron beam exposure was carried out by an EB depicting apparatus, and then, a mask pattern corresponding to the above element size was formed. This pattern was milled up to the upper part of $Al_2O_{3-x}$ by an ion milling apparatus, and an element was formed. The element shape was set so that the longitudinal axis direction of the element is oriented to an exchange biasing direction. $SiO_2$ was embedded in the periphery of the element, the above electrode was formed, and an element was formed.

A side face angle θ of the element section was adjusted at 45 degrees in accordance with the energy and beam current quantity during ion milling.

The average inversion currents in the zero magnetic fields of the fabricated samples 5 and 6 were 2.4 mA and 2.9 mA, respectively, which were not extremely different from each other. In contrast, when the magnetic field dependencies were obtained, the average inversion current shift of sample 5 was equal to or smaller than 0.01 mA with respect to a change of the external magnetic field of 100 Oe, whereas the inversion current shift of sample 6 was 0.3 mA which appeared to be a value greater by one digit. It is found that the inversion current shift quantity of sample 6 reaches about 10% of the inversion current, and a magnetic field disturbance problem occurs. In addition, when the net magnetizations of the recording sections relevant to samples 5 and 6 (the magnetizations which are not eliminated) are obtained, the resulting magnetizations were $1.8 \times 10^{-16}$ emu with respect to sample 5 and $6 \times 10^{-15}$ emu with respect to sample 6. From these results, it is found to be desirable that a difference in absolute values between the magnetization M1 of the ferromagnetic layer FM1 and the magnetization M2 of the ferromagnetic layer FM2 is equal to or smaller than $5 \times 10^{-15}$ emu.

From these results, it was verified that the structure meeting the requirements of the present invention illustrated in FIG. 17A was less affected by the external magnetic field, and operated stably.

Instead of $Al_2O_{3-x}$ of sample 5, in the case where MgO, $SiO_2$, Si—O—N, and a hole were formed, $SiO_2$ or $Al_2O_3$ having an electrically conducting metal (Cu, Ag, Au) embedded in its hole was used as well, it was found that the tendency similar to the above was obtained.

EXAMPLE 4

Now, an angle θ of the recording section will be described in accordance with Example 4 of the present invention.

As samples 7 to 10, there were fabricated elements according to the present invention and comparative elements, each of which has the structure according to the invention shown in FIG. 18, but has a different angle θ formed by a trapezoidal shape. The basic layer structure of the element is as follows. Lower electrode/[PtMn 15 nm/CoFe 4 nm/Ru 1 nm/CoFe 4 nm/$Al_2O_{3-x}$ 0.6 nm/[CoFe 1.2 nm/Ru 1 nm/CoFe 1.5 nm]/Cu 6 nm/[CoFe 4 nm/Ru 1 nm/CoFe 5 nm/PtMn 15 nm]/Upper electrode Samples 7 to 10 were fabricated as follows.

First, after a lower electrode had been formed on a wafer, that wafer was introduced into a ultra-high vacuum sputtering apparatus, and a multilayer film composed of PtMn (15 nm)/CoFe 4 nm/Ru 1 nm/CoFe 4 nm/Al was laminated. Next, oxygen was introduced into the sputtering apparatus, AL was oxidized, and $Al_2O_{3-x}$ was formed. On this $Al_2O_{3-x}$, a multilayer film/[CoFe 1.2 nm/Ru 1 nm/CoFe 1.5 nm]/Cu 6 nm/[CoFe 4 nm/Ru 1 nm/CoFe 5 nm/PtMn 15 nm] was further laminated and taken out from the apparatus. Next, a resist was coated, electron beam exposure was carried out by an EB depicting apparatus, and then, a mask pattern corresponding to the above element size was formed. This pattern was milled up to the upper part of the PtMn layer by an ion milling apparatus, and an element was formed. The shape of the element was set so that the longitudinal axis direction of the element is oriented in an exchange bias direction. $SiO_2$ was embedded in the periphery of the element, the upper electrode was formed, and an element was formed.

A side face angle θ of the element section was adjusted at 25 degrees, 35 degrees, 80 degrees, or 90 degrees in accordance with the energy and beam current quantity during ion milling. These angles were verified through observation of the sectional plane of the element using a transmission electron microscope.

The fabricated samples 7 and 10 were repeatedly tested with respect to magnetization inversion of current drive. The obtained results are as follows.

(Sample 7)

No magnetization inversion was observed when a current was charged at the side face angle θ of 25 degrees and at a maximum of plus and minus 15 mA.

(Sample 8)

A magnetization inversion was observed at an average current density of $1.2 \times 10^{-7}$ A/cm² as a result of a repetition test at the side face angle θ of 35 degrees.

(Sample 9)

A magnetization inversion was observed at an average current density of $7.0 \times 10^{-6}$ A/cm² as a result of a repetition test at the side face angle θ of 80 degrees.

(Sample 10)

Although magnetization inversions were observed at the first three cycles at the side face angle θ of 90 degrees and at an average current density of $7.4 \times 10^{-6}$ A/cm², no inversion was observed at the fourth cycle and subsequent.

From the foregoing, when the side face angle θ is equal to or smaller than 30 degrees, no writing is enabled because of a current path problem in the case where a current is passed. On the other hand, when the side face angle θ is equal to or greater than 85 degrees, a thermal relief is not sufficient. Thus, it is found that a problem with element destruction due to a heat is likely to occur. From these results, it was found that good element characteristics were obtained, and that the side face angle was preferably in the range of 30 degrees to 85 degrees in order to provide a structure having excellent stability.

EXAMPLE 5

Now, in accordance with Example 5 of the present invention, a description will be given with respect to a magnetic memory (magnetic random access memory: MRAM) having incorporated therein the magneto-resistive element according to the invention and a metal semiconductor-oxide field effect transistor (MOSFET).

FIGS. 28A, 28B, 28C and 28D are schematic views showing a sectional structure of a memory cell of a magnetic memory according to this Example.

Figure 29:
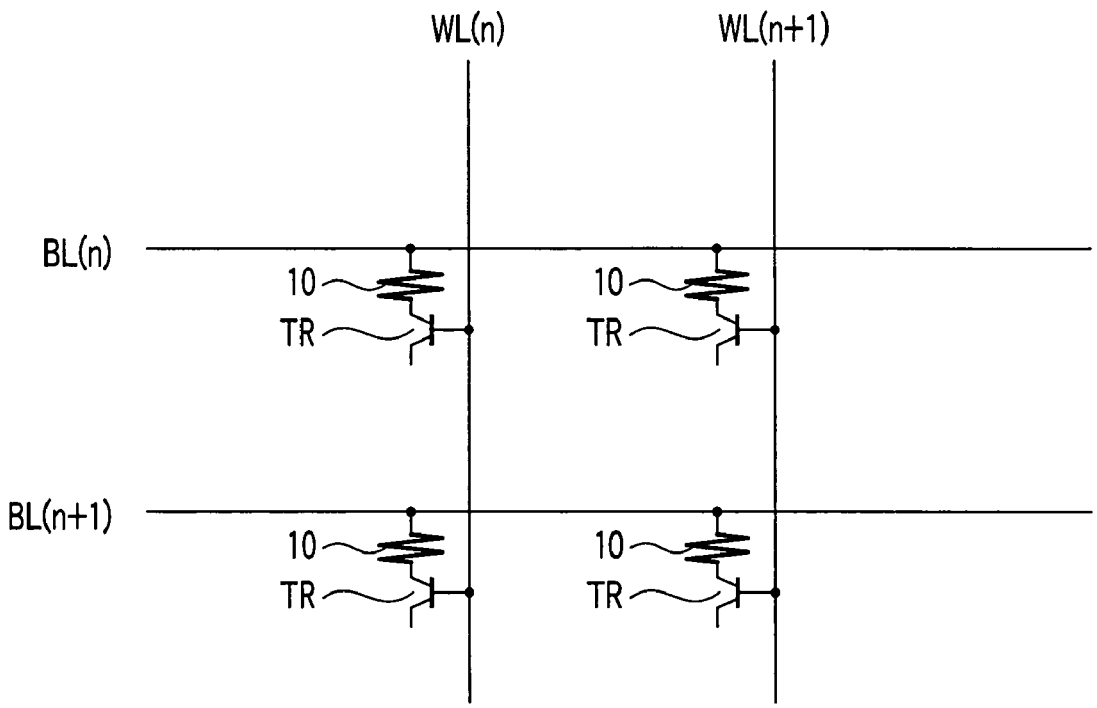
FIG. 29 is a schematic view showing an equivalent circuit of the magnetic memory according to Example of the invention.

FIG. 29 is a schematic view showing an equivalent circuit of the magnetic memory.

That is, the memory cells each have a magneto-resistive element 10 of the invention and MOSFET (TR). The memory cells are provided in a matrix shape, each of which is connected to a bit line BL and a word line WL. A specific memory cell is selected by selecting the bit line BL connected to the memory cells and the word line WL connected to a gate G of MOSFET (TR).

Figure 28A:
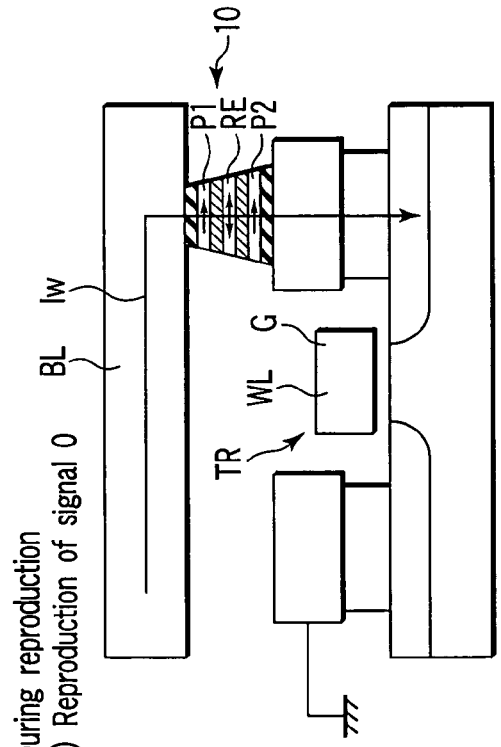
FIGS. 28A, 28B, 28C and 28D are schematic views showing a sectional structure of a memory cell of a magnetic memory according to Example of the invention.
Figure 28C:
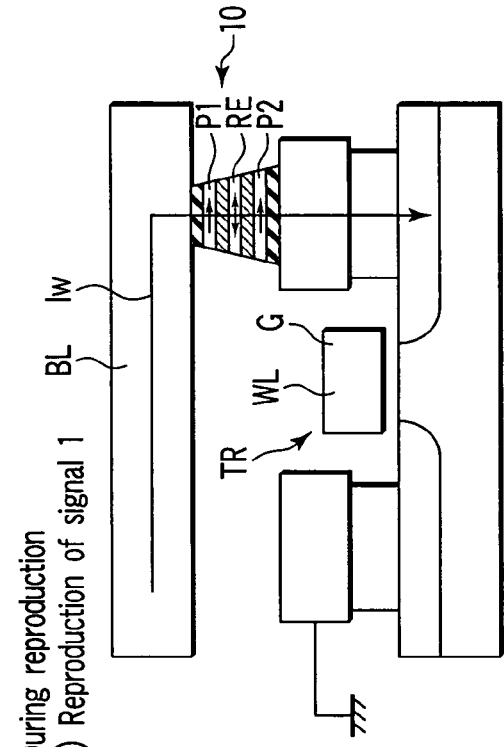
Figure 28B:
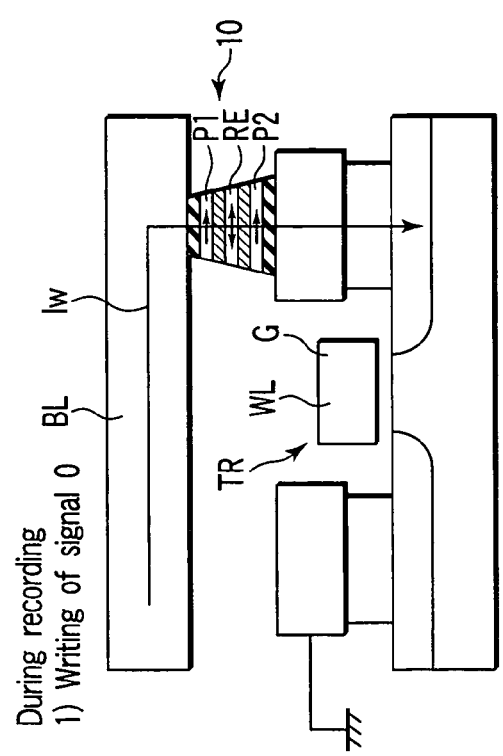

FIGS. 28A and 28B are conceptual views illustrating a write operation. That is, writing into the magneto-resistive element 10 is carried out by passing a current to the magneto-resistive element 10 through the bit line BL. A signal is written into a magnetic free layer A by passing a write current Iw which is greater than the magnetization inversion current Ic. The direction of the write current Iw in FIGS. 28A, 28B, 28C and 28D are opposite to that of an electron current.

In the case where the magneto-resistive element 10 is made of normal type MR, the magnetization of the ferromagnetic layer at the current inflow side of the recording section RE is written in the same direction as the direction of the magnetization of a magnetic fixed layer where an electron first passes. Therefore, the direction of magnetization of the magnetic free layer RE changes according to the polarity of the write current Iw. "0" can be written as shown in FIG. 28A, and "1" can be written as shown in FIG. 28B. The assignment of "0" and "1" may be reversed.

Figure 28D:
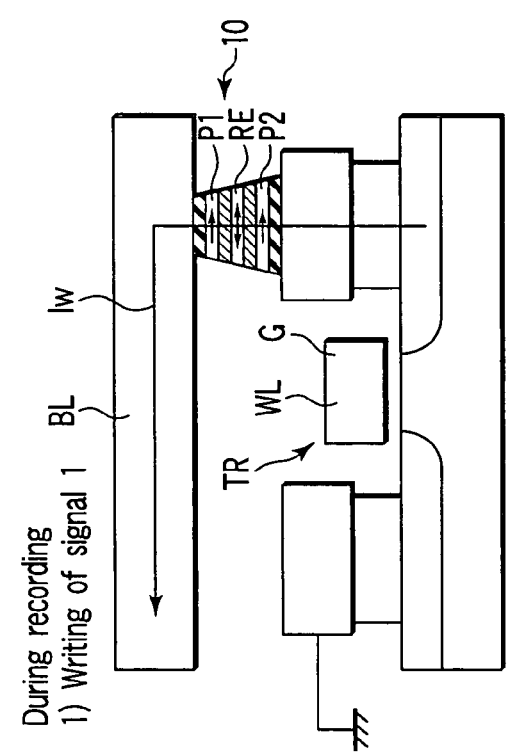

FIGS. 28C and 28D are conceptual views illustrating a readout operation. Readout is detected in scale of the resistance of the magneto-resistive element 10. Although a sense current Ir is oriented in any direction, it is necessary to reduce the sense current Ir more significantly than the critical current Ic of magnetization inversion. In the case where an intermediate layer S2 having high resistance is provided in the magneto-resistive element 10, the magneto-resistive effect via the intermediate layer S2 can be detected.

In FIGS. 28A, 28B, 28C and 28D, in the case where signal "0" is written, the resistance increases, and in the case where signal "1" is written, the resistance decreases. By detecting the signal (or by directly reading a resistance, by reading a voltage, or by reading a current), the magnetization state of the recording section RE is determined, and a signal is reproduced. In consideration of the coincidence with transistor TR, it is desirable to use a material having high insulation property such as alumina or MgO as the material for the intermediate layer S2 having high resistance. As described previously with respect to FIGS. 13A and 13B, CCP-CPP-MR or nano-contact MR having a hole formed in an insulating layer and having Cu or a magnetic body embedded therein is also suitable because it can regulate a resistance.

In FIGS. 28A, 28B, 28C and 28D, although signal "0" has been assigned when a reproduction signal has a low resistance, and signal "1" has been assigned when the signal has a high resistance, of course, this assignment may be reversed.

The method for selecting a magneto-resistive element in the magnetic memory according to the invention is not limited to selecting MOSFET.

Figure 30:
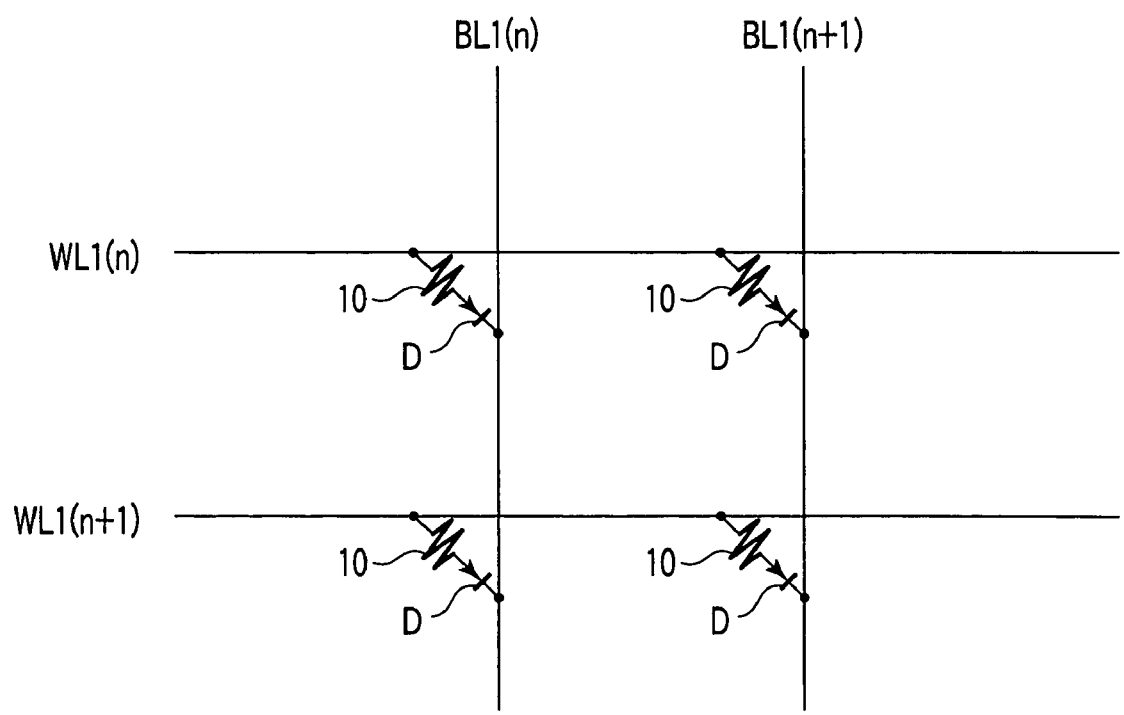
FIG. 30 is a schematic view showing a magnetic memory using a diode.

FIG. 30 is a schematic view showing a magnetic memory using a diode. That is, the magneto-resistive element 10 according to the invention and diode D are connected in series in the vicinity of a cross point between the bit line BL and word line WL wired in a vertical and horizontal matrix shape.

In the case of the magnetic memory, an access can be provided to a specific memory cell by specifying the word line WL and the bit line BL. In this case, the diode D serves to interrupt a current component which passes through another memory cell connected to the selected word line WL and bit line BL.

EXAMPLE 6

Now, in accordance with Example 6 of the present invention, a description will be given with respect to a specific example in which the magneto-resistive element according to the invention is applied to a cross point type magnetic memory.

Figure 31:
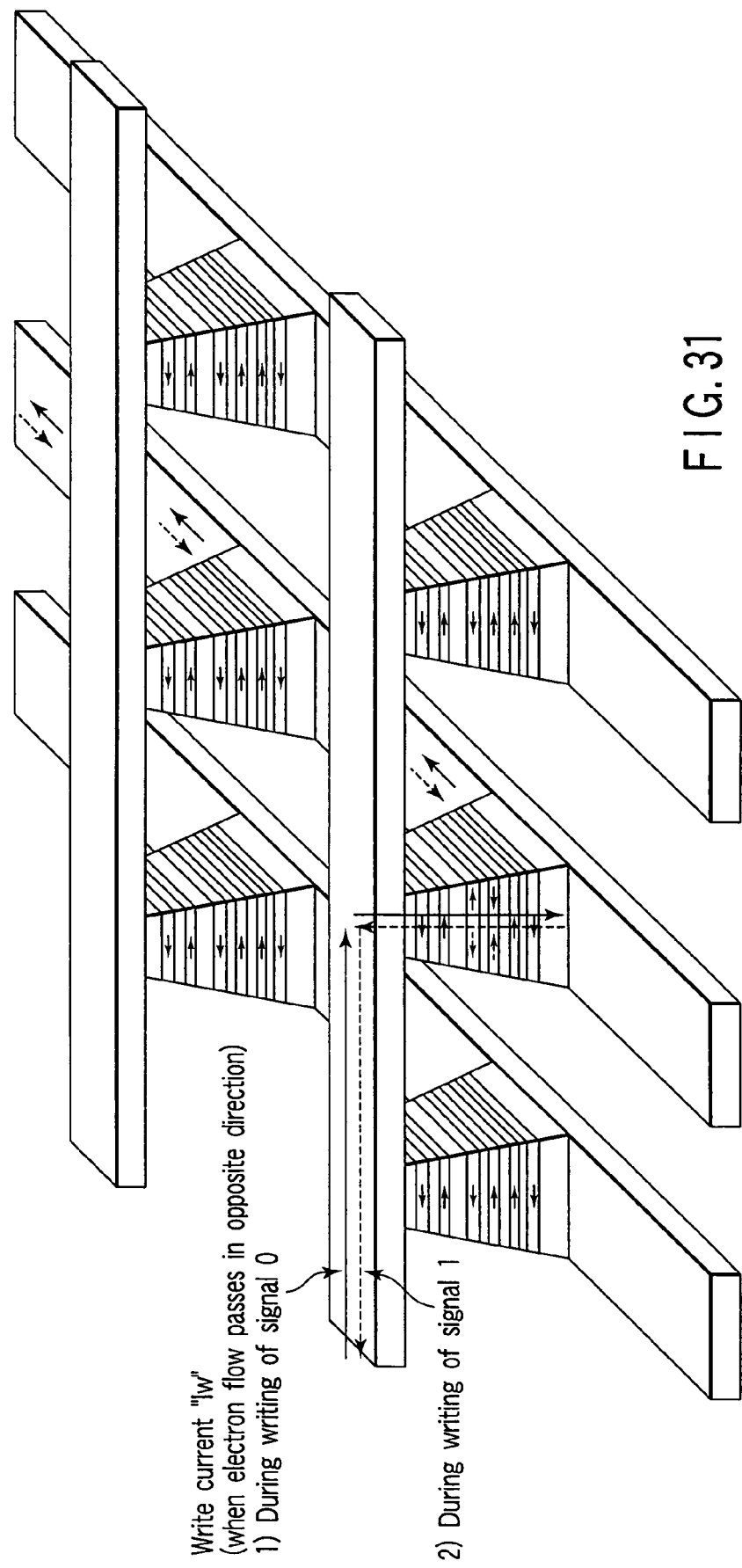
FIG. 31 is a schematic perspective view illustrating a structure of the magnetic memory according to Example of the invention.

FIG. 31 is a schematic perspective view illustrating a structure of a magnetic memory according to this Example.

That is, a word line WL and a bit line BL are allocated in a matrix shape, and a magneto-resistive element 10 is provided at a cross point between these lines, respectively. Here, a magnetic memory using sample 3 according to Example 2 is shown.

By selecting the word line WL and the bit line BL, respectively, a write current Iw is passed to a specific magneto-resistive element 10, so that signal "0" or "1" can be assigned according to its polarity. In reproduction, a reproduction current Ir is passed to a target magneto-resistive element 10, and its magneto-resistive effect is detected. A cross point type magnetic memory can be deemed to have a structure in which highly integrated memory can be achieved in the easiest way.

EXAMPLE 7

Now, a description will be given with respect to a probe storage type magnetic memory using the magneto-resistive element according to the invention.

Figure 32:
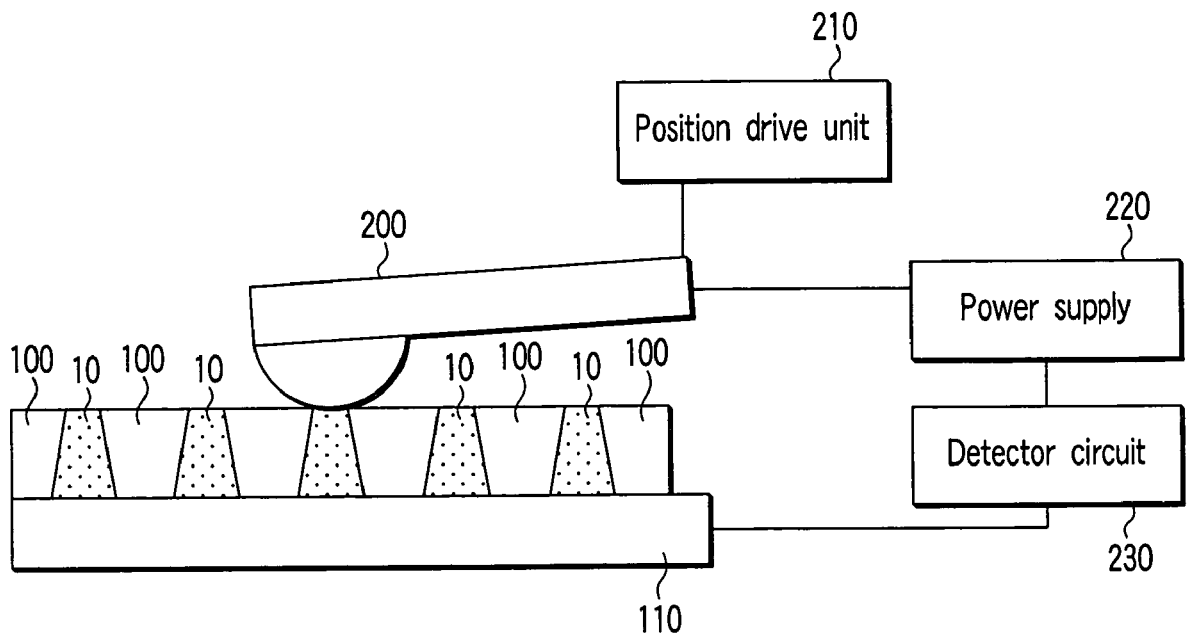
FIG. 32 is a schematic view showing the magnetic memory according to Example of the invention.

FIG. 32 is a schematic view showing a magnetic memory according to this Example. That is, in this specific example, there is shown a probe storage type magnetic memory for applying the magneto-resistive element according to the invention to a so-called "patterned medium" and provide an access to the thus patterned medium by using a probe.

The recording medium, on an electrically conducting substrate 110, has a structure in which the magneto-resistive elements 10 according to the invention are allocated in a matrix manner in a plane of an insulator 100 having high resistance. For the purpose of selection of these magneto-resistive elements, a probe 200 is provided on a medium surface. In addition, there are provided: a driving mechanism 210 for controlling a relative position relationship between the probe 200 and the medium surface; a power supply 220 for applying a current or a voltage from the probe 200 to the magneto-resistive elements 10; and a detector circuit 230 for detecting an internal magnetization state of the magneto-resistive elements as a change of electrical resistance.

In the specific example shown in FIG. 32, although the driving mechanism 210 is connected to the probe 200, this drive mechanism may be provided at the medium side because a relative position between the medium and the probe may be changed. As shown in the figure, a plurality of the magneto-resistive elements 10 according to the invention are arranged on the electrically conducting substrate 110 to form a patterned medium, and a current is passed between the electrically conducting probe 200 and the substrate 110 via the magneto-resistive elements 10, thereby carrying out recording and reproducing operation.

Figure 33:
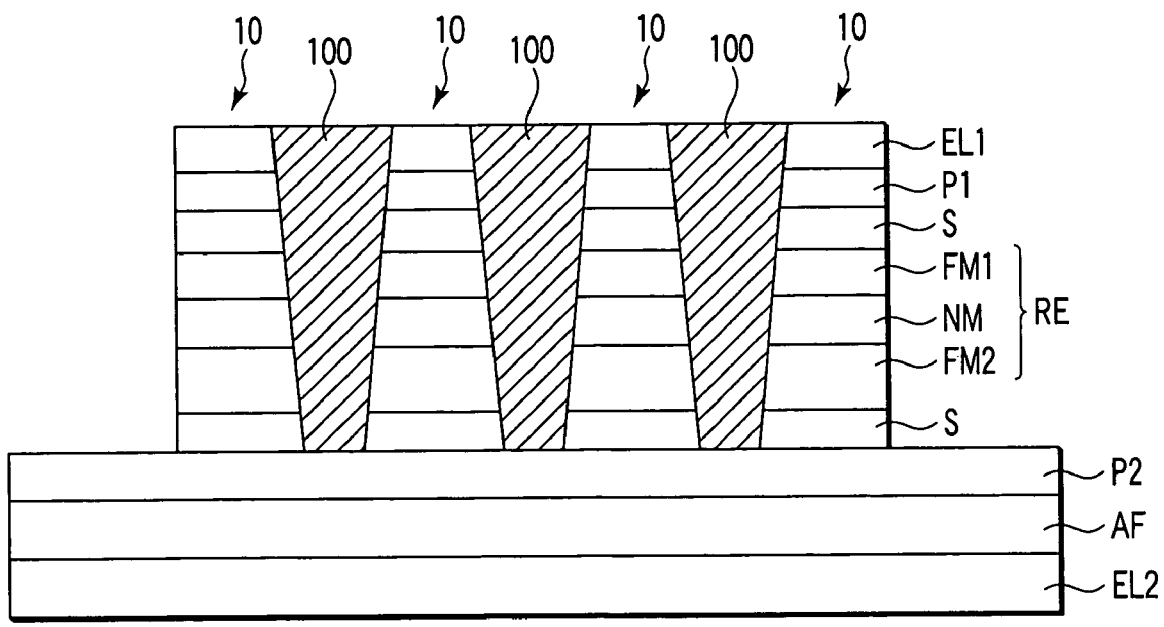
FIG. 33 is a magnetic sectional view showing a structure in which cells 10 share its own partial layer.

In the specific example shown in FIG. 32, although cells 10 each share only the lower electrode on the substrate 110, such each cell 10 may be structured to share its own partial layer as shown in FIG. 33. With such a structure, it is possible to facilitate a process and homogenize characteristics.

Selection of the magneto-resistive elements 10 is made by changing a relative position relationship between the electrically conducting probe 200 and the patterned medium. The electrically conducting probe 200 may be electrically connected to the magneto-resistive elements 10 in contact with or in non-contact with these elements. In the case of non-contact, recording and reproducing operation can be carried out by using a current caused by a tunnel current or electric field emission passing between each of the magneto-resistive elements 10 and the probe 200.

Recording into the magneto-resistive elements 10 is carried out by a current passing to the magneto-resistive element 10 from the probe 200 accessed to the magneto-resistive elements or by a current passing to the probe 200 from the magneto-resistive element 10. When a magnetization inversion current Is is determined by the size, structure, constitution and the like of the magneto-resistive elements 10, recording can be carried out by passing to the cells the write current "Iw" which is greater than the current Is. In the case where an electron current is defined as a reference, the direction of magnetization to be recorded is identical to that of a magnetic fixed layer through which the current first passes. Therefore, the writing of "0" or "1" can be carried out as required by inverting the flow of electrons, i.e., the current polarity.

Reproduction is achieved by a current passing from the probe 200 accessed to the magneto-resistive elements 10 in the same manner as recording or by a current passing to the probe. However, during reproduction, a smaller reproduction current "Ir" than the magnetization inversion current "Is" is passed. Then, the recording state of the magnetic free layer A is determined by detecting a voltage or a resistance. Therefore, in the magnetic memory according to this specific example, a current having a relationship of Iw>Ir is passed, thereby enabling recording and reproducing operation.

Figure 34:
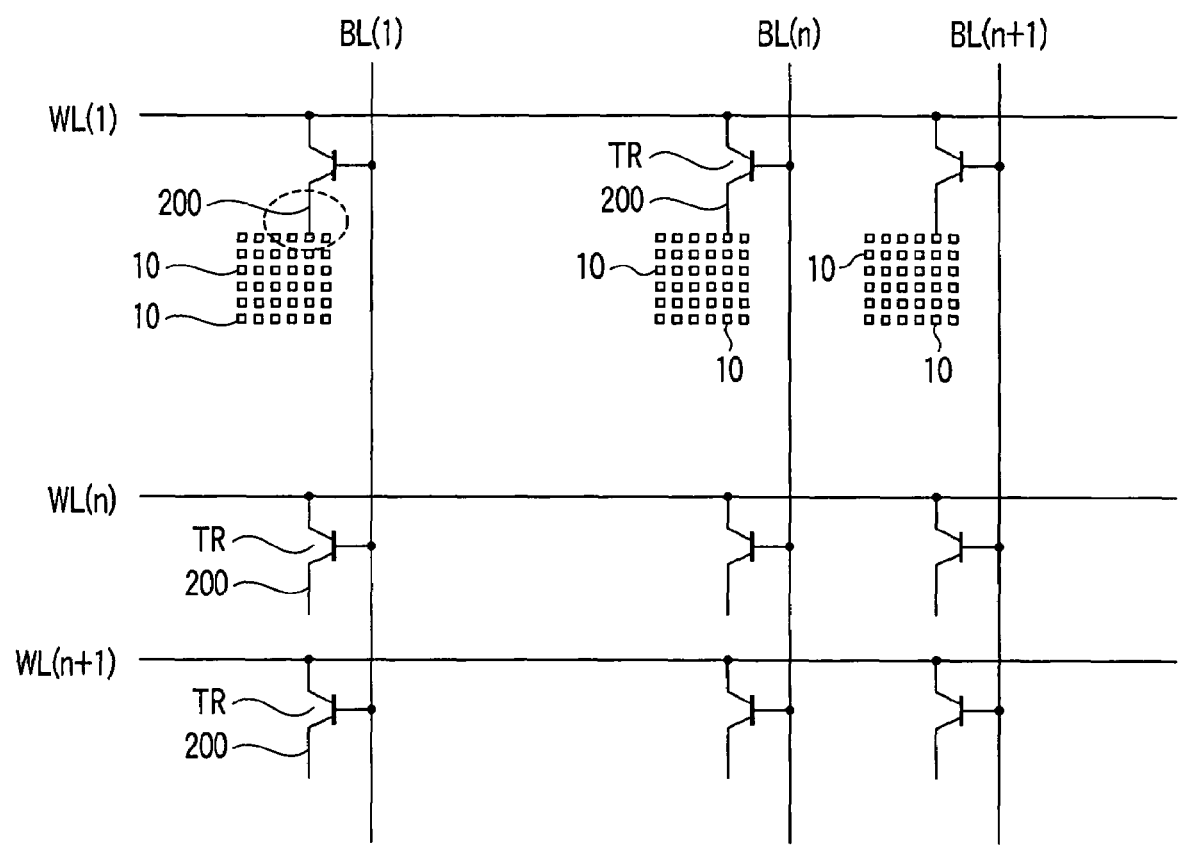
FIG. 34 is a schematic view showing an array structure of probes when the probes are produced in multiple.

FIG. 34 is a schematic view showing an array structured of probes when the probes are produced in multiple. In the figure, the magneto-resistive elements according to the invention are arranged on the substrate, and a 32×32 matrix is formed. This matrix is arranged in 32×32 pieces, and a total of 1M (mage) bit recording and reproducing medium is formed. For this recording and reproducing medium, recording and reproducing operation is carried out by using 32×32 probes. That is, one probe corresponds to one set of matrixes. Probing is carried out as described previously with respect to FIG. 32. Cell selection relevant to a respective probe can be made by an XY driving mechanism provided at the medium. However, if a positional relationship relatively changes, cell selection may be made by the driving mechanism provided at the medium. In addition, the probes themselves are produced in multiple; a nuclear probe is connected to the so-called word line and bit line; and the word line and the bit line are specified, thereby enabling probe selection.

The recording and reproducing operation relevant to the magneto-resistive elements is carried out by a current charged from a probe accessed to the magneto-resistive elements. Signal "0" or "1" is written by passing a plus or minus current "Iw"; and a resistance is measured by passing a current "Ir" for reproduction, whereby its relationship in size may be assigned to "0" and "1".

EXAMPLE 8

In accordance with Example 8 of the present invention, magneto-resistive elements having 15 types of layer structures from numbers 1 to 15 in which a trapezoidal side face angle $\theta$ is in the range of 30 degrees to 80 degrees was fabricated, and external magnet filed dependency of an average inversion current and an inversion current was obtained. These elements are fabricated in accordance with EB lithography and ion milling or in accordance with EB lithography and reactive ion etching. In addition, a current was applied as a pulse current having 2 nano-seconds in pulse width; the presence or absence of inversion was checked by changing a pulse current value; and an inversion current was obtained. The results of the characteristics were summarized in tables below. From these results, it is found that the magneto-resistive elements according to the invention are stable with respect to the external magnetic field.

TABLE 1

| Number | Layer structure between lower electrode and upper electrode (to be described from lower layer to upper layer) | Size of upper part of element | Milling position | Average inversion current (mA) | Inversion current shift quantity (mA) per external magneticfield of 100 Oe |
|---|---|---|---|---|---|
| 1 | PtMn(20 nm)/Co$_9$Fe$_1$(20 nm)/Al$_2$O$_{3-x}$(0.7 nm)/Co$_9$Fe$_1$(1.2 nm)/Ru(0.9 nm)/Co$_9$Fe$_1$(1.4 nm) | 60 nm × 110 nm | Surface of alumina layer | 2.0 | 0.006 |
| 2 | PtMn(20 nm)/Co$_9$Fe$_1$(20 nm)/Al$_2$O$_{3-x}$(0.7 nm)/Co$_9$Fe$_1$(1.2 nm)/Ru(0.9 nm)/Co$_9$Fe$_1$(1.3 nm) | 120 nm × 200 nm | Surface of alumina layer | 6.8 | 0.007 |
| 3 | PtMn(20 nm)/Co$_9$Fe$_1$(20 nm)/Cu (6 nm)/Co$_9$Fe$_1$1.2 nm)/Ru(0.9 nm)/Co$_9$Fe$_1$(1.4 nm) | 60 nm × 110 nm | Surface of magnetic fixed layer | 1.9 | 0.005 |
| 4 | PtIrMn(17 nm)/Co$_9$Fe$_1$(10 nm)/MgO(0.7 nm)/CoPt(1.2 nm)/Ru(0.9 nm)/CoPt(1.3 nm) | 120 nm × 200 nm | Up to lower part of PtIrMn | 1.1 | 0.01 |
| 5 | PtMn(20 nm)/Co$_9$Fe$_1$(20 nm)/Cu(6 nm)/Co$_9$Fe$_1$(1.5 nm)/Ru(0.9 nm)/Co$_9$Fe$_1$(1.7 nm) | 60 nm × 110 nm | Up to lower part of PtMn | 2.1 | 0.008 |
| 6 | PtMn(15 nm)/Co$_9$Fe$_1$(4 nm)/Ru(1 nm)/Co$_9$Fe$_1$(4 nm)/MgO(1 nm)/Co$_9$Fe$_1$(0.6 nm)/NiFe(0.6 nm)/Ru(0.9 nm)/NiFe(0.7)/Co$_9$Fe$_1$(0.7 nm) | 60 nm × 110 nm | Up to lower part of PtMn | 1.9 | 0.01 |
| 7 | PtMn(15 nm)/Co$_9$Fe$_1$(4 nm)/Ru(1 nm)/Co$_9$Fe$_1$(4.5 nm)/Cu(4 nm)/Co$_9$Fe$_1$(0.6 nm)/NiFe(0.6)/Ru(0.9 nm)/NiFe(0.7)/Co$_9$Fe$_1$ (0.7 nm) | 60 nm × 110 nm | Up to lower part of PtMn | 1.6 | 0.01 |
| 8 | Co$_9$Fe$_1$(1.4 nm)/Ru(0.9 nm)/Co$_9$Fe$_1$(1.6 nm)/Al$_2$O$_{3-x}$(0.8 nm)/Co$_9$Fe$_1$(4 nm)/Ru(1 nm)/Co$_9$Fe$_1$(5.6 nm)/PtMn(12 nm) | 70 nm × 100 nm | Up to lower part of free layer | 2.8 | 0.02 |
| 9 | Co$_9$Fe$_1$(1.4 nm)/Ru(0.9 nm)/Co$_9$Fe$_1$(1.6 nm)/Cu(6 nm)/Co$_9$Fe$_1$(4 nm)/Ru(1 nm)/Co$_9$Fe$_1$(5.6 nm)/PtMn(12 nm) | 70 nm × 100 nm | Up to lower part of free layer | 2.4 | 0.01 |

TABLE 2

| Number | Layer structure between lower electrode and upper electrode (to be described from lower layer to upper layer) | Size of upper part of element | Milling position | Average inversion current (mA) | Inversion current shift quantity (mA) per external magnetic field of 100 Oe |
|---|---|---|---|---|---|
| 10 | PtMn(20 nm)/Co9Fe1(20 nm)/Si—O—N (1 nm)/Co9Fe1(0.6 nm)/NiFe(0.6 nm)/Ru(1 nm)/NiFe(0.7 nm)/Co9Fe1 (0.7 nm)/Cu(6 nm)/Co9Fe1(4 nm)/PtMn(12 nm) | 70 nm × 100 nm | Up to surface of lower magnetic fixed layer | 0.67 | 0.02 |

TABLE 2-continued

| Number | Layer structure between lower electrode and upper electrode (to be described from lower layer to upper layer) | Size of upper part of element | Milling position | Average inversion current (mA) | Inversion current shift quantity (mA) per external magnetic field of 100 Oe |
|---|---|---|---|---|---|
| 11 | PtMn(15 nm)/Co9Fe1(20 nm)/SiO2 with holes(5 nm)/Co9Fe1(1.4 nm)/Ir(1 nm)/Co9Fe1(1.6 nm)/Cu(8 nm)/Co9Fe1(4 nm)/Ru(1 nm)/Co9Fe1 (5.6 nm)/PtMn(15 nm) | 60 nm × 150 nm | Up to surface of lower PtMn layer | 0.58 | 0.01 |
| 12 | IrMn(19 nm)/Co8Fe2(4 nm)/Ru(1 nm)/Co8Fe2(5 nm)/Al2O3-x(1 nm)/NiFeCo (1.2 nm)/Ru(1 nm)/NiFeCo(1.3 nm)/Cu(6 nm)/Co8Fe2(4 nm)/Ru(1 nm)/Co8Fe2(5 nm)/IrMn(19 nm) | 60 nm × 120 nm | Up to alumina surface | 0.62 | 0.006 |
| 13 | PtMn(20 nm)/Co8Fe2(4 nm)/Ru(1 nm)/Co8Fe2(5 nm)/Cu(6 nm)/Co9Fe1 (1.2 nm)/Ru(1 nm)/Co9Fe1(1.3 nm)/Al2O3 with holes atacked with Cu(3 nm)/Co9Fe1(4 nm)/Ru(1 nm)/Co9Fe1(5 nm)/PtMn(15 nm) | 60 nm × 120 nm | Up to bottom of lower PtMn | 0.57 | 0.009 |
| 14 | PtMn(20 nm)/Co8Fe2(4 nm)/Ru(1 nm)/Co8Fe2(5 nm)/Cu(6 nm)/FePt(1.2 nm)/Ru(1 nm)/FePt(1.3 nm)/Al2O3-x (1 nm)/Co9Fe1(4 nm)/Ru(1 nm)/Co9Fe1 (5 nm)/PtMn(15 nm) | 60 nm × 120 nm | Up to bottom of lower PtMn | 0.29 | 0.01 |
| 15 | PtMn(20 nm)/Co8Fe2(4 nm)/Ru(1 nm)/Co8Fe2(5 nm)/Al2O3(0.6 nm)/Co9Fe1 (0.6 nm)/Ru(0.9 nm)/Co9Fe1(0.7 nm)/Ru(0.9 nm)/Co9Fe1(0.9 nm)/Ru (0.9 nm)/Co9Fe1(1.0 nm)/Cu(6 nm)/Co9Fe1(4 nm)/Ru(1 nm)/Co9Fe1(5 nm)/PtMn(15 nm) | 70 nm × 100 nm | Up to bottom of lower PtMn | 0.70 | 0.02 |

The embodiments of the present invention have been described above with reference to the specific examples. However, the invention is not limited to these specific examples. For example, specific dimensional relationships or materials of constituent elements configuring magneto-resistive elements or the shapes of or materials for electrodes, passivation, or insulating structures are encompassed in the scope of the invention as long as one skilled in the art carries out the invention similarly by properly selecting them from a publicly known scope, and similar advantageous effect can be attained.

In FIGS. 1A and 1B or the like, although the dimensions in the film face direction of the magnetic fixed layers P (P1 to P4), and the ferromagnetic layers FM1 and FM2 have been shown to be identical to each other, the invention is not limited thereto. That is, the dimensions of layers of the magneto-resistive elements may be formed to be different from each other for the purpose of wiring connection or for the purpose of control in magnetization direction. In addition, the shapes of these layers may be different from each other.

In addition, the constituent elements such as the anti-ferromagnetic layer, the magnetic fixed layer, the intermediate layer, the ferromagnetic layer, and the nonmagnetic layer in the magneto-resistive elements may be formed as independent single layers, respectively, or may be structured so that two or more layers are laminated.

All the magneto-resistive elements and magnetic memories which one skilled in the art can carry out by making a proper design change based on the above-described magneto-resistive elements and magnetic memories of the embodiments of the invention, belong to the scope of the invention without deviating from the spirit of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magneto-resistive element comprising:
a fixed layer in which a magnetization direction is fixed;
a free layer in which the magnetization direction is changed by spin-polarized electrons, the free layer having ferromagnetic layers separated by a non-magnetic layer, wherein, from among the ferromagnetic layers, the two adjacent ferromagnetic layers having the non-magnetic layer interposed therebetween are coupled with each other in an anti-ferromagnetic manner; from among the ferromagnetic layers, a difference between an absolute value of a total of magnetizations of the ferromagnetic layers in which the magnetization direction is a first direction and an absolute value of a total of magnetizations of the ferromagnetic layers in which the magnetization direction is a second direction which is opposite to the first direction is equal to or smaller than $5 \times 10^{-15}$ emu and is larger than zero; and an area of a plane parallel to a substrate of one ferromagnetic layer or a side which is opposite to the substrate side, which is selected from the two adjacent ferromagnetic layers, is smaller than an area of a plane parallel to the subsrate of the other ferromagnetic layer of the substrate side which is selected from the two adjacent ferromagnetic layers; and
an intermediate layer between the fixed layer and the free layer.

2. The magneto-resistive element according to claim 1, wherein the magnetization of each of the ferromagnetic layers is determined by a product between a magnetization per unit volume and a volume of the layer.

3. The magneto-resistive element according to claim 1, wherein, from among the ferromagnetic layers, a thickness of a ferromagnetic layer which is the most distant from the substrate is greater than a thickness of a ferromagnetic layer which is the most proximal to the substrate.

4. The magneto-resistive element according to claim 1, wherein a sectional plane in a direction vertical to the substrate of the free layer is formed in a trapezoidal shape.

5. The magneto-resistive element according to claim 4, wherein a side face of the free layer has an angle of 30° or more and 85° or less with respect to the substrate.

6. The magneto-resistive element according to claim 1, wherein a magnetic yoke is allocated via an insulating layer on a side face of the free layer.

7. The magneto-resistive element according to claim 1, wherein a magneto-resistive effect produced by the fixed layer, the free layer, and the intermediate layer is one of a normal type and a reverse type.

8. The magneto-resistive element according to claim 1, wherein the intermediate layer has an insulator, a semiconductor, an electrical conductor and a pin hole, and is composed of one of the insulators filled with the electrical conductor including a magnetic body in the pin hole.

9. The magneto-resistive element according to claim 1, wherein the fixed layer has ferromagnetic layers separated by a non-magnetic layer, and the two adjacent ferromagnetic layers having the nonmagnetic layer interposed therebetween are coupled with each other in an anti-ferromagnetic manner.

10. The magneto-resistive element according to claim 1:
    wherein the fixed layer is comprised of first and second fixed layers
    the free layer is allocated between the first and second fixed layers,
    a first intermediate layer is provided between the first fixed layer and the free layer, and
    a second intermediate layer is provided between the second fixed layer and the free layer.

11. The magneto-resistive element according to claim 10, wherein the magnetization of each of the ferromagnetic layers is determined by a product between a magnetization per unit volume and a volume of the layer.

12. The magneto-resistive element according to claim 11, wherein, from among the ferromagnetic layers, a thickness of a ferromagnetic layer which is the most distant from the substrate is greater than a thickness of a ferromagnetic layer which is the most proximal to the substrate.

13. The magneto-resistive element according to claim 10, wherein a sectional plane in a direction vertical to the substrate of the free layer is formed in a trapezoidal shape.

14. The magneto-resistive element according to claim 13, wherein a side face of the free layer has an angle of 30° or more and 85° or less with respect to the substrate.

15. The magneto-resistive element according to claim 10, wherein a magnetic yoke is allocated via an insulating layer on the side face of the free layer.

16. The magneto-resistive element according to claim 10, wherein a magneto-resistive effect produced by the first and second fixed layers, the free layer, and the first and second intermediate layers is one of a normal type and a reverse type.

17. The magneto-resistive element according to claim 10, wherein, in the case where magnetization states of the first and second fixed layers are identical to each other, the first and second intermediate layers are composed of different materials.

18. The magneto-resistive element according to claim 10, wherein, in the case where magnetization states of the first and second fixed layers are different from each other, the first and second intermediate layers are composed of an identical material.

19. The magneto-resistive element according to claim 10, wherein the first and second intermediate layers each have an insulator, a semiconductor, an electrical conductor, and a pin hole, and are composed of one of the insulators filled with the electrical conductor including a magnetic body in the pin hole.

20. The magneto-resistive element according to claim 10, wherein the fixed layer has ferromagnetic layers separated by a non-magnetic layer, and the two adjacent ferromagnetic layers having the nonmagnetic layer interposed therebetween are coupled with each other in an anti-ferromagnetic manner.

* * * * *